(12) United States Patent
Manaka

(10) Patent No.: US 9,184,380 B2
(45) Date of Patent: *Nov. 10, 2015

(54) ELECTRIC ELEMENT

(71) Applicant: RICOH COMPANY, LTD., Ohta-ku (JP)

(72) Inventor: Junji Manaka, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/467,577

(22) Filed: Aug. 25, 2014

(65) Prior Publication Data

US 2014/0361234 A1   Dec. 11, 2014

Related U.S. Application Data

(63) Continuation of application No. 13/877,546, filed as application No. PCT/JP2011/072496 on Sep. 22, 2011, now Pat. No. 8,848,436.

(30) Foreign Application Priority Data

Oct. 4, 2010  (JP) ................................ 2010-224813
Oct. 4, 2010  (JP) ................................ 2010-224822

(51) Int. Cl.
    *G11C 13/00*   (2006.01)
    *H01L 45/00*   (2006.01)
    *G01K 7/16*    (2006.01)
    *G01K 11/06*   (2006.01)
    *G01K 15/00*   (2006.01)

(52) U.S. Cl.
    CPC ............... *H01L 45/128* (2013.01); *G01K 7/16* (2013.01); *G01K 11/06* (2013.01); *G01K 15/00* (2013.01); *G11C 13/0004* (2013.01); *H01L 45/06* (2013.01); *G11C 13/004* (2013.01)

(58) Field of Classification Search
    CPC .......... G11C 13/0002; G11C 13/0004; G11C 13/004; G11C 13/0069; G11C 7/04; G01K 7/16; G01K 11/06; G01K 15/00; H01L 45/128; G01L 45/06

USPC .............................. 365/163, 34, 113, 148, 158
    See application file for complete search history.

(56) References Cited

U.S. PATENT DOCUMENTS

7,020,014 B2   3/2006   Khouri et al.
7,044,635 B2   5/2006   Matsuo
(Continued)

FOREIGN PATENT DOCUMENTS

JP    02-039213    2/1990
JP    02-049131    2/1990
(Continued)

OTHER PUBLICATIONS

International Search Report Issued Nov. 1, 2011 in PCT/JP2011/072496 Filed on Sep. 22, 2011.
(Continued)

*Primary Examiner* — Tan Nguyen
(74) *Attorney, Agent, or Firm* — Oblon, McClelland, Maier & Neustadt, L.L.P.

(57) ABSTRACT

A temperature dependent electric element includes a phase change portion including at least one conductive phase change material having a predetermined phase transition temperature, a detector portion configured to detect a change in conductivity of the phase change material caused by a temperature change to a detect phase transition of the phase change material based on the detected change in conductivity of the phase change material, a temperature calibration part configured to conduct temperature calibration by adjusting a temperature at which the phase change material exhibits the phase transition detected by the detector portion based on the change in the conductivity of the phase change material to the predetermined phase transition temperature of the phase change material, and a substrate on which the phase change portion, the detector portion, and the temperature calibration part are integrally arranged.

20 Claims, 63 Drawing Sheets

(56) References Cited

U.S. PATENT DOCUMENTS

| | | |
|---|---|---|
| 7,113,424 B2 | 9/2006 | Happ et al. |
| 7,423,901 B2 * | 9/2008 | Sutardja ................. 365/163 |
| 8,050,084 B2 | 11/2011 | Bae et al. |
| 8,331,183 B2 | 12/2012 | Lee et al. |
| 8,395,934 B2 | 3/2013 | Shin |
| 8,848,436 B2 * | 9/2014 | Manaka ................. 365/163 |

FOREIGN PATENT DOCUMENTS

| | | |
|---|---|---|
| JP | 02-269912 | 11/1990 |
| JP | 03-131729 | 6/1991 |
| JP | 10-026594 | 1/1998 |
| JP | 11-160166 | 6/1999 |
| JP | 11-183411 | 7/1999 |
| JP | 2000-019029 | 1/2000 |
| JP | 2002-296120 | 10/2002 |
| JP | 2006-105935 | 4/2006 |
| JP | 3799396 | 7/2006 |
| JP | 4178729 | 11/2008 |

OTHER PUBLICATIONS

Office Action issued Apr. 11, 2014 in Japanese Patent Application No. JP2010-224813.

* cited by examiner

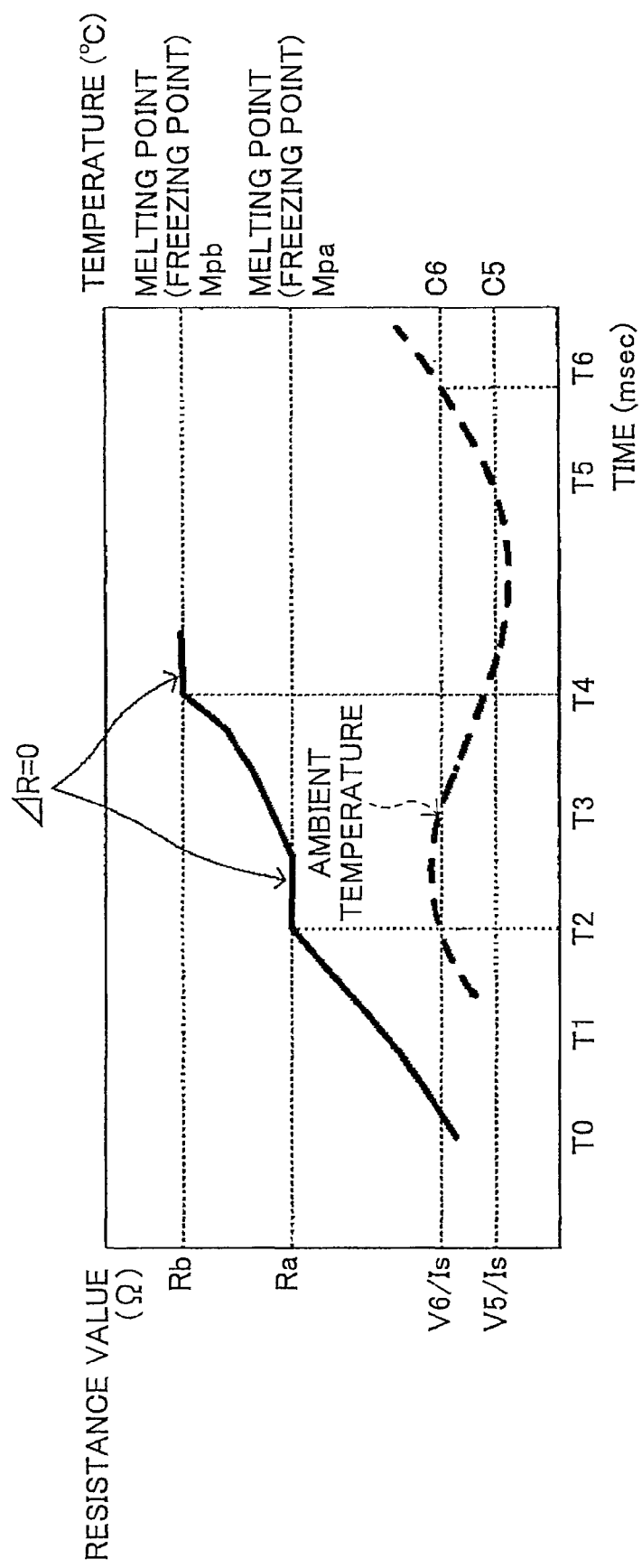

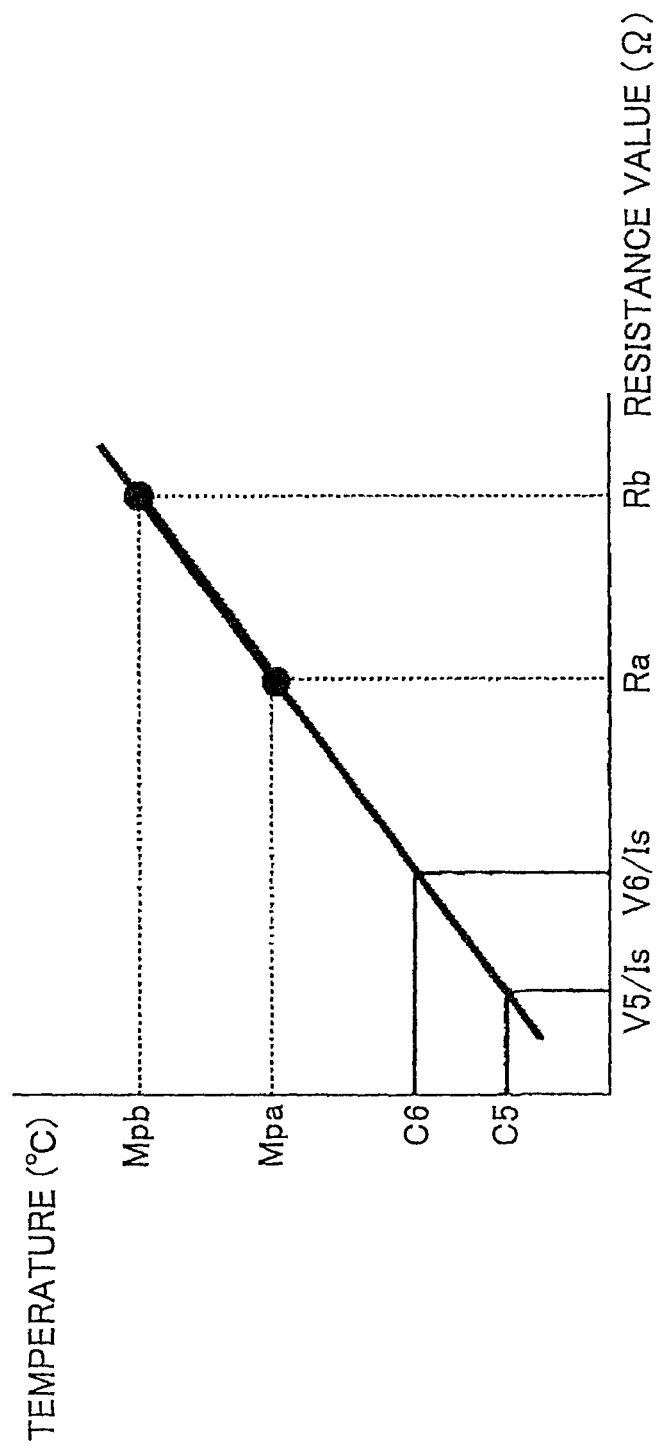

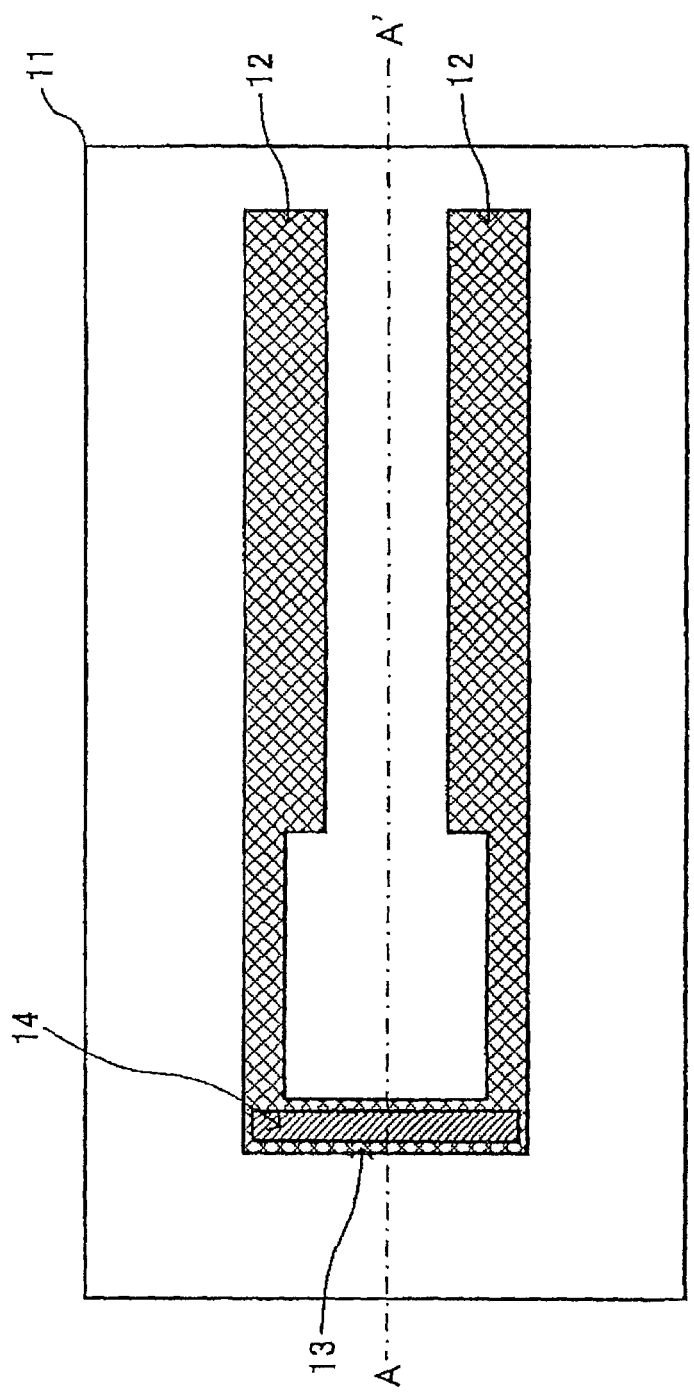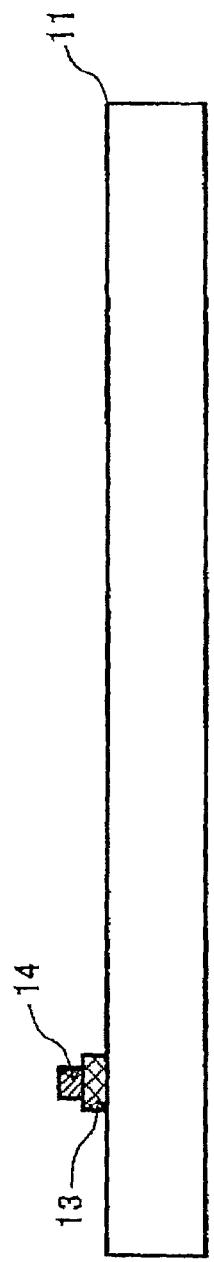
FIG.8A
FIG.8B

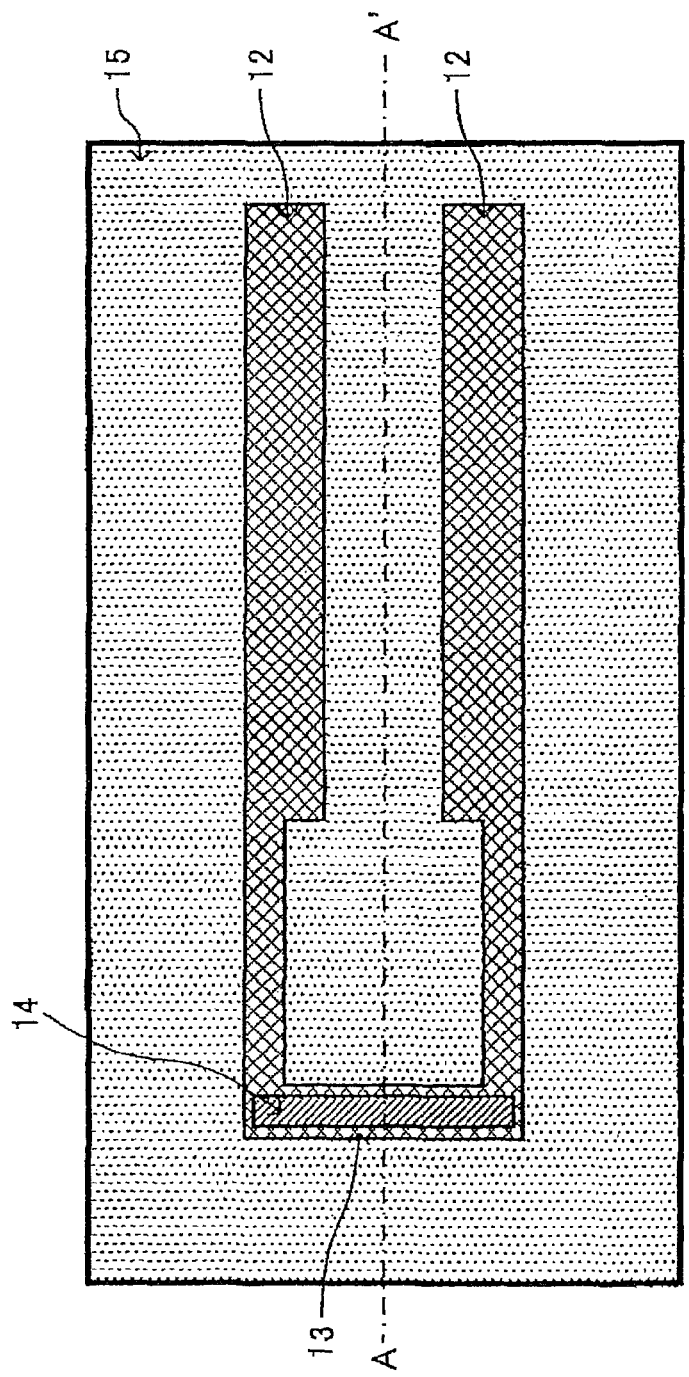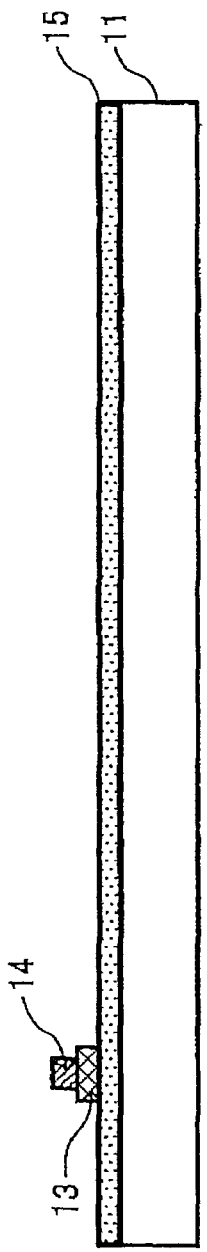
FIG.9A
FIG.9B

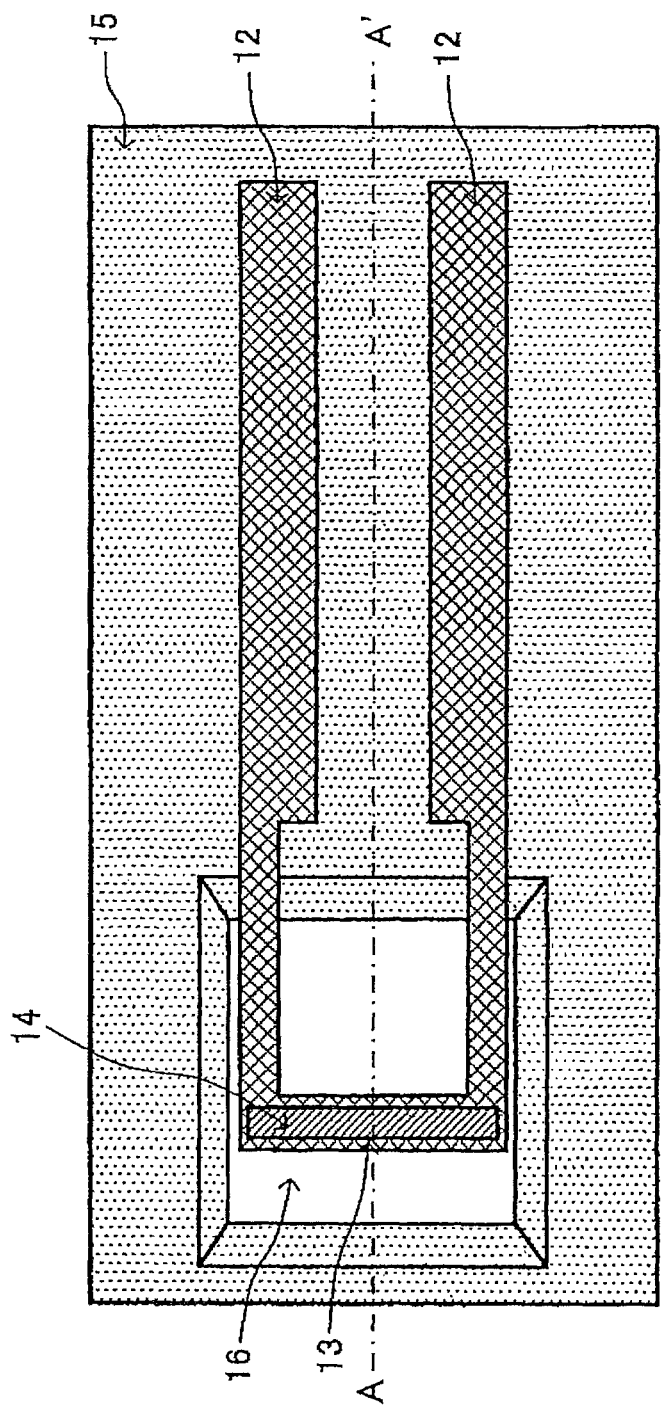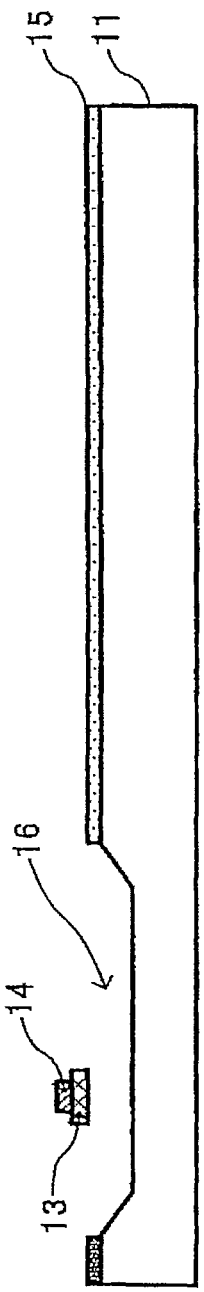
FIG.10A
FIG.10B

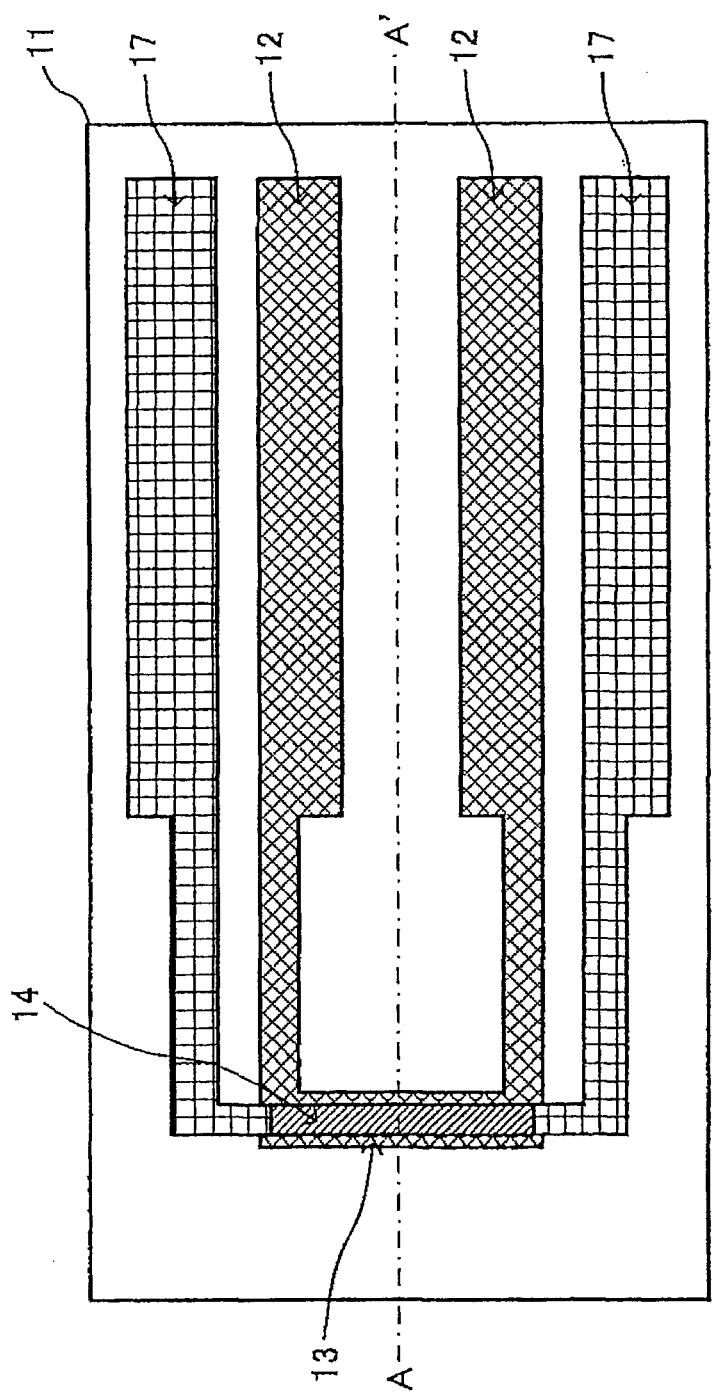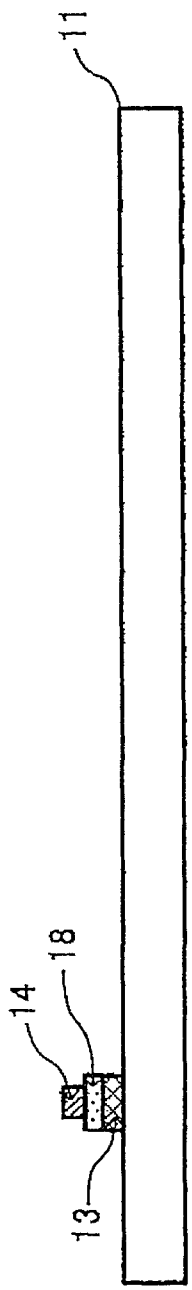
FIG.11A
FIG.11B

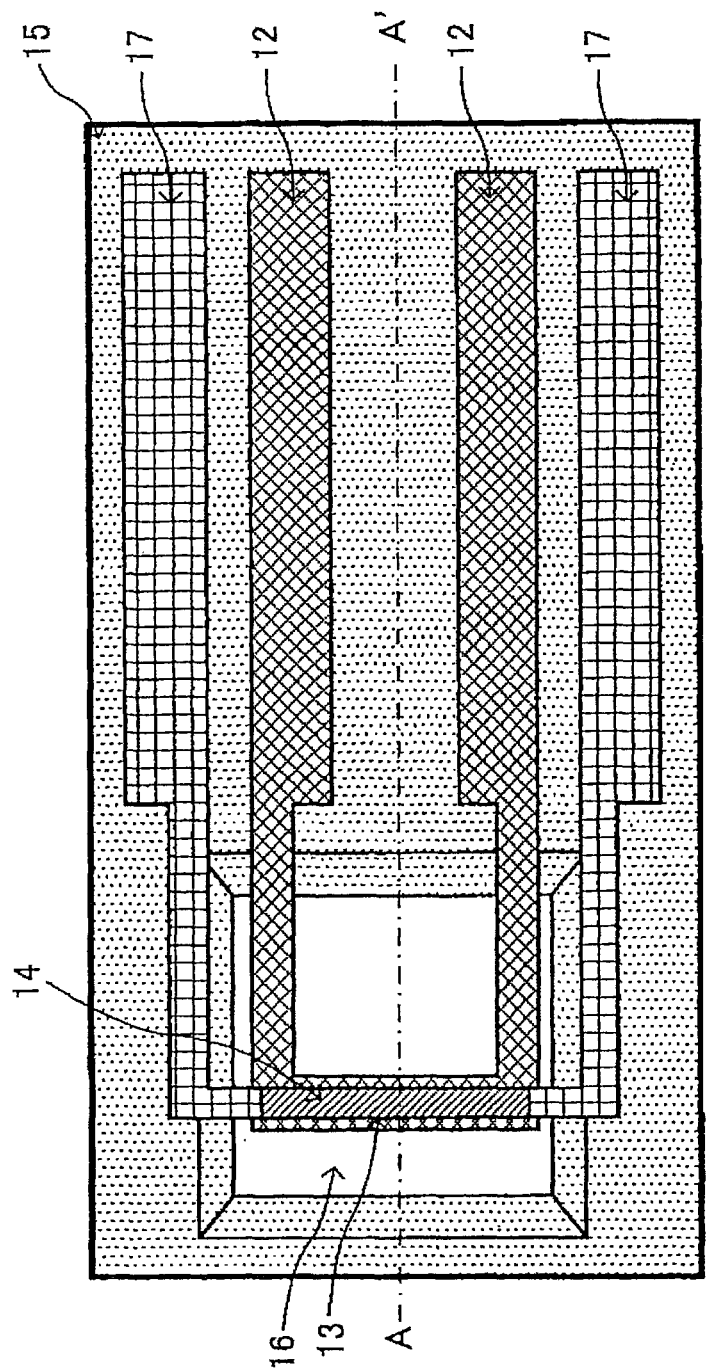
FIG.12A
FIG.12B

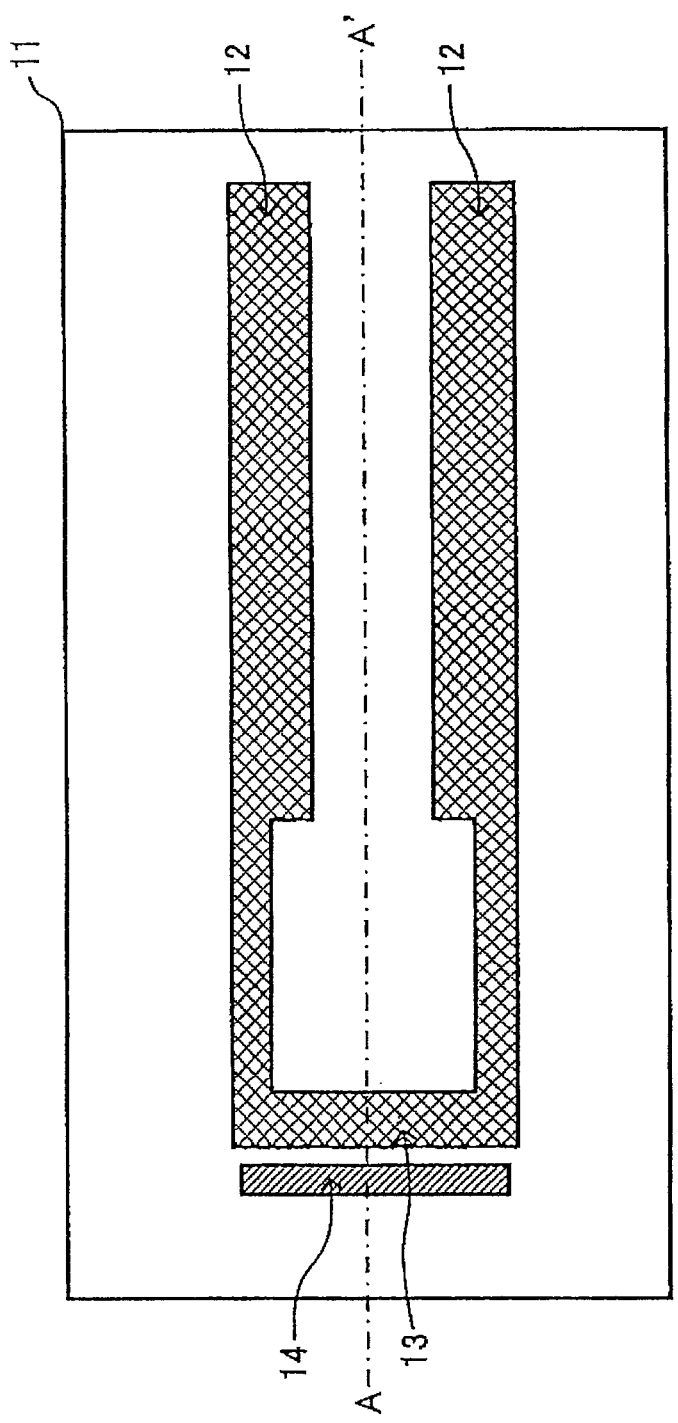
FIG.14A
FIG.14B

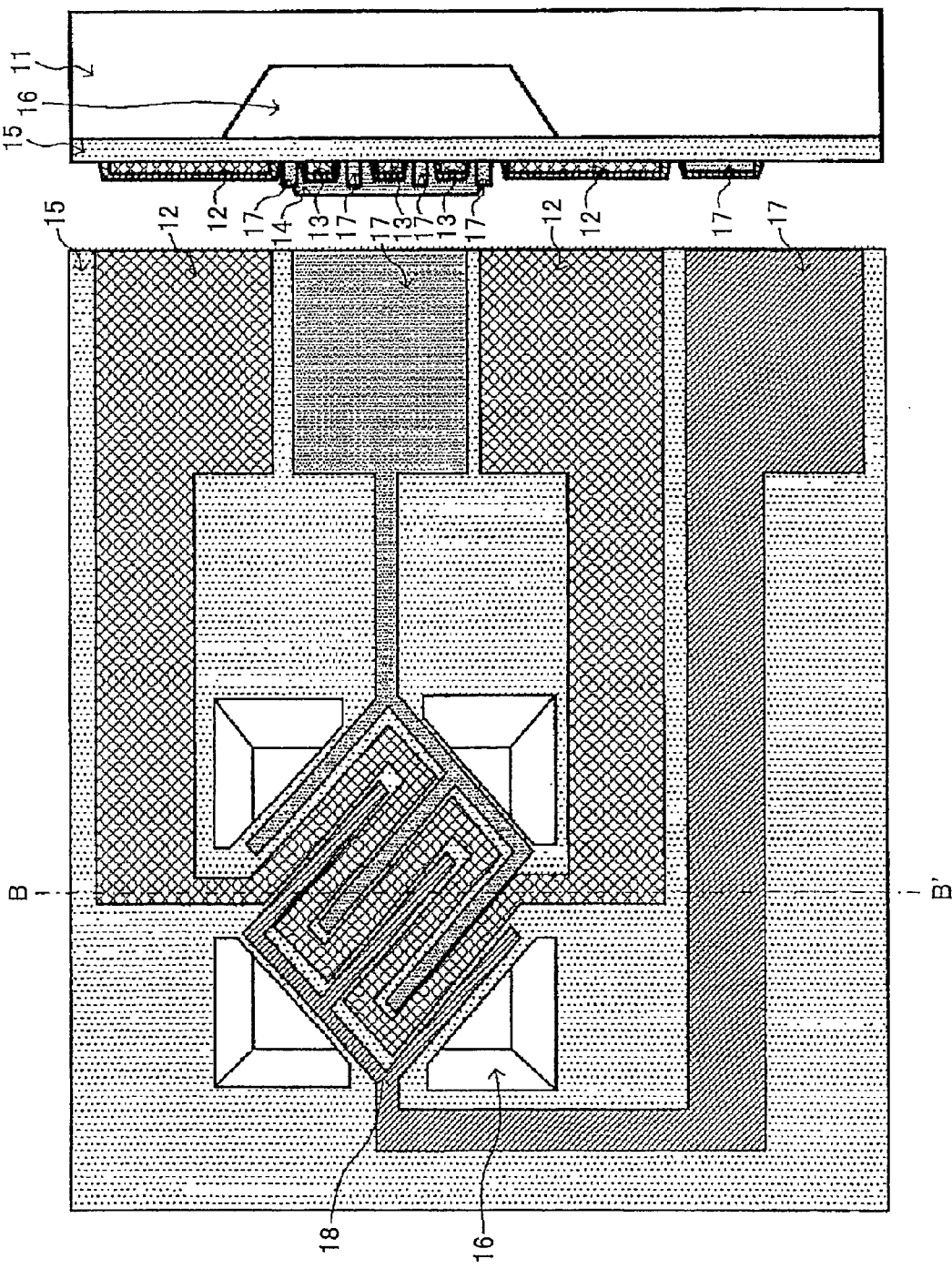

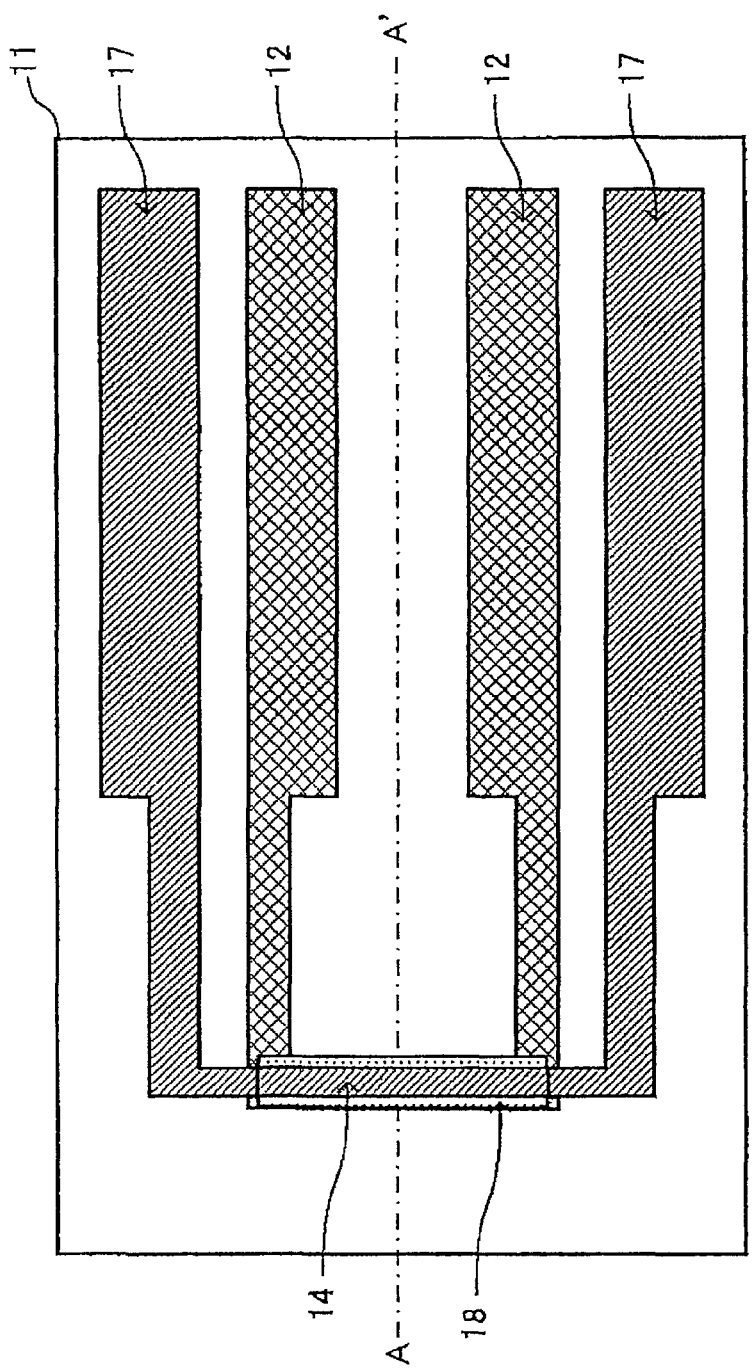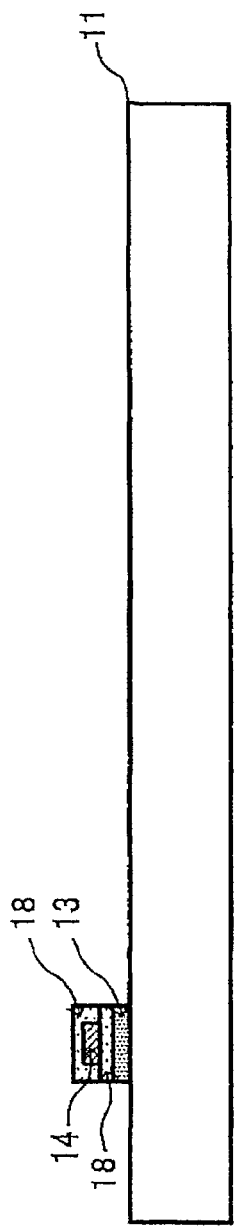
FIG.21A
FIG.21B

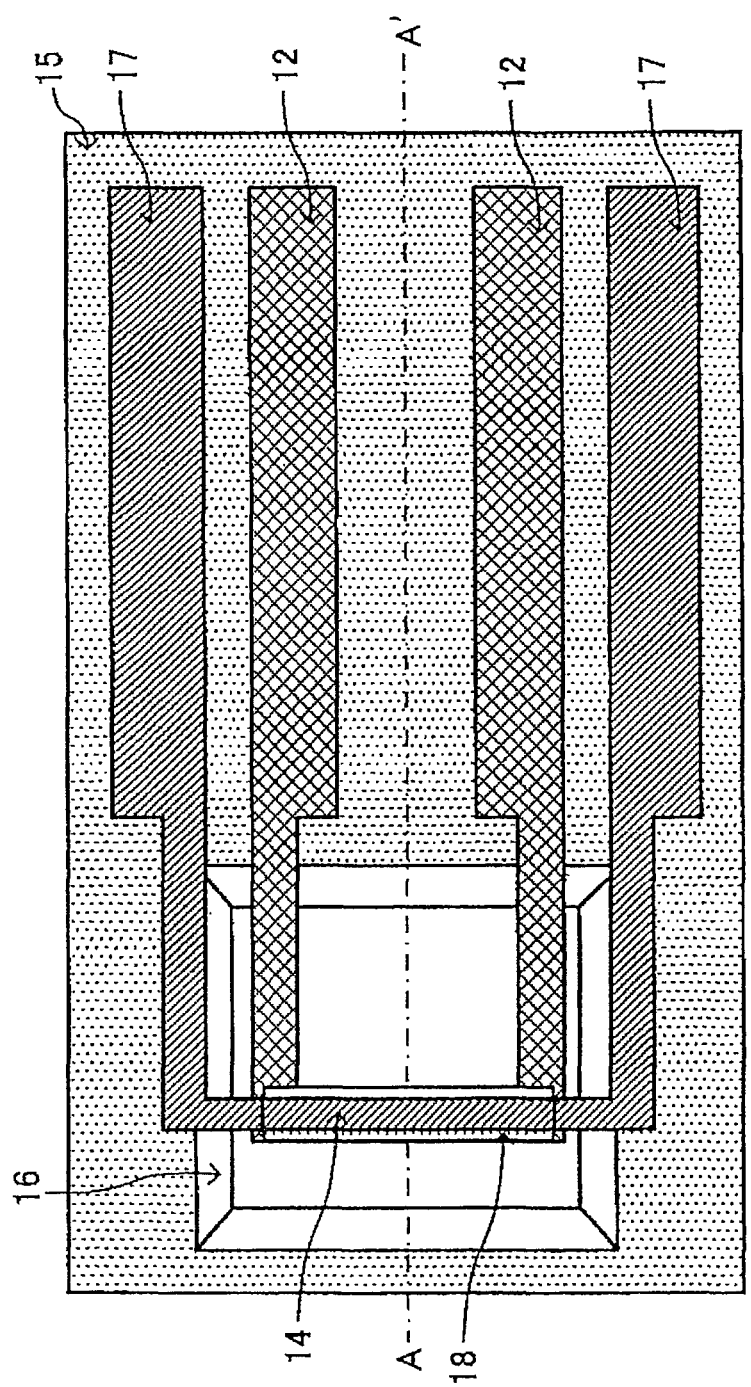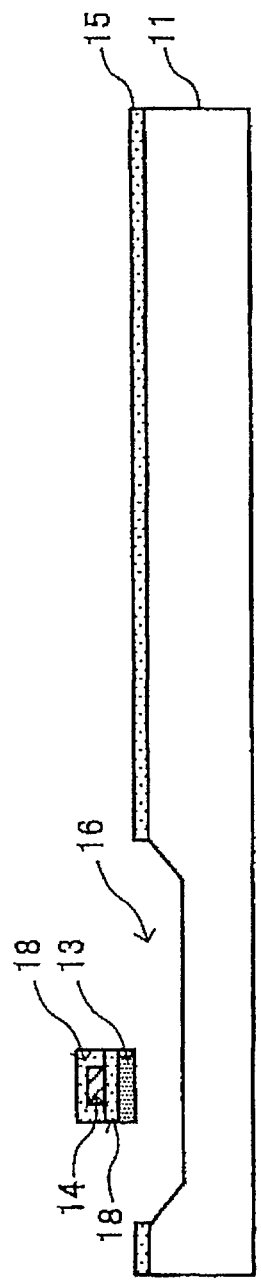
FIG.22A
FIG.22B

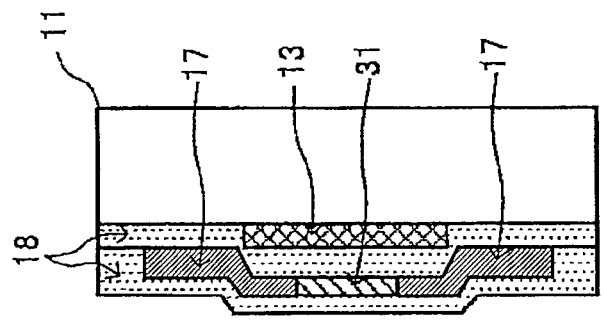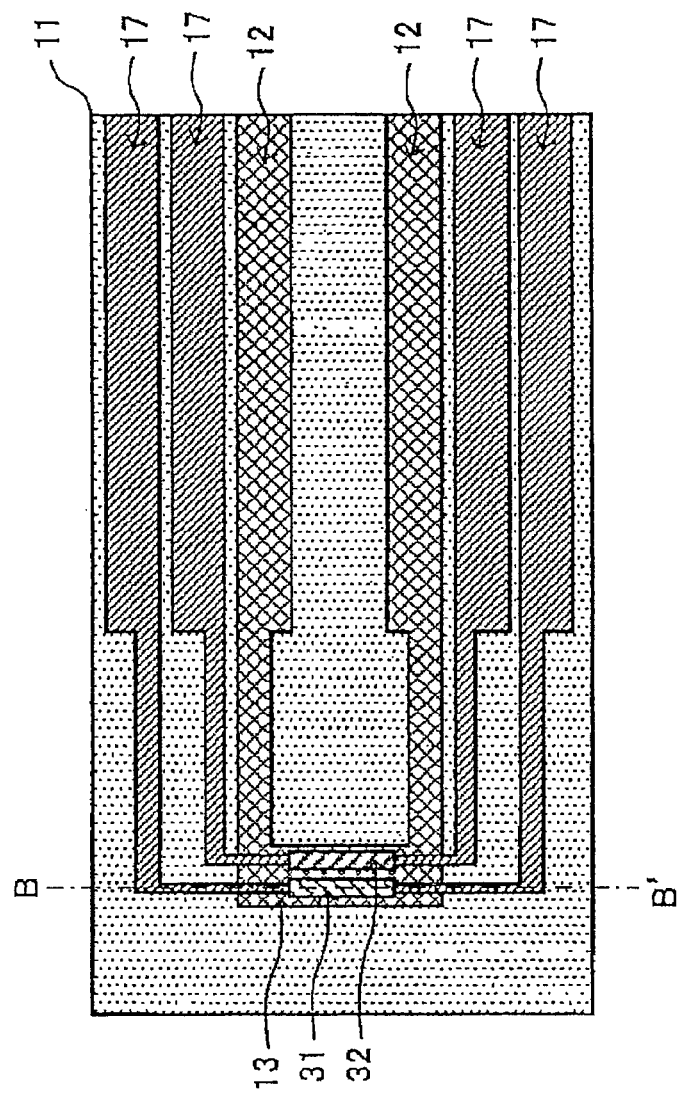

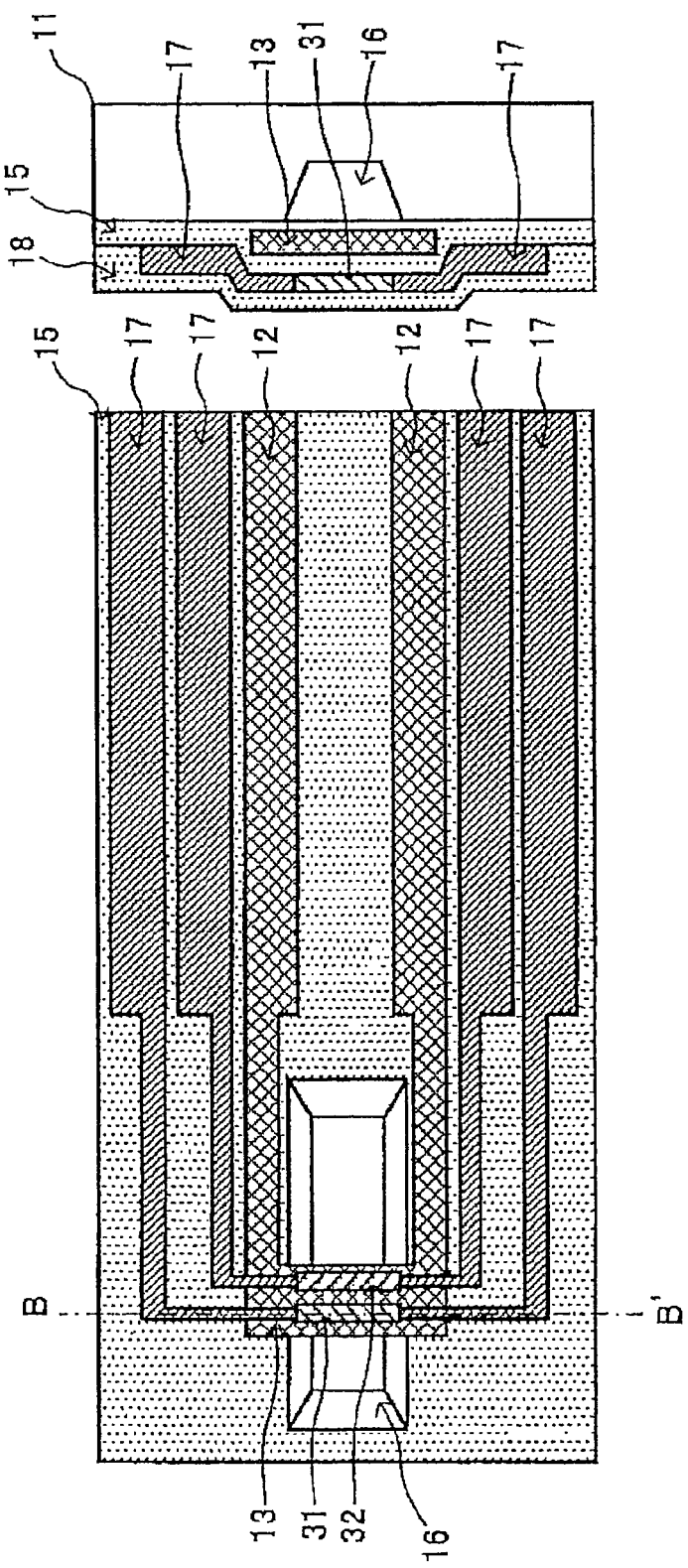

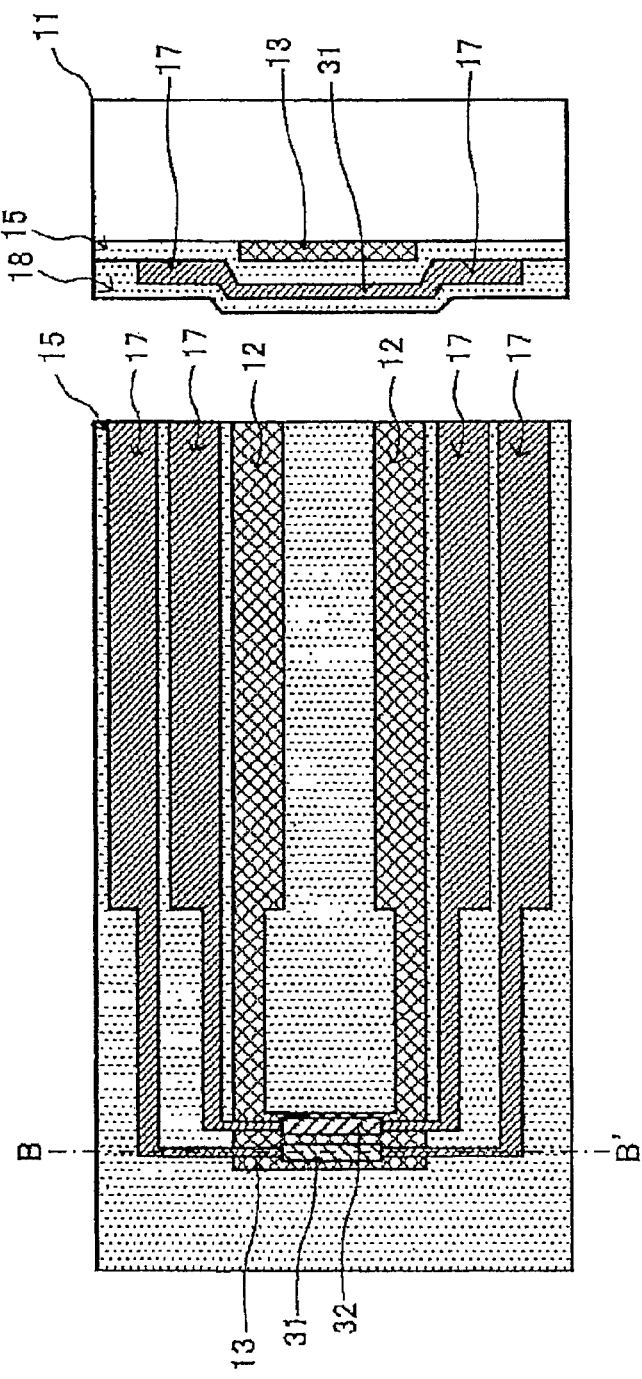

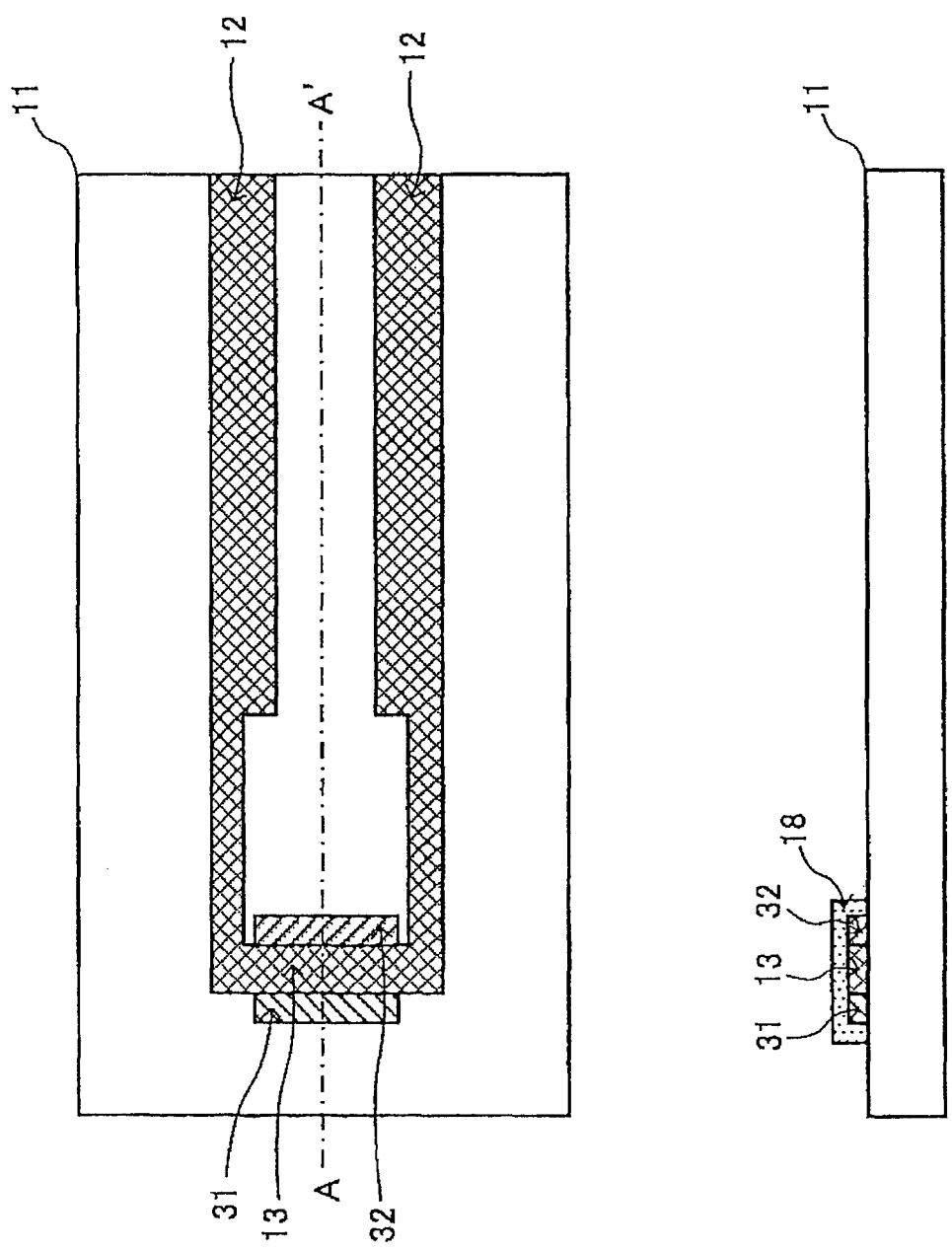

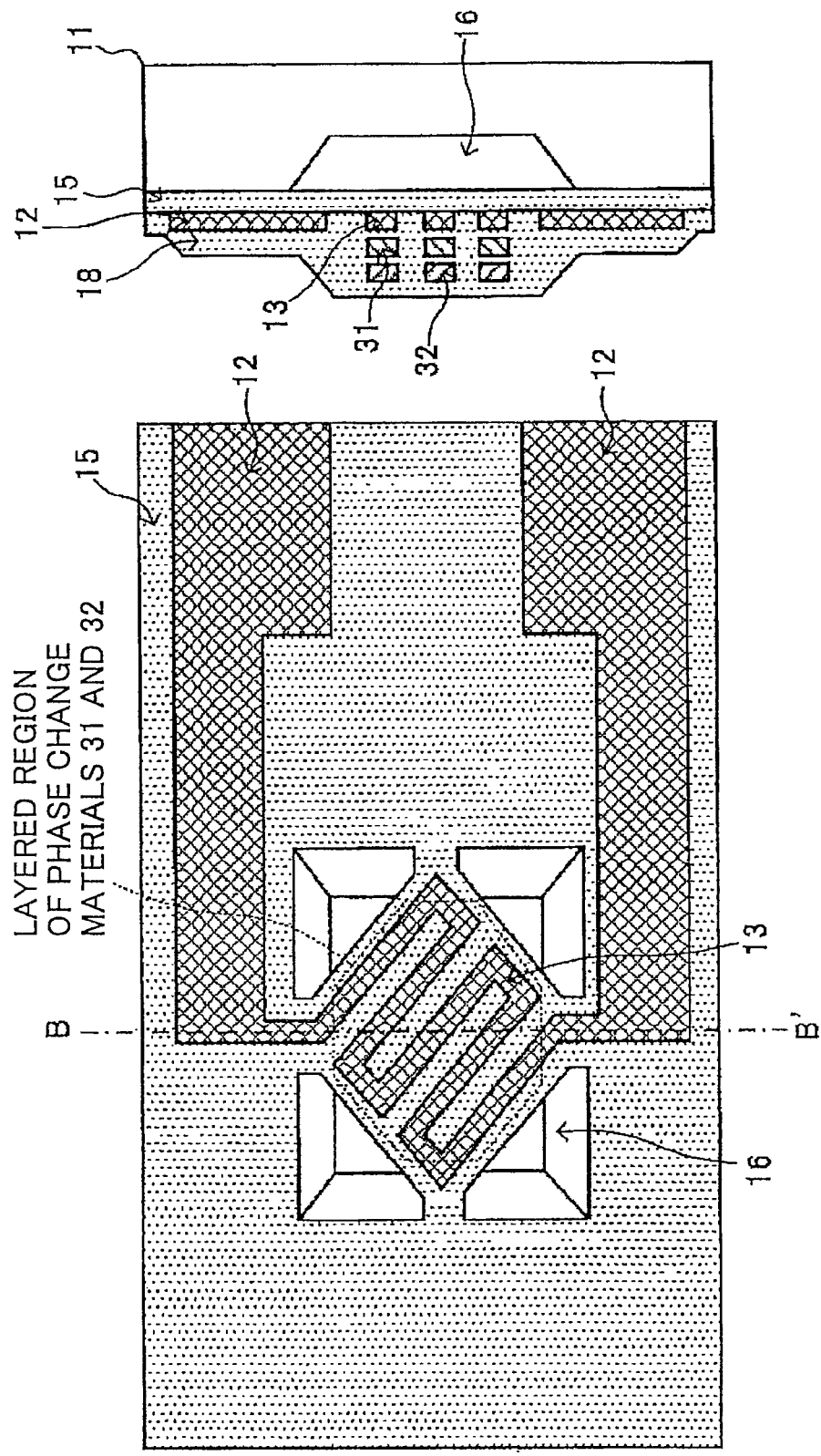

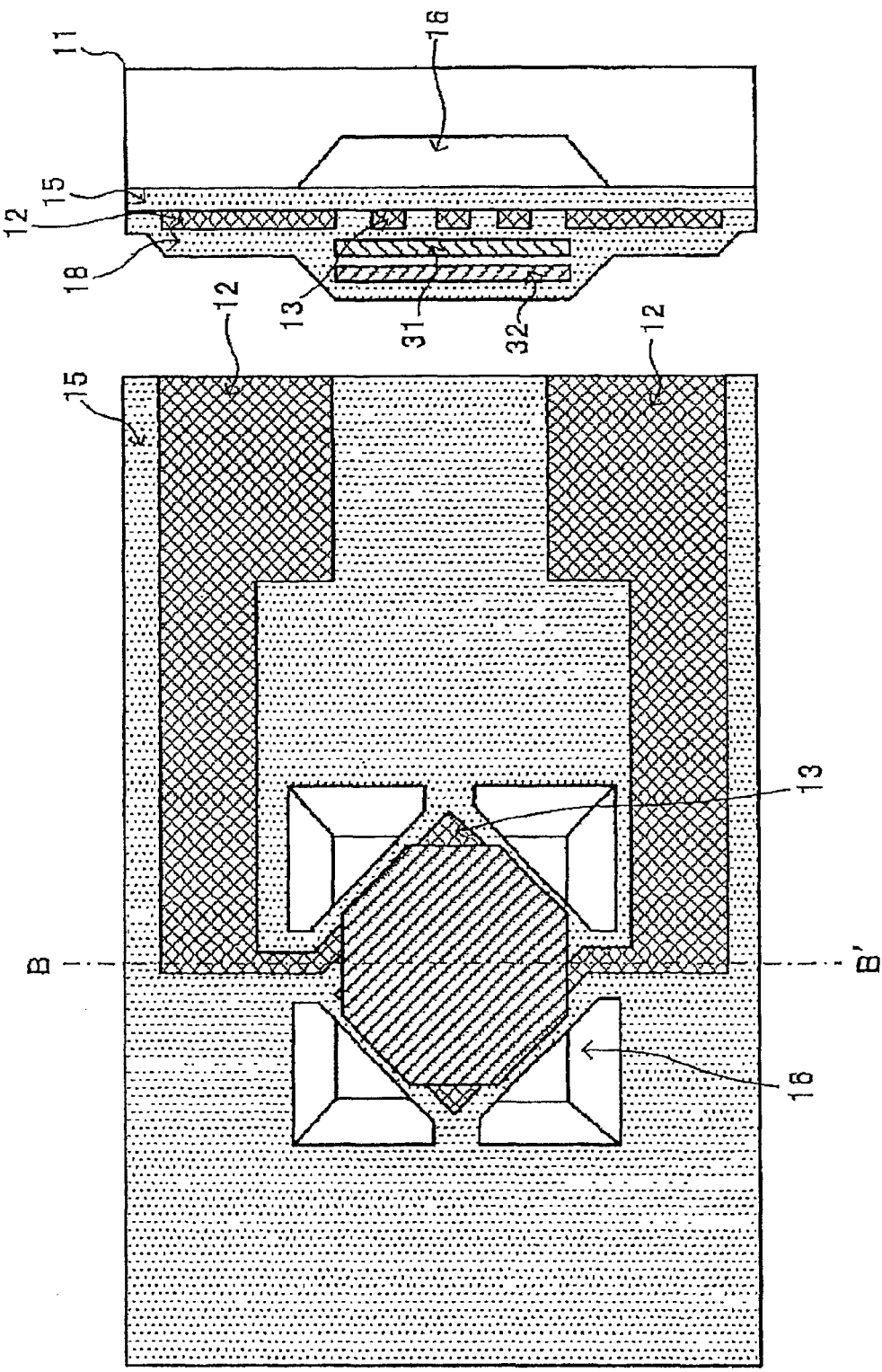

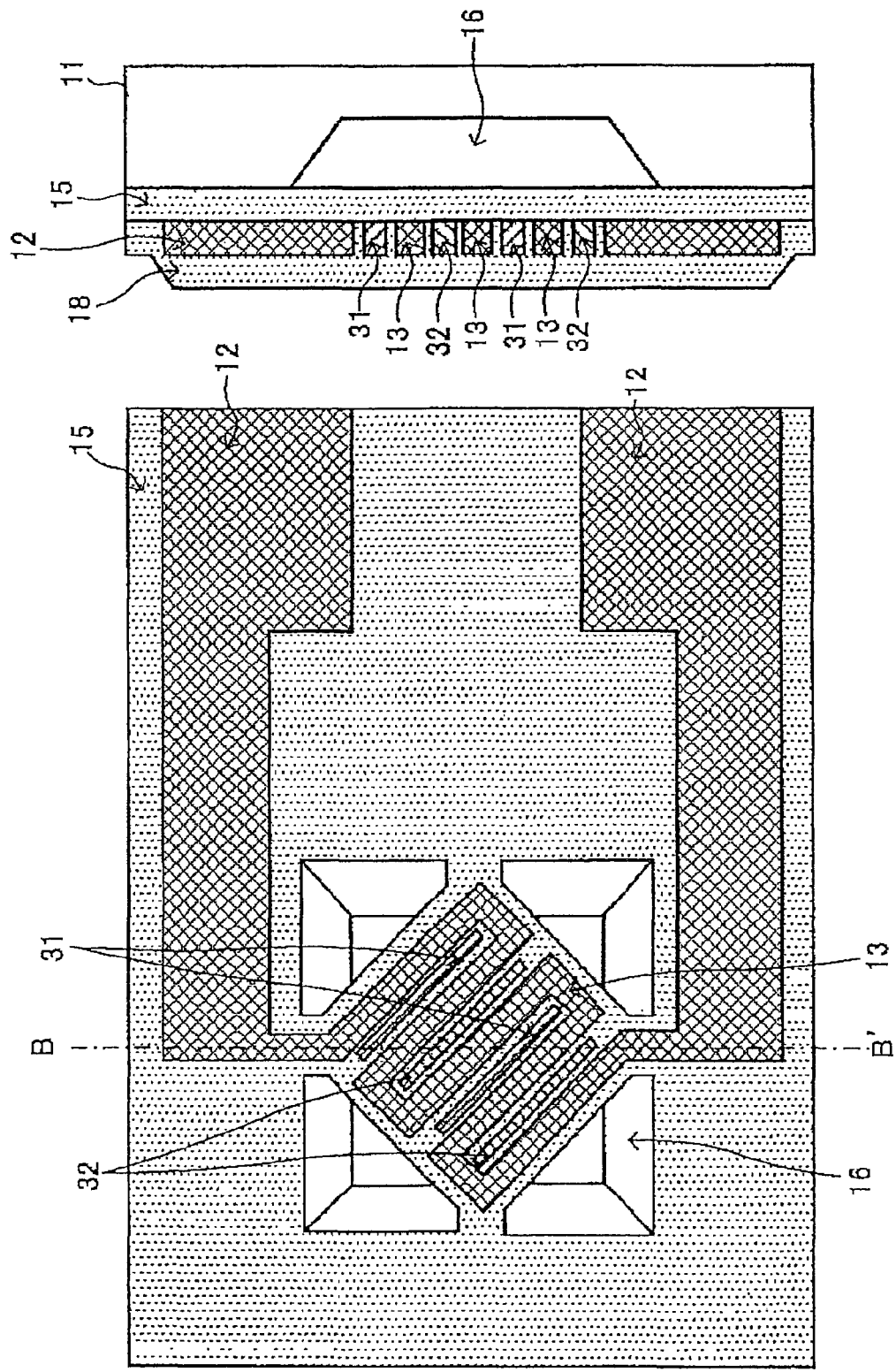

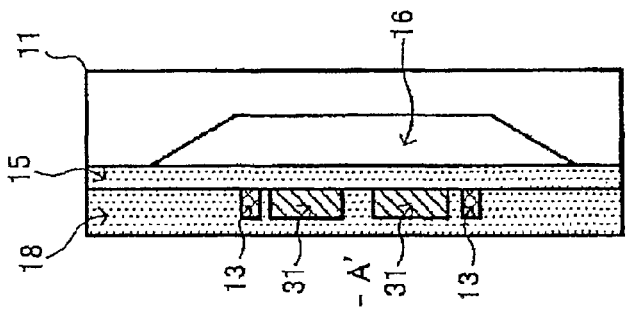
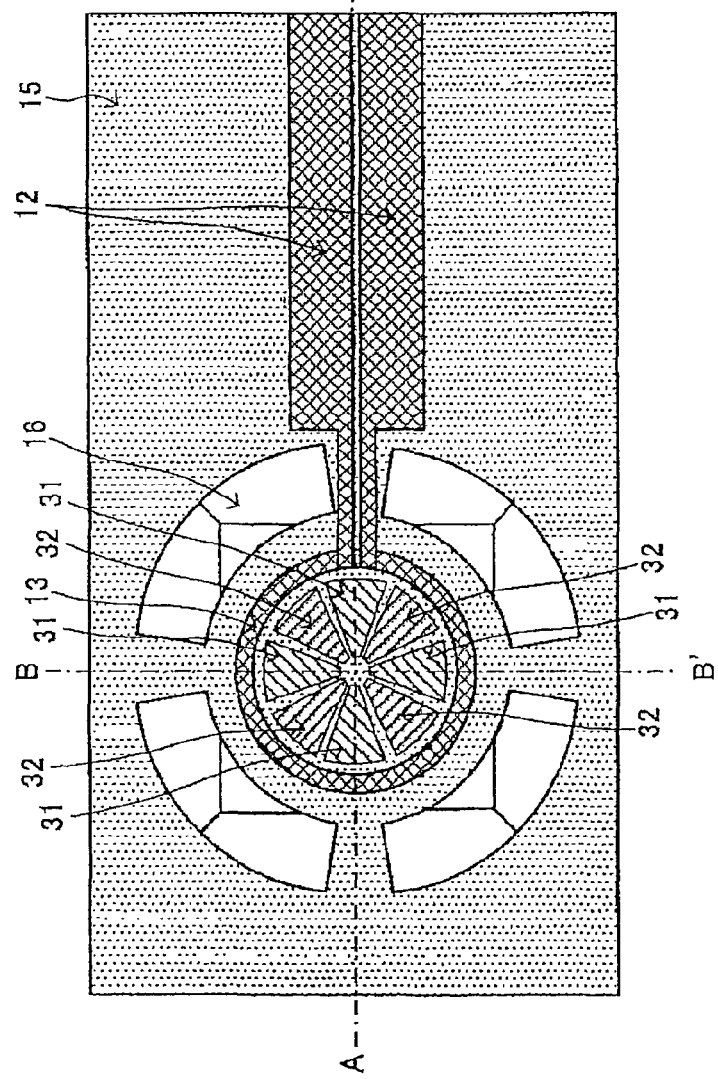
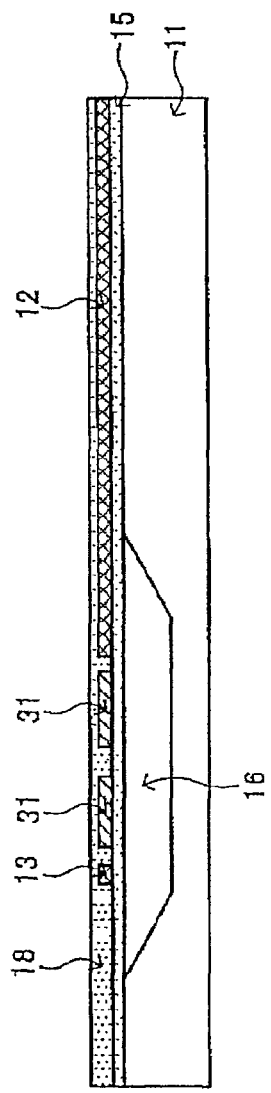
FIG.45C
FIG.45A
FIG.45B

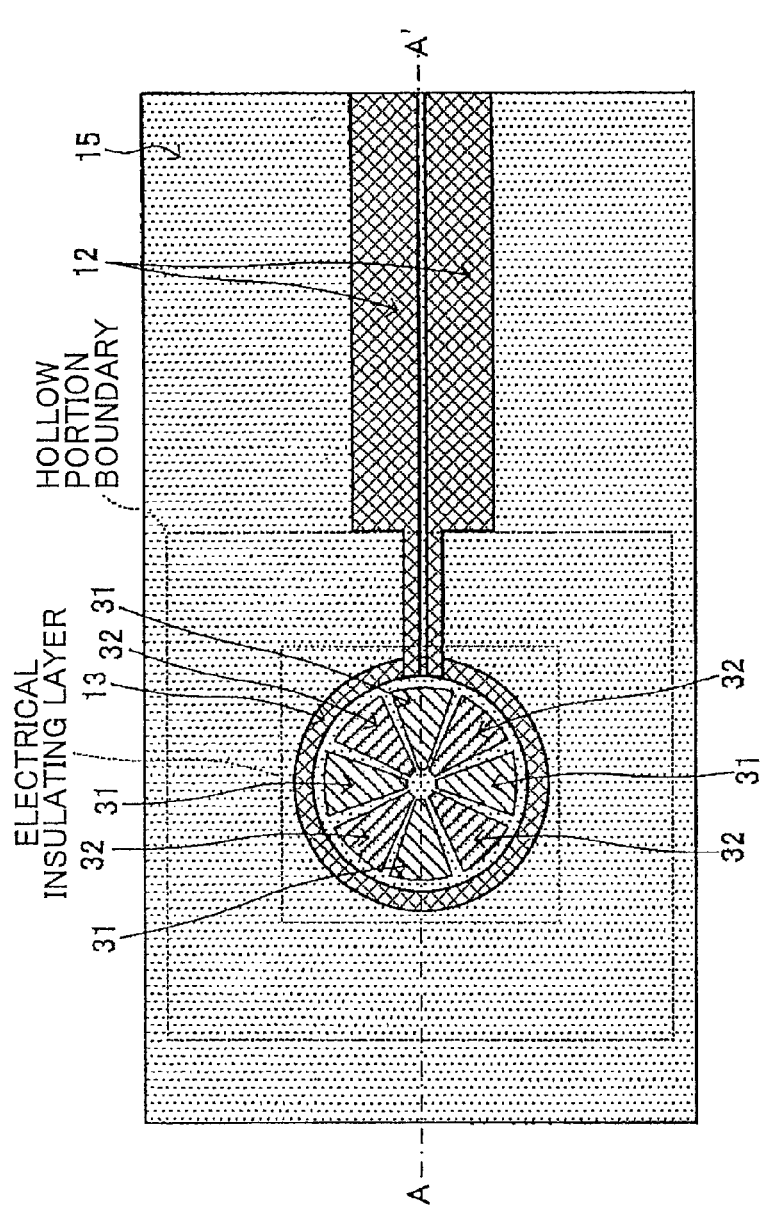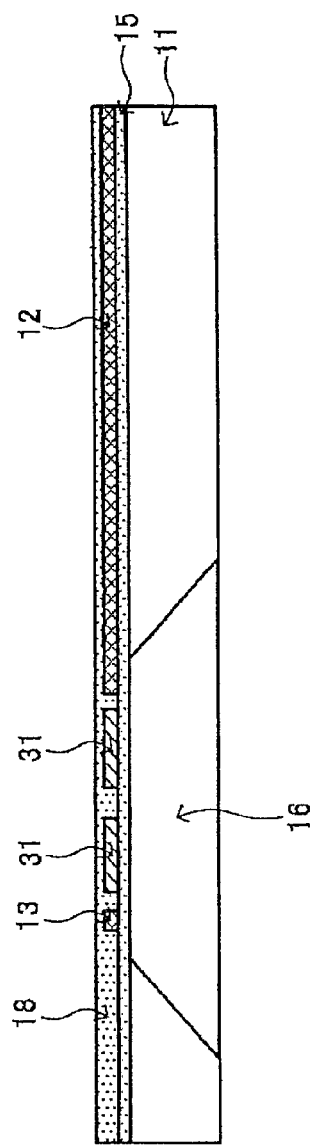
FIG.46A
FIG.46B

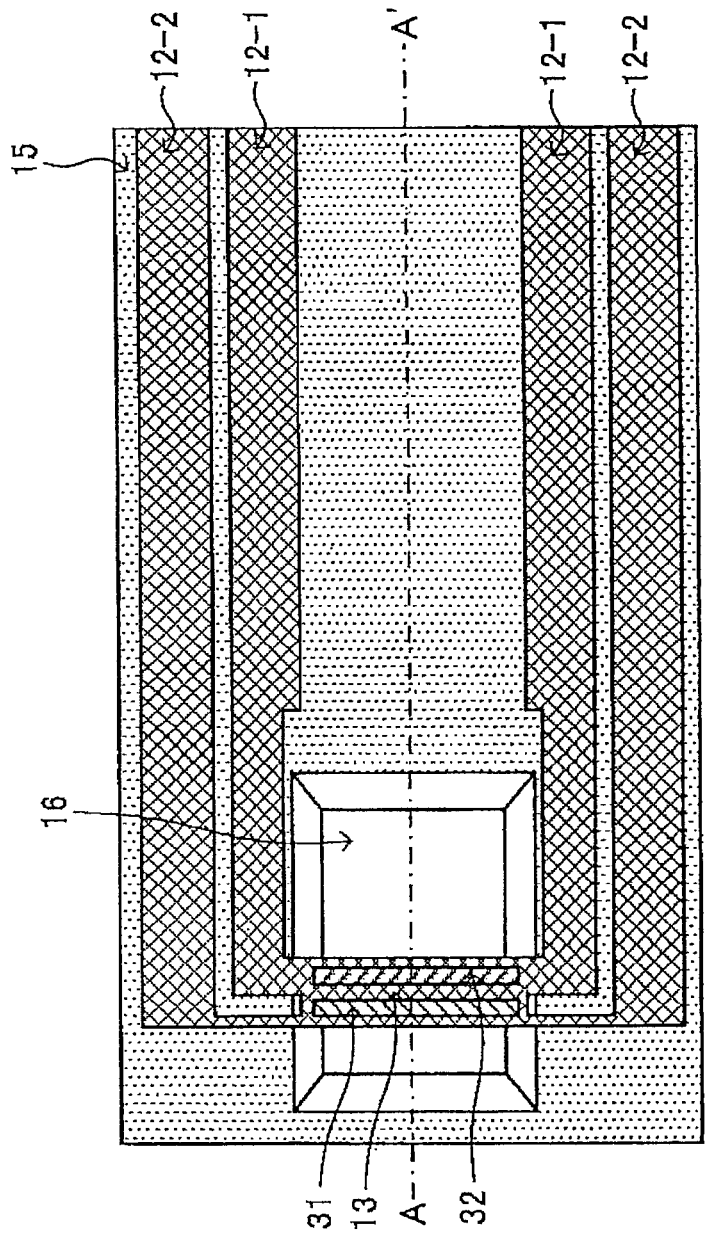
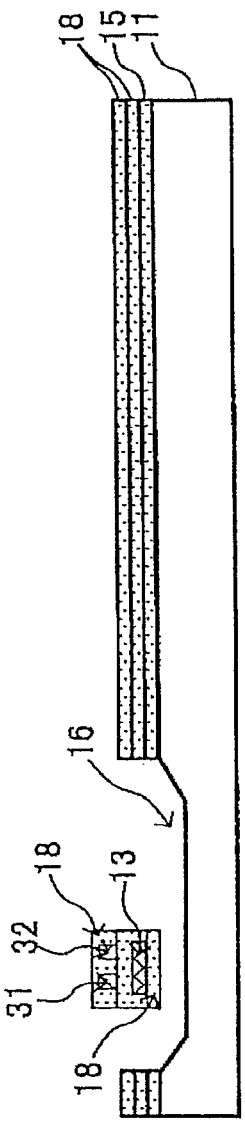
FIG.47A
FIG.47B

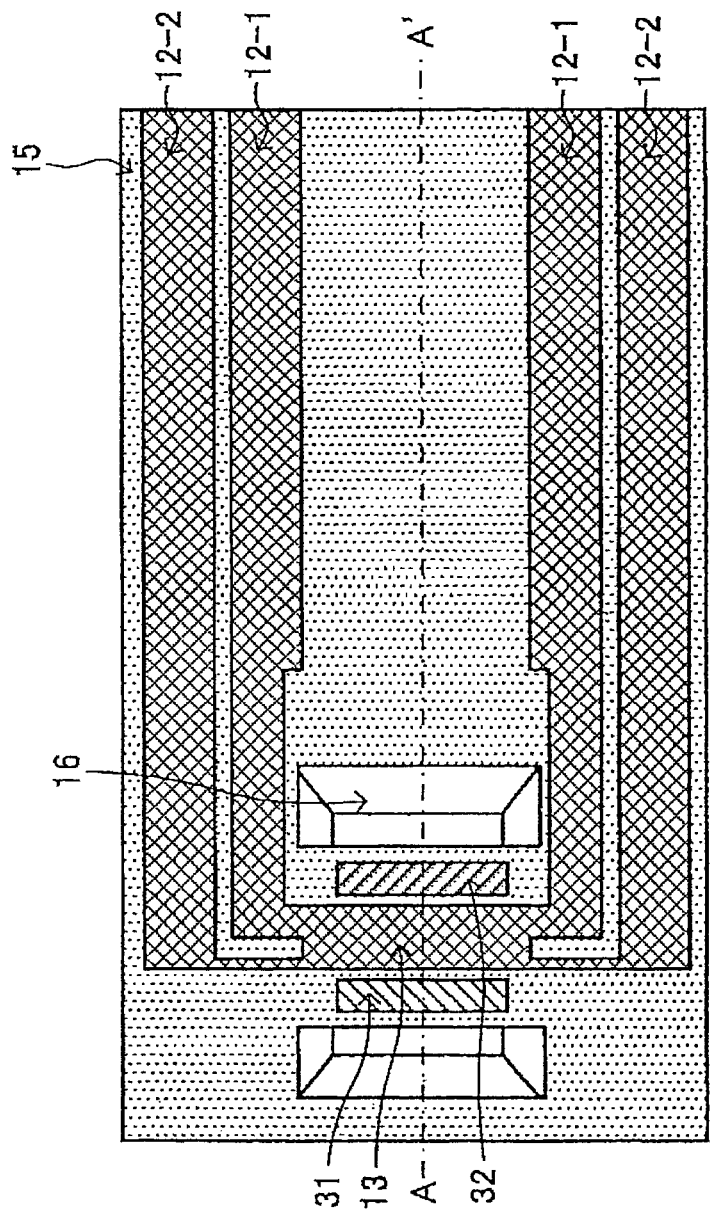
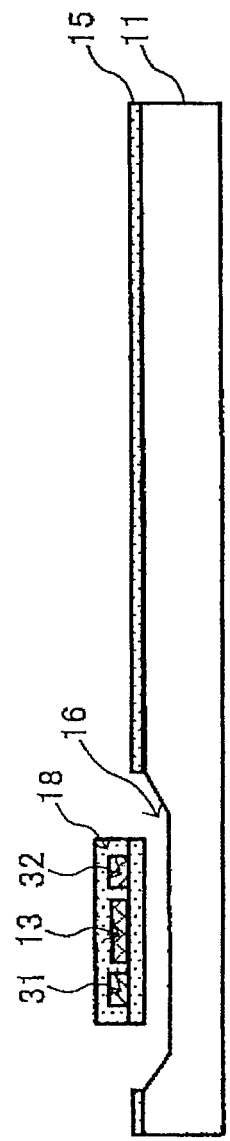
FIG.48A
FIG.48B

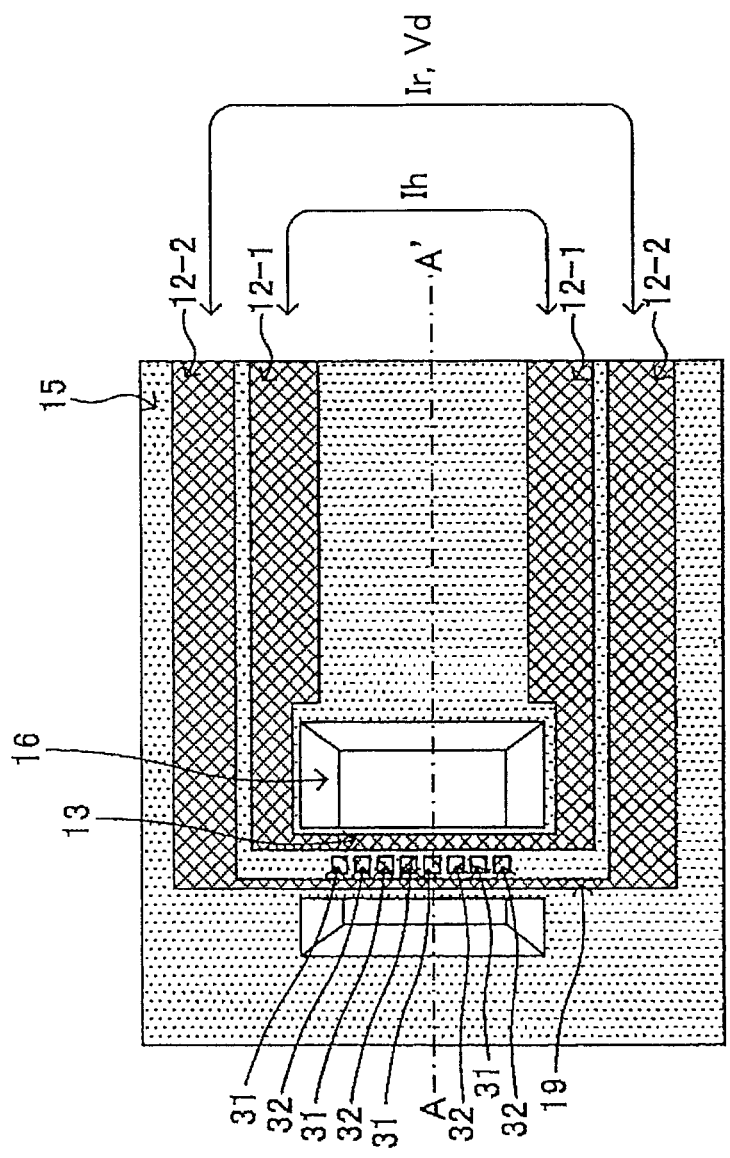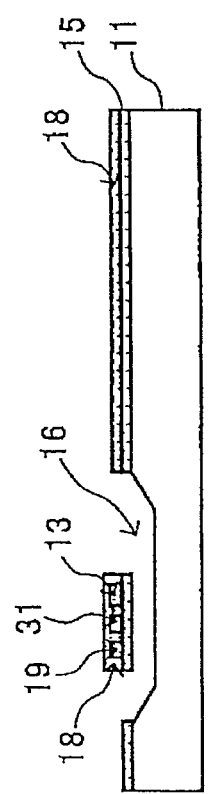
FIG.49A
FIG.49B

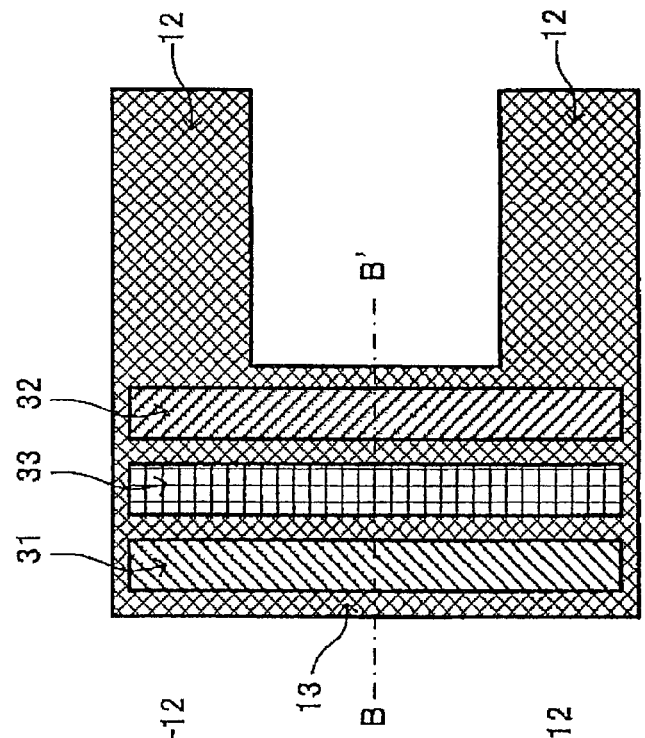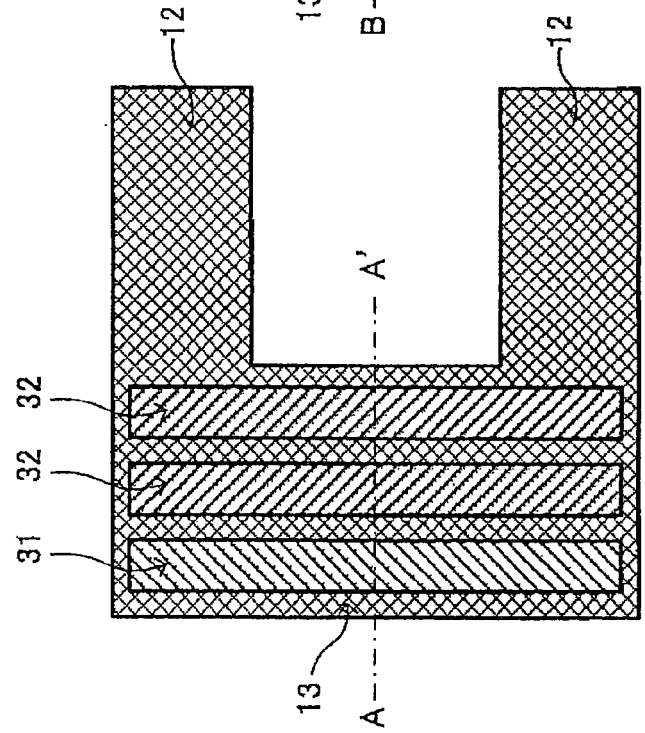

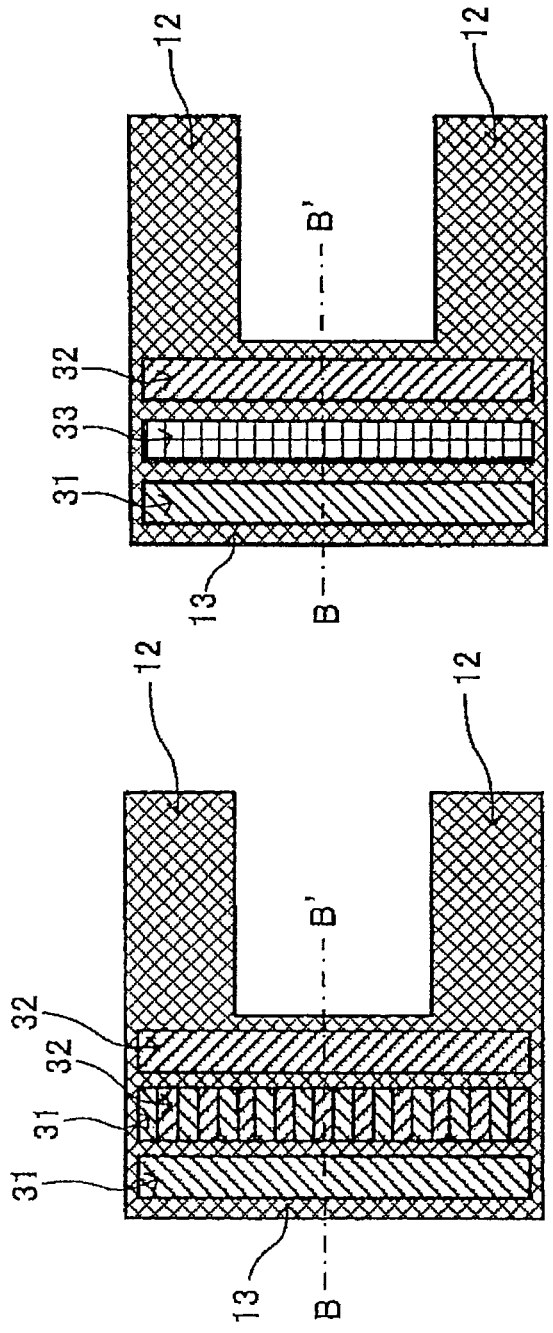

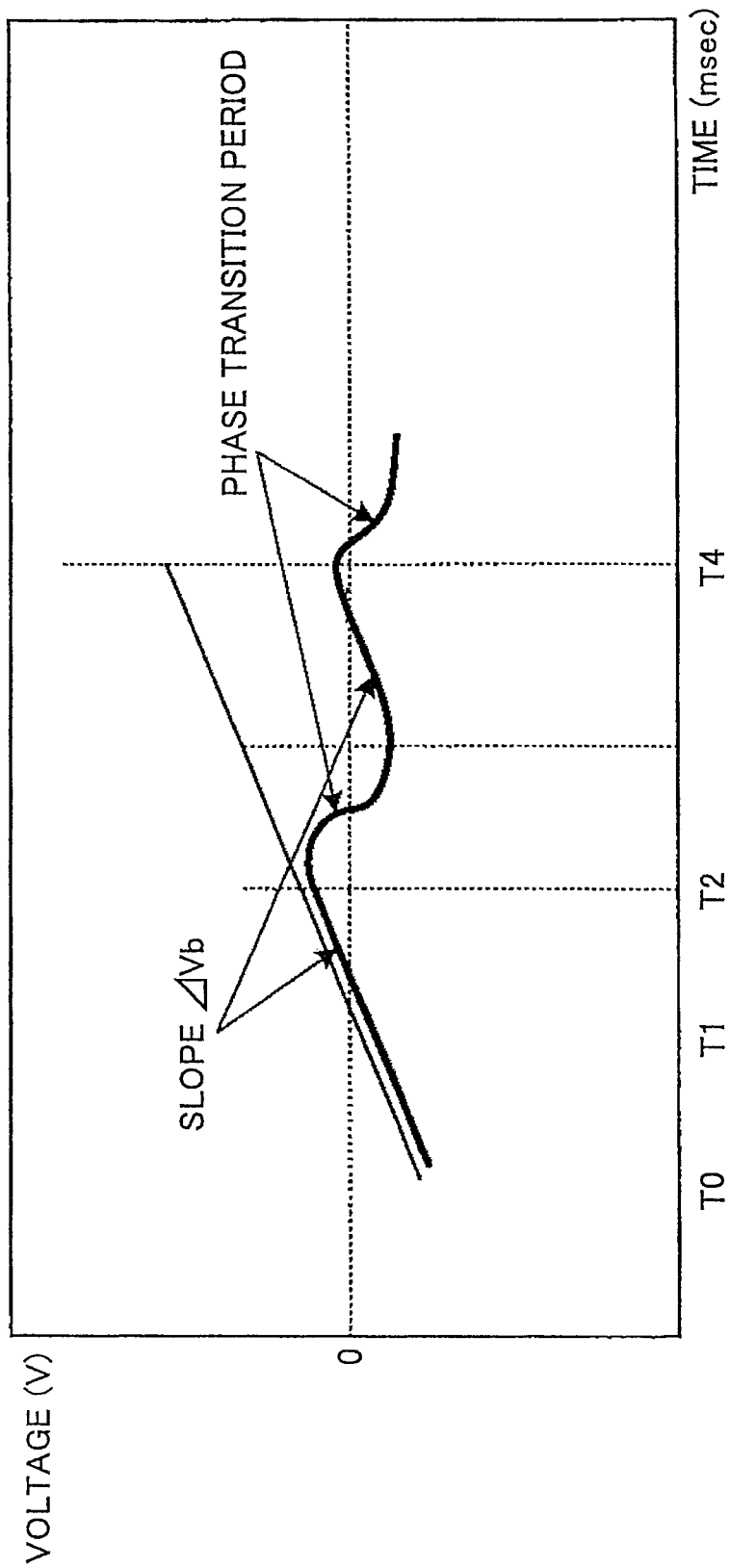

ELECTRIC ELEMENT

CROSS REFERENCE TO RELATED APPLICATIONS

This application is a continuation of U.S. application Ser. No. 13/877,546, filed Apr. 3, 2013, which is a National Stage of PCT/JP2011/072496, filed Sep. 22, 2011, which claims the benefit of priority from Japanese Patent Application Nos. 2010-224813, filed Oct. 4, 2010 and 2010-224822, filed Oct. 4, 2010, the contents of which is incorporated in its entirety.

TECHNICAL FIELD

The disclosures herein generally relate to an electric element and more specifically to a temperature-dependent electric element.

BACKGROUND ART

Semiconductor devices such as integrated circuits (ICs) or large-scale integrated (LSI) circuits are generally produced by facilities provided by semiconductor manufacturers because the introduction of such facilities has lowered a barrier to entry in fabrication of the semiconductor devices. This has globalized manufacturing bases of the semiconductor devices. As a result, the price of semiconductor devices has become extremely low. In addition, a micro-electro-mechanical system (MEMS) technology utilizing a manufacturing process for semiconductor integrated circuits has enabled mass-production of sensors having consistent characteristics such as complementary metal-oxide semiconductors (CMOS) to be incorporated in semiconductor devices. The current sensor production facilities are mainly diverted from such semiconductor (IC or LSI) production facilities. In the manufacturing process for semiconductor integrated circuits, a temperature calibration process is necessary for a sensor to be calibrated in order to convert reactions detected by the sensor into a physical value such as a voltage. Such temperature calibration is generally conducted by comparing the reaction detected by the sensor with a standard of measurement.

Note that the sensor in this case is a temperature-dependent sensor such as a pressure sensor or a temperature sensor that is capable of outputting a measured value coupled with an expected temperature change. The temperature calibration of the temperature-dependent pressure sensor is generally carried out by a testing staff member or a user, who places the pressure sensor into a tester to compare pressure values output according to temperature changes in the tester with the data on the existing pressure values of the pressure sensor. The temperature sensor may be a thermocouple, a platinum resistance thermometer sensor and a thermistor. Among these, the thermocouple that is low cost and is capable of measuring a wide range of temperature is selected as a example of the temperature sensor for illustration of the temperature calibration below. A thermocouple is a temperature sensor composed of two different metallic wires (a pair of wires) either ends of which are connected. The thermocouple composed of the pair of metallic wires is configured to measure extremely feeble thermoelectric power generated in proportion to a temperature difference between either end of the pair of metallic wires and output a temperature value corresponding to the measured thermoelectric power. That is, this kind of temperature sensor outputs thermoelectric power in proportion to temperature change. Such temperature-dependent sensors may generally need temperature calibration in order to measure temperature accurately. A typical temperature calibration technique for the temperature-dependent sensors is as follows. A temperature sensor (i.e., thermocouple) is placed in a thermostatic chamber under a constant environment, and the temperature inside the thermostatic chamber is changed. The thermoelectric power output by the thermocouple is then measured while the temperature inside the thermostatic chamber is changed. The measured thermoelectric power output by the thermocouple is compared with the standard value of the thermoelectric power corresponding to the temperature change. The temperature calibration of each of temperature devices is conducted by utilizing this comparison value as a compensation value.

Japanese Patent No. 4178729 (hereinafter called "Patent Document 1") discloses an example of the temperature calibration technology for a thermal analysis device utilizing a thermocouple as a temperature sensor. In the temperature calibration technology disclosed in Patent Document 1, a standard temperature material having a known phase transition temperature and a thermocouple are placed inside a heater. When temperatures of the standard temperature material having a known phase transition temperature and the thermocouple in the heater are gradually changed, an endothermic reaction of the standard temperature material may be observed at a temperature around a melting point of the standard temperature material. The endothermic reaction of the standard temperature material is detected as a point of inflection in a linear output change of the thermocouple. A temperature detected at the time where the point of inflection is detected is determined as a standard temperature that corresponds to a melting-point temperature, and a temperature value of the thermocouple is calibrated utilizing a correction value computed based on the determined standard temperature.

Japanese Patent Application Laid-Open Publication No. 2-039213 (hereinafter called "Patent Document 2") discloses another example of the temperature calibration technology. In the temperature calibration technology disclosed in Patent Document 2, a heater connected in series with a high temperature pressure device. With this technology, the heater is configured to control power applied to the high temperature pressure device while detecting the temperature inside the high temperature pressure device. Thereafter, the heater continuously heats the high temperature pressure device until phase transition occurs in the standard temperature material, and the temperature at which the phase transition has occurred in the standard temperature material is detected based on the electric resistance of the heater or the voltage-current change in the heater when the phase transition has occurred in the standard temperature material. The temperature calibration of the high temperature pressure device is conducted based on the power applied to the high temperature pressure device when the phase transition has occurred in the standard temperature material.

However, in the temperature calibration technology disclosed in Patent Document 1, since the standard temperature material is placed inside the heater in a temperature calibration process, the calibration accuracy of the thermocouple may vary with a positional accuracy of the standard temperature material. That is, the positional accuracy of the standard temperature material may need improving in order to increase the calibration accuracy of the thermocouple. As a result, a capital investment may be required for improving the positional accuracy of the standard temperature material, which may result in an increase in manufacturing cost. In addition, in the temperature calibration technology disclosed in Patent Document 1, when the temperature calibration is conducted after the incorporation of the temperature sensor in a product, a user needs to remove the temperature sensor from the product. Accordingly, the temperature calibration itself may become a cumbersome task for the user. Further, in the temperature calibration technology disclosed in Patent Document 2, since the heater is electrically connected to the phase change material in series, electric conductivity in the phase transition material may be changed by the phase transition of the phase change material in addition to the electric conductivity change in the heater. Accordingly, even if the temperature calibration is conducted based on the temperature detected at which the phase transition has occurred in the phase change material, the accuracy of the temperature calibration may be lowered due to an adverse effect from the electric conductivity change in the heater.

Further, either of the disclosed technologies may require a large-scale facility having a constant temperature environment controlled based on a temperature standard. Moreover, since high-precision sensors such as temperature sensors or humidity sensors configured to absorb heat require highly accurate temperature calibration, a complicated temperature calibration process that is generally required for the high-precision sensors may need to be incorporated in the manufacturing process compared to the temperature calibration for general-purpose sensors, the manufacturing process of which includes no complicated temperature calibration process. Accordingly, the high-precision sensors need to be transferred inside a constant temperature chamber that maintains a constant temperature, and the temperature calibration is conducted by gradually changing the internal temperature in small steps, which may result in low production efficiency. Thus, this may be a bottleneck of a mass-production manufacturing process of the above-described high-precision sensors compared to transmission devices or optical devices having a simpler configuration the settings of which are much simpler than those of the high-precision sensors. Therefore, it may be difficult to reduce the manufacturing cost. The high-precision sensors further require additional cost for the temperature calibration, and hence the cost of the high-precision temperature sensors that require the temperature calibration may be several to dozens times the cost of the temperature sensors that require no temperature calibration. In particular, in order to produce much higher-precision sensors, higher cost and more time may be required for conducting highly accurate temperature calibration.

Further, despite the fact that the currently produced sensors are widely used, not many high-precision sensors are mass-produced compared to mass-produced general-purpose semiconductor devices, due to the slow progress of the temperature calibration technology. Thus, it may be most effective to eliminate the temperature calibration process itself entirely from the manufacturing process. It is preferable that the temperature calibration be easily and simply conducted every time the users use the high-precision sensors in order to maintain high accuracy of the high-precision sensors. However, it may be practically difficult for the users to carry out the temperature calibration after the shipping of the sensors. Thus, there is demand for an electric element capable of conducting temperature calibration by itself utilizing electric signals any time, anywhere in the same manner as a general-purpose semiconductor device that is simply driven by the electric signals alone.

SUMMARY OF THE INVENTION

It is a general object of at least one embodiment of the present invention to provide an electric element capable of conducting temperature calibration without a complicated temperature calibration step and lowering manufacturing cost.

In one embodiment, there is provided a temperature dependent electric element that includes a phase change portion including at least one conductive phase change material having a predetermined phase transition temperature; a detector portion configured to detect a change in conductivity of the phase change material caused by a temperature change to a detect phase transition of the phase change material based on the detected change in conductivity thereof; a temperature calibration part configured to conduct temperature calibration by adjusting a temperature at which the phase change material exhibits the phase transition detected by the detector portion based on the change in the conductivity of the phase change material to the predetermined phase transition temperature of the phase change material; and a substrate on which the phase change portion, the detector portion, and the temperature calibration part are integrally arranged.

BRIEF DESCRIPTION OF THE DRAWINGS

Other objects and further features of embodiments will be apparent from the following detailed description when read in conjunction with the accompanying drawings, in which:

FIG. 6 is a characteristic diagram illustrating a resistance value change computed based on a voltage applied and an output voltage in the two phase change materials having different phase transition temperatures;

FIG. 7 is a characteristic diagram illustrating a resistance-temperature characteristic in the two phase change materials having different phase transition temperatures;

FIGS. 8A and 8B are diagrams illustrating a layered structure of an electric element according to an embodiment;

FIGS. 9A and 9B are diagrams illustrating another layered structure of an electric element according to an embodiment;

FIGS. 10A and 10B are diagrams illustrating another layered structure of an electric element according to an embodiment;

FIGS. 11A and 11B are diagrams illustrating another layered structure of an electric element according to an embodiment;

FIGS. 12A and 12B are diagrams illustrating another layered structure of an electric element according to an embodiment;

FIGS. 14A and 14B are diagrams illustrating a parallel structure of an electric element according to an embodiment;

FIGS. 19A and 19B are diagrams illustrating another parallel structure of an electric element according to an embodiment;

FIGS. 21A and 21B are diagrams illustrating another layered structure of an electric element according to an embodiment;

FIGS. 22A and 22B are diagrams illustrating another layered structure of an electric element according to an embodiment;

FIGS. 32A and 32B are diagrams illustrating another layered structure of an electric element according to an embodiment;

FIGS. 33A and 33B are diagrams illustrating another layered structure of an electric element according to an embodiment;

FIGS. 34A and 34B are diagrams illustrating another layered structure of an electric element according to an embodiment;

FIGS. 38A and 38B are diagrams illustrating another parallel structure of an electric element according to an embodiment;

FIGS. 41A and 41B are diagrams illustrating another layered structure of an electric element according to an embodiment;

FIGS. 42A and 42B are diagrams illustrating another layered structure of an electric element according to an embodiment;

FIGS. 43A and 43B are diagrams illustrating another parallel structure of an electric element according to an embodiment;

FIGS. 45A to 45C are diagrams illustrating another parallel structure of an electric element according to an embodiment;

FIGS. 46A and 46B are diagrams illustrating another parallel structure of an electric element according to an embodiment;

FIGS. 47A and 47B are diagrams illustrating another layered structure of an electric element according to an embodiment;

FIGS. 48A and 48B are diagrams illustrating another parallel structure of an electric element according to an embodiment;

FIGS. 49A and 49B are diagrams illustrating another parallel structure of an electric element according to an embodiment;

FIGS. 51A to 51D are diagrams illustrating another layered structure of an electric element according to an embodiment;

FIGS. 52A to 52D are diagrams illustrating another layered structure of an electric element according to an embodiment;

FIG. 62 is a characteristic diagram illustrating a change in a resistance value of the first temperature detecting portion and a change in a resistance value of the second temperature detecting portion when an ambient temperature is changed;

BEST MODE OF CARRYING OUT THE INVENTION

In the following, preferred embodiments will be described with reference to accompanying drawings.

Initially, a principle of calibration utilizing phase transition of a phase change material is outlined. In this example, a factor that detects the phase transition of the phase change material is illustrated as a change in the electric resistance value.

Figure 1:
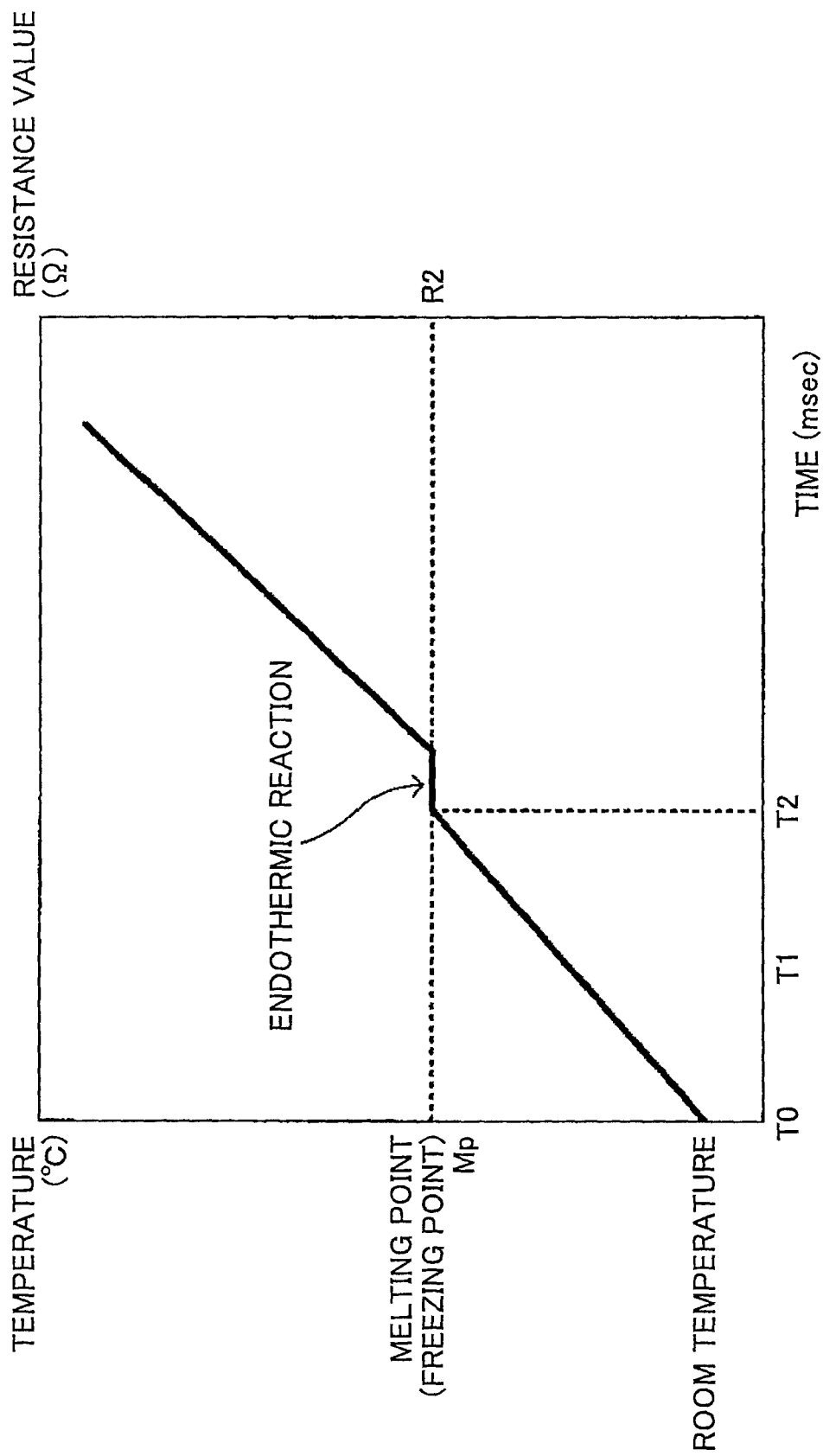
FIG. 1 is a characteristic diagram illustrating a temperature change and an electric resistance value change in a phase change material with time transition.

FIG. 1 is a characteristic diagram illustrating a temperature change and an electric resistance value change in a phase change material with time transition. The characteristic diagram illustrated in FIG. 1 plots the electric resistance value change in a temperature-dependent resistance member arranged adjacent to the phase change material. The electric resistance value change is measured by a resistor while the phase change material is heated with time transition. In this example, a known melting point of the phase change material is utilized for calibration. As illustrated in FIG. 1, when a current having a constant current value is supplied to the phase change material and a phase transition occurs in the phase change material, an endothermic reaction may occur at a temperature (i.e., the melting point: Mp (or a freezing point) at which the phase transition has occurred in the phase change material. If the phase change material is a solid, and a temperature of the phase change material rises and reaches a phase transition temperature, the phase change material starts liquefying. The phase transition temperature of the phase change material remains unchanged until the entire phase change material is liquefied, and starts rising again after the entire phase change material has been liquefied. Thus, the electric resistance value of the resistance member appears to partially be discontinuous as illustrated in the characteristic diagram in FIG. 1. In FIG. 1, the temperature of the resistance member reaches the phase transition temperature when the resistance member has the electric resistance value R2. That is, when the resistance member has the electric resistance R2, the temperature of the resistance member has reached the phase transition temperature. Accordingly, the resistance value of the temperature-dependent resistance member is measured in advance, and the temperature calibration for the resistance member is conducted by adjusting the temperature of the resistance member to the known phase transition temperature obtained at a time at which the measured resistance value reaches the resistance value R2. Thus, since there is a one-to-one relationship between the phase transition temperature and the electric resistance value of the resistance member, the temperature calibration may be conducted based on such a one-to-one relationship between the phase transition temperature and the electric resistance value.

Note that the phase transition time may be accurately detected by reducing the heat capacity of a heat-generating portion, and uniformly forming a thin phase change material to have a uniform temperature region. Specifically, when the phase transition has occurred such that the solid phase change material is liquefied into liquid, the phase change material exhibits an endothermic reaction where a constant temperature of the resistance member is maintained; that is, the temperature of the resistance member remains unchanged from the start of the phase transition to the end of the phase transition as illustrated in FIG. 1. Thus, a tendency to increase the electric resistance value of the heat-generating portion is detected as a phenomenon to change to a parallel state of the resistance value. The transition (change) in the electric resistance value in duration from time T1 to T2 is stored as data, which are operated as a function of a resistance value and time. The function and the data obtained after time T1 are compared. If there are data that do not match the function at time T2, the phase change material exhibits phase transition. Accordingly, the temperature of the phase change material at time T2 is determined as the known phase transition temperature Mp. Specifically, if an electric element having small heat capacity formed of the heat-generating portion, the phase change material and the substrate having a hollow, rapid and significant characteristics may be obtained when time T2=0.1 to 10 ms. For example, in a meandering configuration of a later-described element having a heat-generating portion and a phase change material illustrated in FIGS. 18A and 18B, if a region in which the heat-generating portion 13 and the phase change material are formed has a thickness of 2 μm and a size of 100 μm square, and the phase change material is Sn and has a phase transition temperature of 231.928° C., a standard temperature is obtained in 1 ms. If the size of the region where the heat-generating portion 13 and the phase change material are arranged is further reduced, the standard temperature may be more quickly obtained. Thus, as illustrated in FIG. 1, the electric resistance value R2 of the heat-generating portion corresponds to the known temperature Mp, extremely feeble electric current is supplied to the heat-generating portion so as not to cause the heat-generating portion to generate Joule heat, and the electric resistance value of the heat-generating portion is detected as an environmental temperature of the element by utilizing the known temperature coefficient of resistance TCR of the heat-generating portion. Note that if the electric element is configured to acquire two or more different phase transition temperatures, an unknown temperature coefficient of resistance TCR may be determined without utilizing the known temperature coefficient of resistance TCR of the heat-generating portion. Note that in this embodiment, the phase change material may be any material insofar as the material may exhibit a phase transition at a certain temperature. Specifically, the calibration may be conducted with high accuracy by utilizing a material capable of indicating a temperature as determined by the international temperature scale with which temperatures are determined with high accuracy. Examples of such a material include In and Sn.

Figure 2:
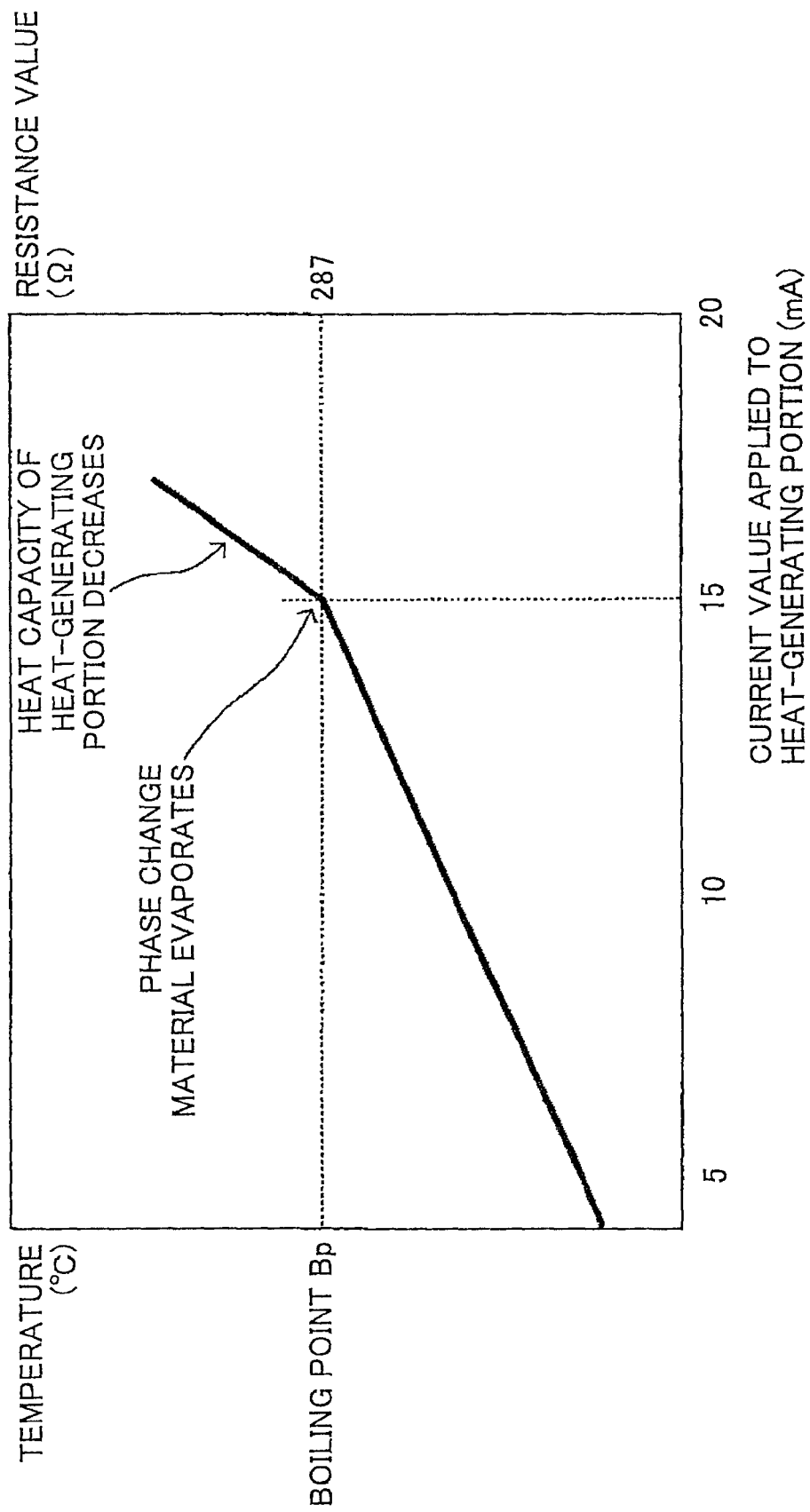
FIG. 2 is a characteristic diagram illustrating a temperature change and an electric resistance value change in a heat-generating portion corresponding to a current supplied to the heat-generating portion in relation to a phase transition material.

FIG. 2 is a characteristic diagram illustrating a temperature change and an electric resistance value change in the heat-generating portion corresponding to a current supplied to the heat-generating portion. As illustrated in FIG. 2, since the phase change material phase transitions from a solid or a gas to a liquid at a known temperature (sublimation point or boiling point: Bp), the phase change material transpires, and the heat capacity of the heat-generating portion decreases in an amount of the transpired phase change material. The decrease in the heat capacity of the heat-generating portion increases a current value of electric power (an electric resistance value) supplied to the heat-generating portion, which increases the temperature (an electric resistance value) of the heat-generating portion at a constant ratio. When the temperature of the heat-generating portion has reached a boiling point Bp, the phase change material exhibits phase transition. The electric resistance value of the heat-generating portion exhibits a discontinuous characteristic due to the change in its heat capacity, and this discontinuous point corresponds to the known boiling point Bp. Similar to a case illustrated in FIG. 1, extremely feeble current is supplied to the heat-generating portion so as not to generate Joule heat, and the electric resistance value of the heat-generating portion may be detected as an environmental temperature of the electric element.

Next, a principle of calibration utilizing different known phase transition temperatures of two or more phase change materials is outlined. Note that in the following example, two phase change materials are employed.

Figure 3:
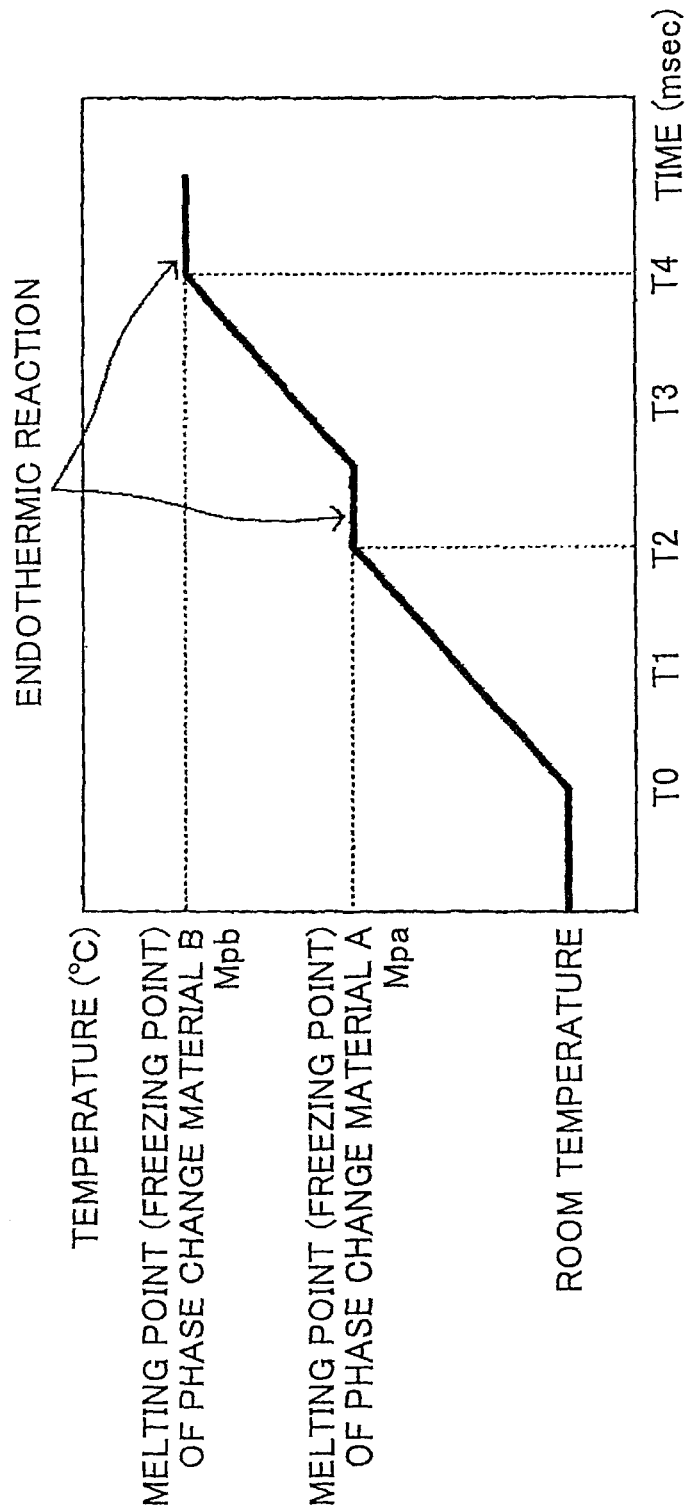
FIG. 3 is a characteristic diagram illustrating temperature changes in the two phase change materials having different phase transition temperatures with time transition.

FIG. 3 is a characteristic diagram illustrating temperature changes with time transition in relation to the two phase change materials having different phase transition temperatures. As illustrated in FIG. 3, the current supplied to the heat-generating portion is increased at a constant rate such that the temperature of a phase change material A reaches a phase transition temperature (i.e., the melting point Mpa (freezing point) of the phase change material A that is a specific known value) at time T2. Further, if the current is continuously supplied to the heat-generating portion to increase the temperature of the heat-generating portion 13, the temperature of a phase change material B reaches a phase transition temperature (i.e., the melting point Mpb (freezing point) of the phase change material B that is a specific known value Mpb (>Mpa) at time T4. Note that the these elements are capable of detecting phase transitions of the phase change materials illustrated in FIG. 3 and determining the respective detected temperatures as the known temperatures by controlling the environmental temperature of the elements without having the heat-generating portion to allow the phase change materials to undergo phase transition. Accordingly, the phase transition of the phase change material in each element is detected, and hence, is highly accurately calibrated utilizing a calibration facility having temperature control accuracy not as high as the temperature control accuracy of the related art calibration facility. A sufficiently small current value is then applied to the heat-generating portion having a predetermined resistance temperature coefficient so as not to generate Joule heat, and a resistance value of the heat-generating portion is detected. Accordingly, highly accurate calibration may be conducted by utilizing the heat-generating portion of each element as a temperature-detecting portion.

Figure 4:
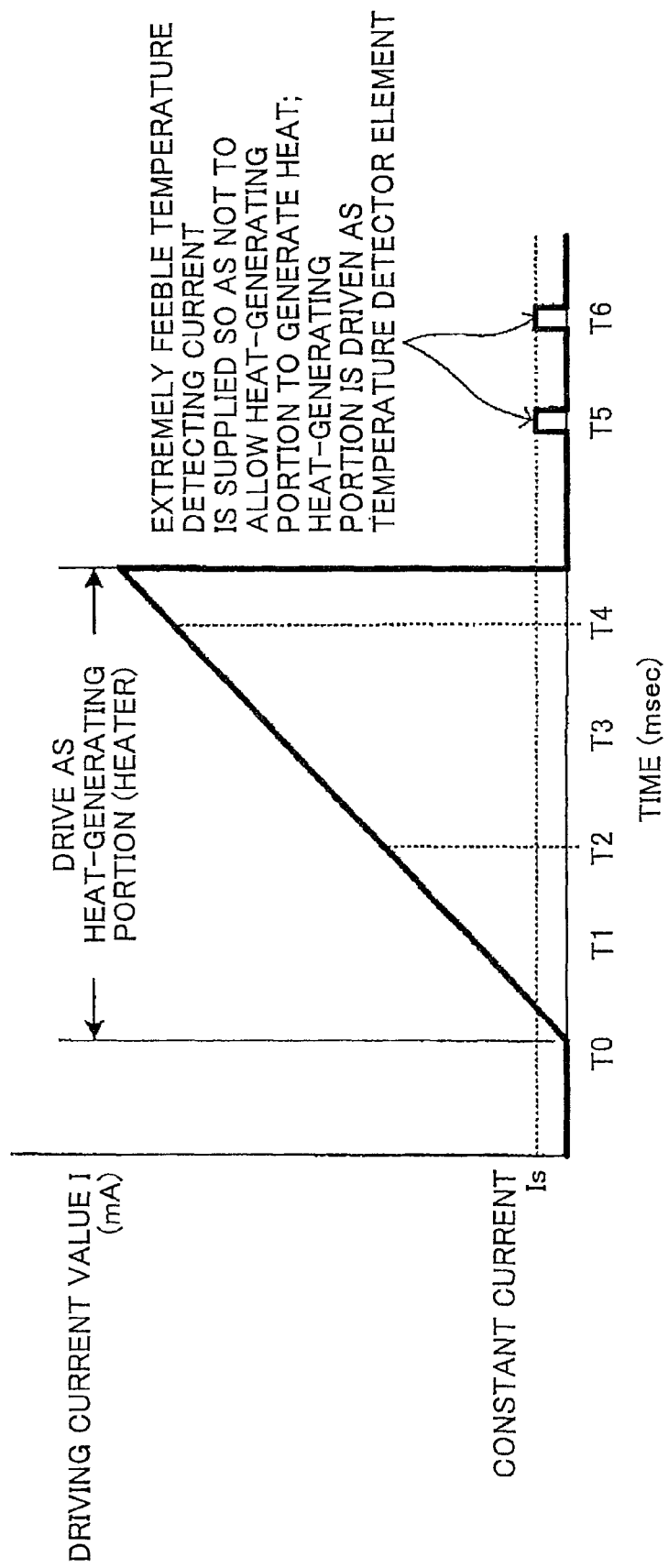
FIG. 4 is a characteristic diagram illustrating a drive current value change in the heat-generating portion with time transition in relation to the two phase change materials having different phase transition temperatures.

Note that at least a condition of "Mpa Mpb" is satisfied. FIG. 4 illustrates a characteristic diagram illustrating a drive current value change in the heat-generating portion in relation to two phase change materials having different phase transition corresponding to the time transition. As illustrated in FIG. 4, the current value is increased at a predetermined rate in a duration from time T0 to time T4 where the output voltage is measured and the measured output voltage is converted into a resistance value to form two bias points R ($\Delta R=0$). The temporal differentiation values $\Delta R$ of the resistance values obtained from time T0 to time T1 are stored, and they are then compared with $\Delta R$ values obtained after time T2. Despite the fact that the applied power is increased, the temperature is not increased until the phase transition from the solid to the liquid completes due to the effect of the endothermic reaction.

Figure 5:
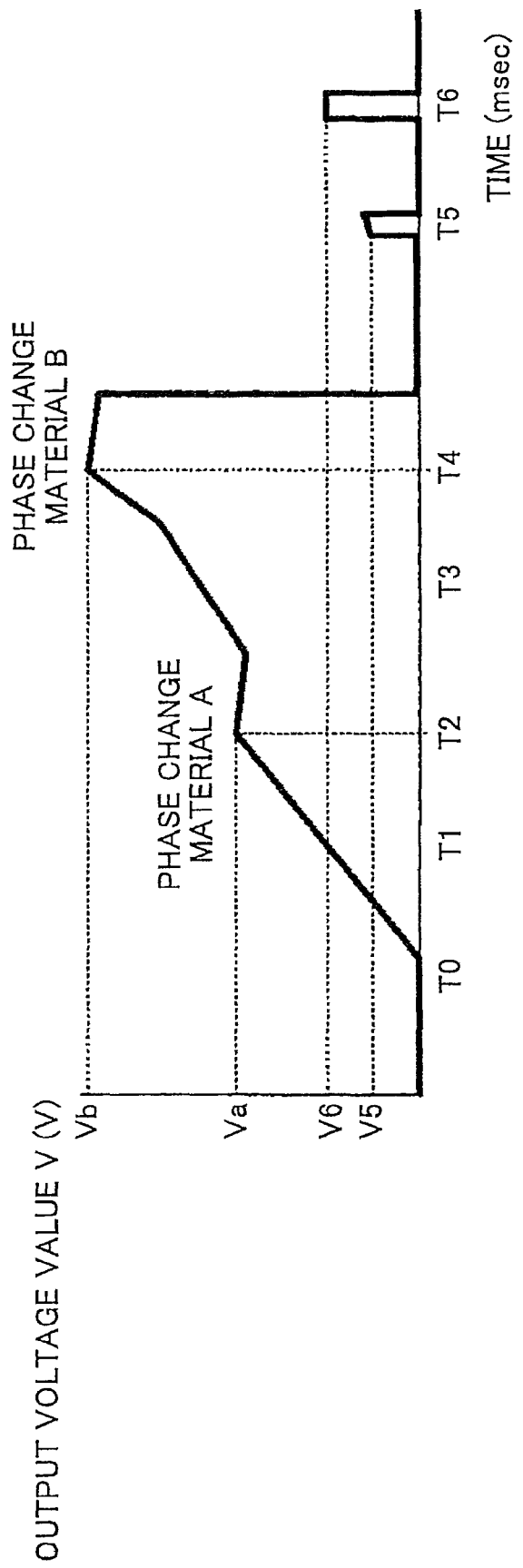
FIG. 5 is a characteristic diagram illustrating an output voltage value change between detecting leads with time transition in relation to the two phase change materials having different phase transition temperatures.

Accordingly, it is determined that the temperature of the phase change material A has reached the phase transition temperature Mpa at time T2. Likewise, it is determined that the temperature of the phase change material B has reached the phase transition temperature Mpb at time T4. Accordingly, the current supply value or the output voltage value Va of the heat-generating portion (utilized as a heater and a temperature-detecting portion) at time T2 illustrated in FIG. 5 corresponds to the resistance value Ra obtained at the melting point Mpa illustrated in FIG. 6. Further, the current supply value or the output voltage value Vb of the heat-generating portion at time T4 (see FIG. 5) corresponds to the resistance value Rb obtained at the melting point Mpb (see FIG. 6), and the temperature dependency of the heat-generating portion (temperature calibration of the resistance value) is approximated by a function of the temperature and the resistance value. As illustrated in FIG. 5, extremely feeble constant current Is is supplied to the heat-generating portion at time T5 and time T6 so as not to allow the heat-generating portion to generate heat in a similar manner as the resistance thermometer sensor. As a result, the resistance value V5/Is and the resistance value V6/Is are detected as the temperature C5 and the temperature C6, respectively, as illustrated in FIG. 6 by utilizing the function of the temperature and the resistance value. The ambient temperature indicated by a broken line of FIG. 6 is measured. The temperature measurement may be conducted in this manner.

As described above, since two different phase change materials include different phase transition temperatures, the element may be calibrated when the temperature of the heat-generating portion has reached the two different temperatures. Thus, highly accurate temperature calibration may be achieved. Note that since the temperature dependency of the heat-generating portion (i.e., the temperature calibration of the resistance value) is computed, it is possible to utilize a resistance material having an unknown temperature coefficient of resistance (TCR). If the resistance material having a known temperature coefficient of resistance (TCR) is utilized as a material for the heat-generating portion, a highly accurate resistance value-temperature characteristic may be obtained as illustrated in FIG. 7. For example, if the heat-generating portion includes Pt, the resistance value R ($\Omega$) and the temperature S ($^\circ$ C.) of the heat-generating portion may be represented by the following equation (1).

$$R=R0*(1+\alpha \cdot S) \qquad (1)$$

Note that if the temperature coefficient of resistance (TCR) $\alpha$ is 3.9083E-03 (0 to 850$^\circ$ C.), the phase change material A formed of In and having Mpa=156.5985$^\circ$ C. corresponds to a resistance value Ra and the phase change material B formed of Sn and having Mpb=231.928$^\circ$ C. corresponds to a resistance value Rb, and the temperature coefficient of resistance (TCR) $\alpha$ is corrected based on the resistance values Ra and Rb, a further accurate calibration may be achieved to form a linear temperature coefficient of resistance (TCR) $\alpha$ at temperatures from 0 to 850$^\circ$ C., and the accuracy may be secured for the temperature range outside the range of Mpa and Mpb. Note that the two different phase transition temperatures indicate two different kinds of phase change materials in the figures (e.g., FIG. 6). However, if the temperature dependency exhibits linear temperature dependency, numerous known phase transition temperatures may be required. In such cases, the kinds of the phase change materials illustrated in the figure may be increased. The temperature calibration of the electric element having the temperature dependency is conducted based on the electric resistance value change that is detected as a phase transition of the phase change material in the above example. Other factors that indicate a phase transition of another phase change material include mass, heat capacity, a specific frequency, a dielectric constant, viscosity, optical transmittance, optical reflectance, and optical absorptance.

Next, a structure of the electric element according to an embodiment is described. In this embodiment, a change in the electric resistance value is detected based on one phase change material. FIGS. 8A and 8B are diagrams illustrating a layered structure of the electric element according to an embodiment. FIG. 8A is a plan diagram and FIG. 8B is an A-A' sectional diagram of the electric element according to the embodiment. In the electric element having a layered structure illustrated in FIGS. 8A and 8B, the heat-generating portion and the phase change material are closely attached such that the conductivity of heat may be uniform, and the heat capacity may be small. Accordingly, the calibration of the electric element may be rapid. Accordingly, highly accurate temperature detection may be achieved. The electric element according to the embodiment may be formed by arranging a pair of leads 12 formed of a conductive material such as Si, Pt, NiCr, SiC and C and configured to supply power to the electric element on a substrate 11 formed of an electric insulator material such as glass or ceramics, arranging a heat-generating portion 13 at a front-end of the pair of the leads 12, and uniformly layering a phase change material 14 on the heat-generating portion 13. Since the heat-generating portion 13 includes a thickness less than that of the leads 12 or includes a width that is less than that of the leads 12, the heat-generating portion 13 has a greater electric resistance value than that of the leads 12. Accordingly, the heat-generating portion 13 may be capable of being supplied with a current to generate Joule heat. A specific resistance value of the electric resistance material of the heat-generating portion 13 and an electric resistance value corresponding to the temperature coefficient of resistance correspond to the temperature of the heat-generating portion 13. In the electric element having the above configuration, the current is supplied to the heat-generating portion 13 via the pair of the leads 12 such that the heat-generating portion 13 may generate heat. Then, the pair of the leads 12 detects the electric resistance value that indicates the phase transition of the phase change material 14 layered on the heat-generating portion 13. Accordingly, based on the above-described principle, the phase transition temperature of the phase change material 14 may be detected by detecting an electric resistance value of the phase change material 14 layered on the heat-generating portion 13. Note that the phase change material 14 is a non-conductive material that will not electrically affect the heat-generating portion 13 and is capable of acquiring the heat effect on the heat-generating portion 13 as electric properties of the heat-generating portion 13. When the heat-generating portion 13 is supplied with a current from rear ends of the leads 12, the heat-generating portion 13 generates Joule heat to increase its temperature. Further, a small amount of the phase change material 14 is closely arranged to the heat-generating portion 13 such that the temperature of the phase change material 14 may be approximately the same temperature as the heat-generating portion 13.

FIGS. 9A and 9B are diagrams illustrating another layered structure of an electric element according to an embodiment. In FIGS. 9A and 9B, reference numerals identical to those illustrated in FIGS. 8A and 8B indicate the same components of the electric element according to the embodiment illustrated in FIGS. 8A and 8B. FIG. 9A is a plan diagram and FIG. 9B is an A-A' sectional diagram of the electric element according to the embodiment. The substrate 11 illustrated in FIG. 9B is formed of a conductive material such as Al, Ni and Si. Since the substrate 11 is formed of the conductive material having a risk of interfering with the leads 12 or the heat-generating portion 13, an electric insulator layer 15 is formed on a surface of the substrate 11 in the electric element illustrated in FIGS. 9A and 9B. The electric insulator layer 15 exhibits phase-transition if the temperature of the electric insulator layer 15 is lower than that of the phase change material 14. Thus, it is preferable that the electric insulator layer 15 be formed of a material having a phase transition temperature higher than that of the phase change material 14. Examples of such materials include heat-resistant materials formed of $SiO_2$, $Si_3N_4$ and $Al_2O_3$. The substrate made of Si may facilitate the integration of peripheral circuits. The electric insulator layer 15 may be obtained by thermally oxidizing the substrate 11 made of Si to form $SiO_2$ on the surface of the substrate, 11 or may be formed of a Si-on-insulator (SOI) structure.

FIGS. 10A and 10B are diagrams illustrating another layered structure of an electric element according to an embodiment. In FIGS. 10A and 10B, reference numerals identical to those illustrated in FIGS. 9A and 9B indicate the same components of the electric element according to the embodiment illustrated in FIGS. 9A and 9B. FIG. 10A is a plan diagram and FIG. 10B is an A-A' sectional diagram of the electric element according to the embodiment. The electric element illustrated in FIGS. 10A and 10B differs from the electric element illustrated in FIGS. 9A and 9B in that the electric element illustrated in FIGS. 10A and 10B further includes a hollow 16 in a region of the substrate 11 excluding a region where the heat-generating portion 13 and the phase change material 14 are formed. The hollow 16 is formed by etching of the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since a small amount of the phase change material 14 is closely arranged (layered) on the heat-generating portion 13, the temperature of the phase change material 14 may become approximately the same as that of the heat-generating portion 13 and hence, the temperature distribution may become uniform. Accordingly, the temperatures of the phase change material 14 and the heat-generating portion 13 may be rapidly controlled, which facilitates rapid completion of highly accurate temperature calibration of the electric element. A method for manufacturing the electric element in a case where the substrate 11 is formed of the conductive material includes layering the electric insulator layer 15 on the substrate 11, layering a thin film of a conductive electric resistance material by depositing or sputtering on the substrate 11 via the electric insulator layer 15, and patterning the conductive electric resistance material as the leads 12 and the heat-generating portion 13 by photoetching, which is a semiconductor microfabrication technology. The method for manufacturing the electric element further includes patterning the phase change material 14 on the heat-generating portion 13 via the electric insulator layer 15, if the phase change material 14 is formed of a conductive material. In a case where the electric element has a structure having the hollow 16 in the substrate 11, the method for manufacturing the electric element further includes removing a region of the substrate 11 that faces a peripheral region of the heat-generating portion 13 and the phase change material 14 by etching such that the substrate 11 includes the hollow 16 in a region corresponding to the peripheral region of the heat-generating portion 13 and the phase change material 14. The formation of the hollow 16 in the substrate 11 may reduce an adverse effect of the substrate 11 having a large heat capacity on the heat-generating portion 13 and the phase change material 14, and may also reduce the heat capacities of the heat-generating portion 13 and the phase change material 14. Accordingly, the temperature of the electric element may be rapidly adjusted to a predetermined temperature.

FIGS. 11A and 11B are diagrams illustrating another layered structure of an electric element according to an embodiment. In FIGS. 11A and 11B, reference numerals identical to those illustrated in FIGS. 10A and 10B indicate the same components of the electric element according to the embodiment illustrated in FIGS. 10A and 10B. FIG. 11A is a plan diagram and FIG. 11B is an A-A' sectional diagram of the electric element according to the embodiment. The electric element illustrated in FIGS. 11A and 11B differs from the electric element illustrated in FIGS. 10A and 10B in that the electric element illustrated in FIGS. 11A and 11B further includes detecting leads 17 connected to the phase change material 14. Note that the detecting leads 17 may be made of Al or Au, or formed of the same material as that of the heat-generating portion 13. The phase change material 14 is formed of a conductive material and is layered on the heat-generating portion 13 via the electric insulator layer 18 for being electrically insulated from the heat-generating portion 13. Accordingly, the detecting leads 17 may be capable of individually detecting a status of the phase change material 14 electrically separated from the heat-generating portion 13. With this configuration, a phase transition temperature of the phase change material 14 may be accurately detected. Further, the power to be supplied to the heat-generating portion 13 may be simply controlled without affecting the electric properties of the heat-generating portion 13 despite the fact that the phase change material 14 is formed of a conductive material. Further, even if the detecting leads 17 made of Al or Au and peripheral circuits are integrated on the substrate 11, the detecting leads 17 made of Al or Au are formed of the same material as that of wiring patterns of the peripheral circuits. Thus, the manufacturing process may not be complicated.

FIGS. 12A and 12B are diagrams illustrating another layered structure of an electric element according to an embodiment. In FIGS. 12A and 12B, reference numerals identical to those illustrated in FIGS. 11A and 11B indicate the same components of the electric element according to the embodiment illustrated in FIGS. 11A and 11B. FIG. 12A is a plan diagram and FIG. 123 is an A-A' sectional diagram of the electric element according to the embodiment. The electric element illustrated in FIGS. 12A and 12B differs from the electric element illustrated in FIGS. 11A and 11B in that the electric element illustrated in FIGS. 12A and 12B further includes a hollow 16 in a region of the substrate 11 excluding a region where the heat-generating portion 13 and the phase change material 14 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since a small amount of the phase change material 14 is closely arranged (layered) on the heat-generating portion 13, the temperature of the phase change material 14 may become similar to that of the heat-generating portion 13 and hence, the temperature distribution may become uniform. Accordingly, the temperatures of the phase change material 14 and the heat-generating portion 13 may be rapidly controlled, which facilitates rapid completion of highly accurate temperature calibration of the electric element.

Figure 13A:
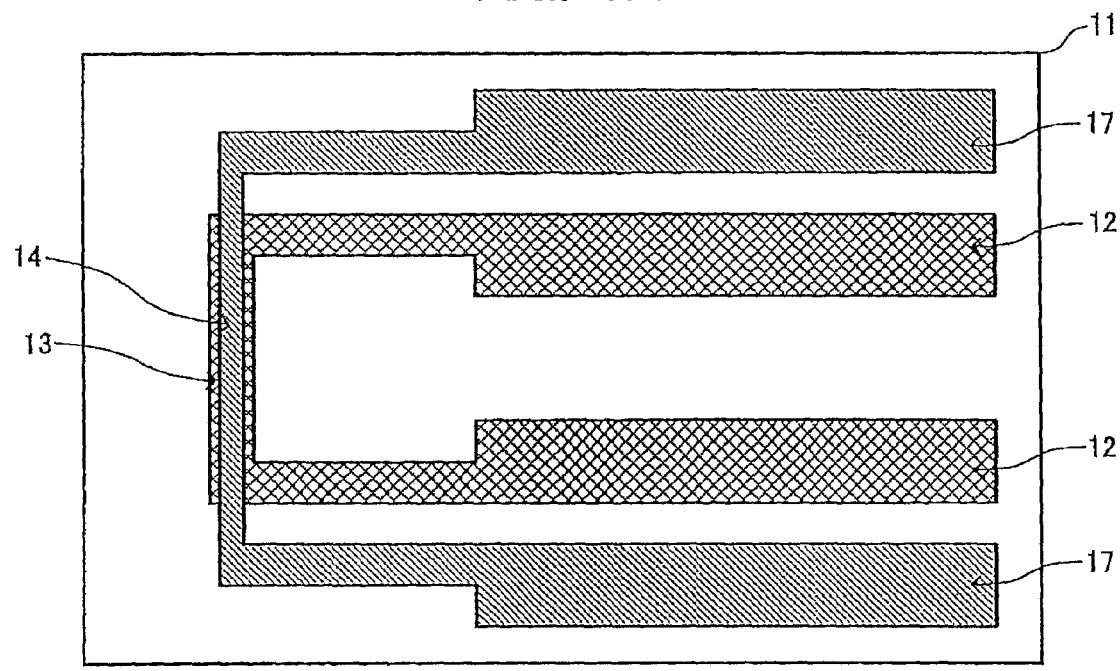
FIGS. 13A and 13B are plan diagrams illustrating another layered structure of an electric element according to an embodiment.
Figure 13B:
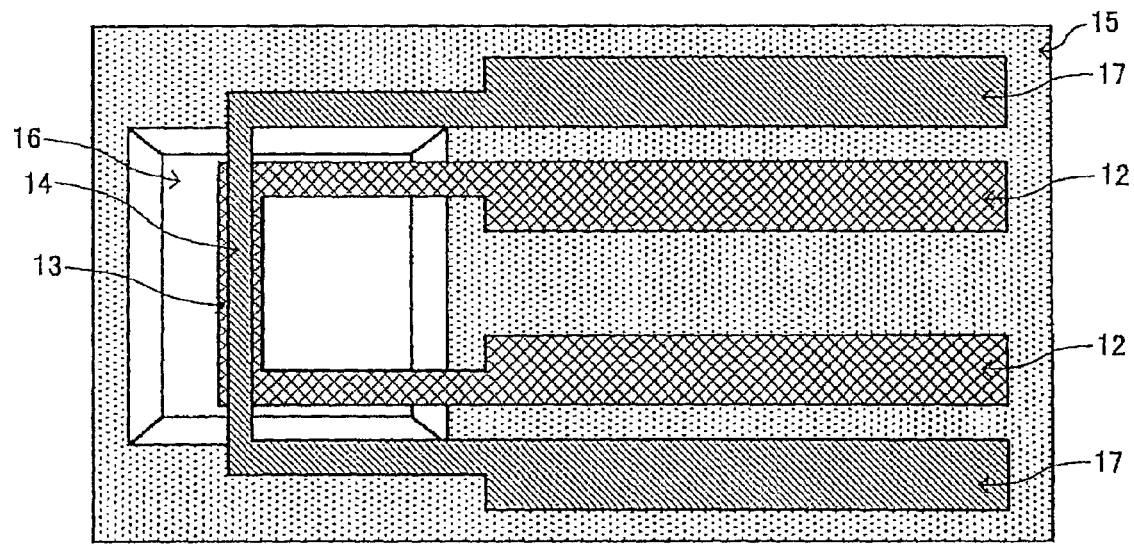

FIGS. 13A and 13B are diagrams illustrating another layered structure of an electric element according to an embodiment. In FIGS. 13A and 13B, reference numerals identical to those illustrated in FIGS. 11A and 11B indicate the same components of the electric element according to the embodiment illustrated in FIGS. 11A and 11B. The electric element illustrated in FIG. 13A includes a layered structure in a case a pattern of the detecting leads 17 is made of the same conductive material as that of the phase change material 14 such as a metallic material such that the detecting leads 17 may be capable of detecting the electric properties of the phase change material 14. Thus, the structure of the electric element may be formed simpler by forming the phase change material 14 and the detecting leads 17 utilizing the same material, thereby simplifying the manufacturing process of such an electric element. The electric element illustrated in FIG. 13B differs from the electric element illustrated in FIG. 13A in that the electric element illustrated in FIG. 13B further includes a hollow 16 in a region of the substrate 13 corresponding to a region where the heat-generating portion 13 and the phase change material 14 are formed. With such a structure illustrated in FIG. 13B, highly accurate calibration may be achieved by rapidly controlling the temperatures of the heat-generating portion 13 and the phase change material 14 of the electric element.

FIGS. 14A and 14B are diagrams illustrating a parallel structure of an electric element according to an embodiment. In FIGS. 14A and 14B, reference numerals identical to those illustrated in FIGS. 8A and 8B indicate the same components of the electric element according to the embodiment illustrated in FIGS. 8A and 8B. FIG. 14A is a plan diagram and FIG. 14B is an A-A' sectional diagram of the electric element according to the embodiment. The electric element having the parallel structure illustrated in FIGS. 14A and 14B includes the substrate 11 on which the leads 12 formed of the electric resistance material, the heat-generating portion 13 and the phase change material 14 are formed such that the phase change material 14 is arranged in parallel with the heat-generating portion 13 via a space. If patterns of the leads 12 and the heat-generating portion 13 are formed by photoetching that is a semiconductor microfabrication technology, the layered structure having an uneven level may adversely affect dimension processing accuracy. Thus, the heat-generating portion 13 is arranged in parallel with the phase change material 14 on the same plane such that the uneven level of the patterns may be reduced and variability in dimensional accuracy may also be reduced. Further, since a space is provided between the heat-generating portion 13 and the phase change material 14, the heat-generating portion 13 is electrically insulated from the phase change material 14. Accordingly, even if the phase change material 14 is a conductive material, the phase change material 14 that is the conductive material will not affect the heat-generating portion 13.

Figure 15A:
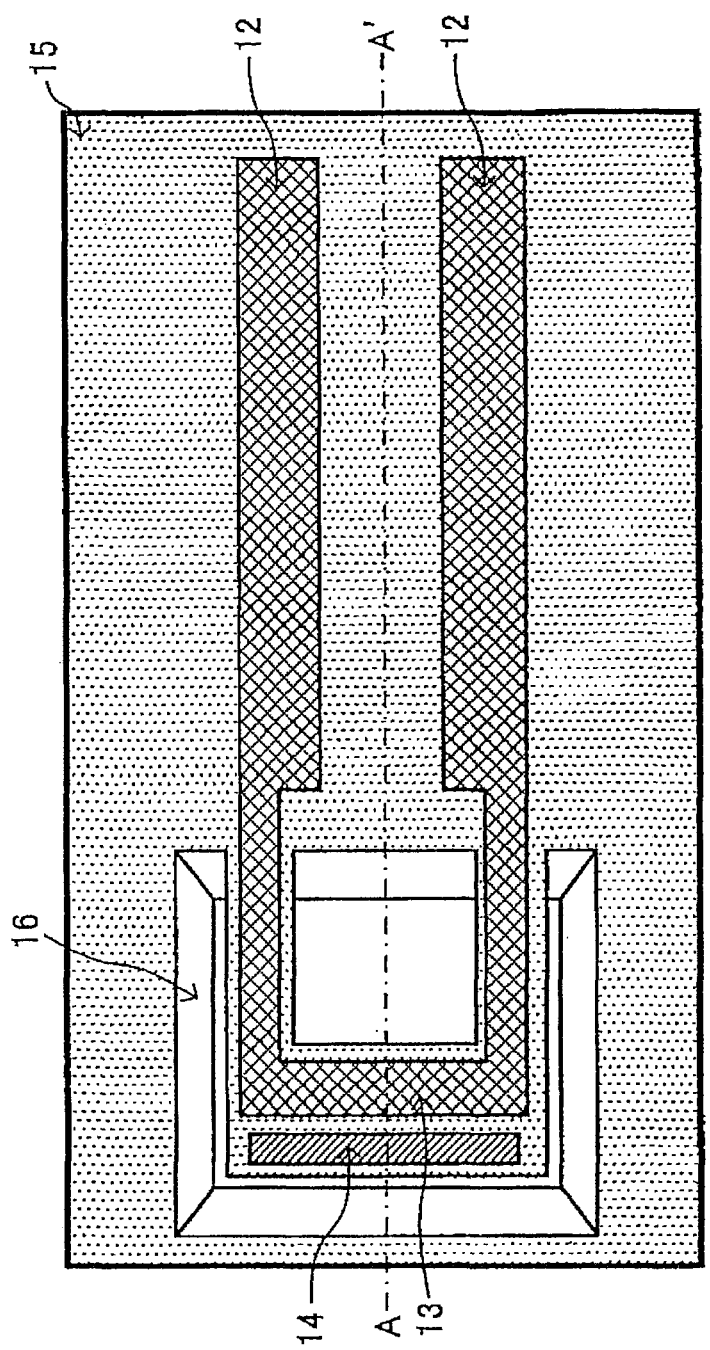
FIGS. 15A and 15B are diagrams illustrating another parallel structure of an electric element according to an embodiment.
Figure 15B:
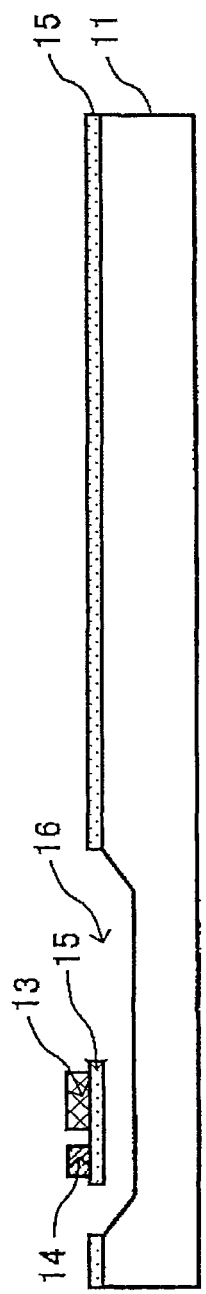

FIGS. 15A and 15B are diagrams illustrating another parallel structure of an electric element according to an embodiment. In FIGS. 15A and 15B, reference numerals identical to those illustrated in FIGS. 14A and 14B indicate the same components of the electric element according to the embodiment illustrated in FIGS. 14A and 14B. FIG. 15A is a plan diagram and FIG. 15B is an A-A' sectional diagram of the electric element according to the embodiment. The electric element illustrated in FIGS. 15A and 15B differs from the electric element illustrated in FIGS. 14A and 14B in that the electric element illustrated in FIGS. 15A and 15B further includes a hollow 16 in a region of the substrate 11 excluding a region where the heat-generating portion 13 and the phase change material 14 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since a small amount of the phase change material 14 is closely arranged in parallel with the heat-generating portion 13, the temperature of the phase change material 14 may become similar to that of the heat-generating portion 13 and hence, the temperature distribution may become uniform. Accordingly, the temperatures of the phase change material 14 and the heat-generating portion 13 may be rapidly controlled, which facilitates rapid completion of highly accurate temperature calibration of the electric element.

Figure 16A:
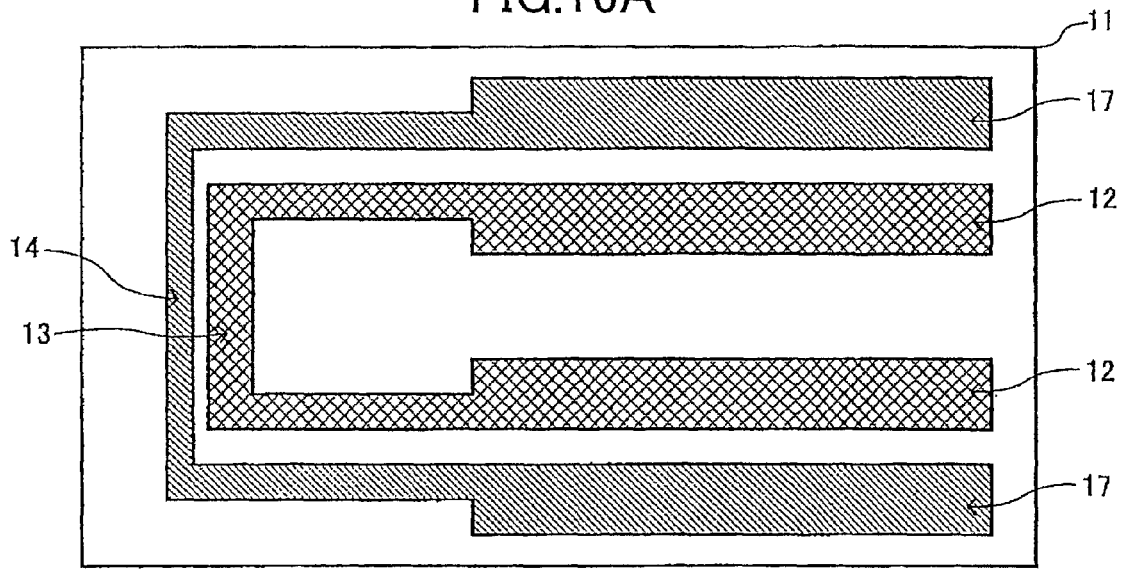
FIGS. 16A and 16B are plan diagrams illustrating another parallel structure of an electric element according to an embodiment.
Figure 16B:
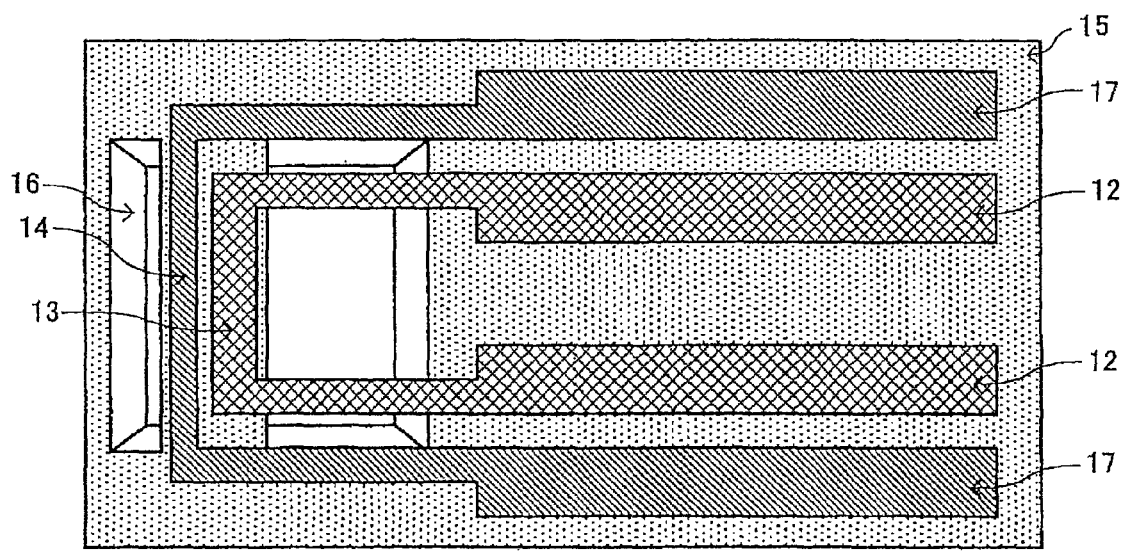

FIGS. 16A and 16B are diagrams illustrating another layered structure of an electric element according to an embodiment. In FIGS. 16A and 16B, reference numerals identical to those illustrated in FIGS. 15A and 15B indicate the same components of the electric element according to the embodiment illustrated in FIGS. 15A and 15B. The electric element illustrated in FIG. 16A includes a parallel structure in a case the detecting leads 17 are made of the same conductive material as that of the phase change material 14 such as a metallic material such that the detecting leads 17 may be capable of detecting the electric properties of the phase change material 14. Thus, the structure of the electric element may be formed simpler by forming the phase change material 14 and the detecting leads 17 utilizing the same material, thereby simplifying the manufacturing process of such an electric element. The electric element illustrated in FIG. 16B differs from the electric element illustrated in FIG. 16A in that the electric element illustrated in FIG. 16B further includes a hollow 16 in a region of the substrate 16 corresponding to a region where the heat-generating portion 13 and the phase change material 14 are formed. With such a parallel structure illustrated in FIG. 16B, highly accurate calibration may be achieved by rapidly controlling the temperatures of the heat-generating portion 13 and the phase change material 14 of the electric element.

Figure 17A:
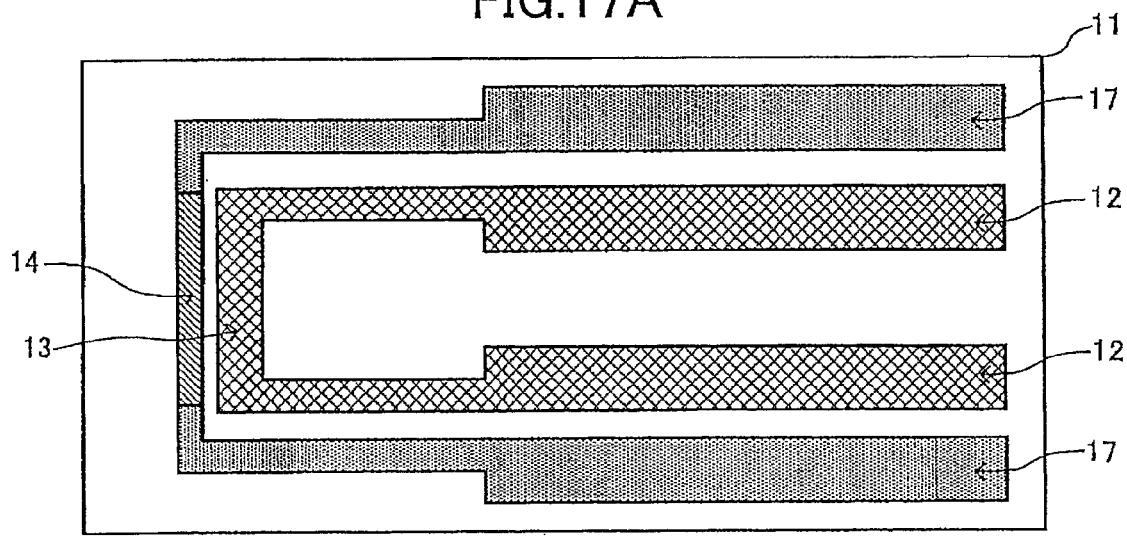
FIGS. 17A and 17B are plan diagrams illustrating another parallel structure of an electric element according to an embodiment.
Figure 17B:
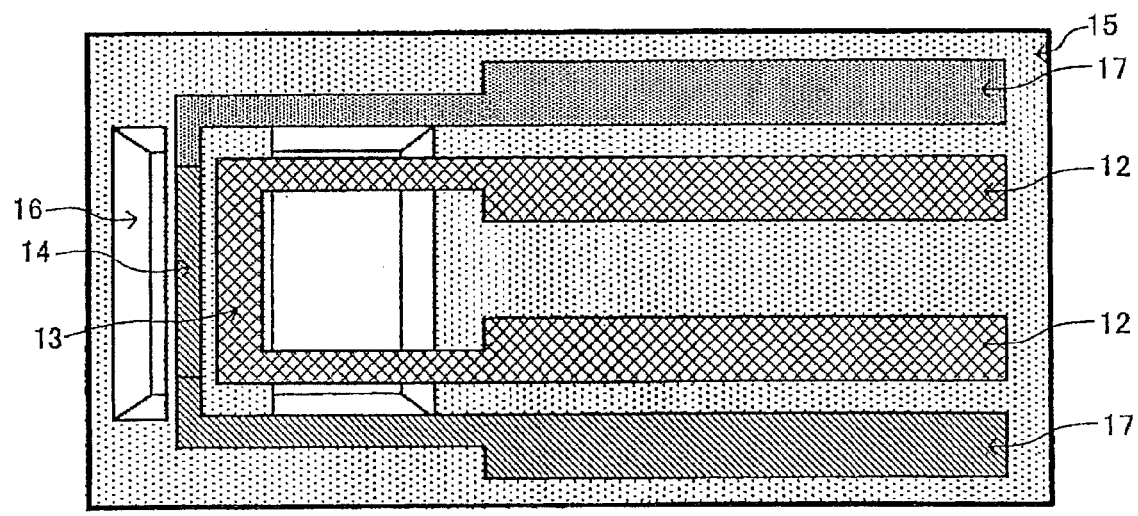

FIGS. 17A and 17B are diagrams illustrating another parallel structure of an electric element according to an embodiment. In FIGS. 17A and 17B, reference numerals identical to those illustrated in FIGS. 16A and 16B indicate the same components of the electric element according to the embodiment illustrated in FIGS. 16A and 16B. The electric element having the parallel structure illustrated in FIG. 17A differs from the electric element illustrated in FIGS. 16A and 16B in that the detecting leads 17 are connected to the phase change material 14. Note that the detecting leads 17 may be made of Al or Au, or formed of the same material as that of the heat-generating portion 13. The electric element illustrated in FIG. 17B differs from the electric element illustrated in FIG. 17A in that the electric element illustrated in FIG. 17B further includes a hollow 16 in a region of the substrate 11 excluding a region where the heat-generating portion 13 and the phase change material 14 are formed. The hollow 16 is formed by etching the region of the substrate 11 utilizing the electric insulator layer 15 as a mask.

Figure 18B:
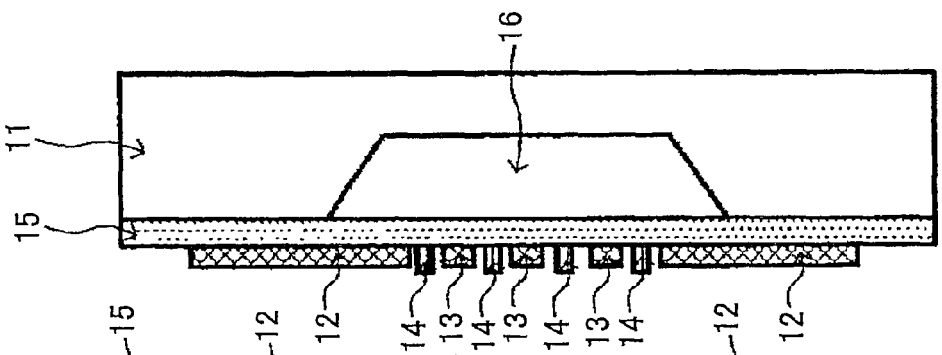
FIGS. 18A and 18B are diagrams illustrating another parallel structure of an electric element according to an embodiment.
Figure 18A:
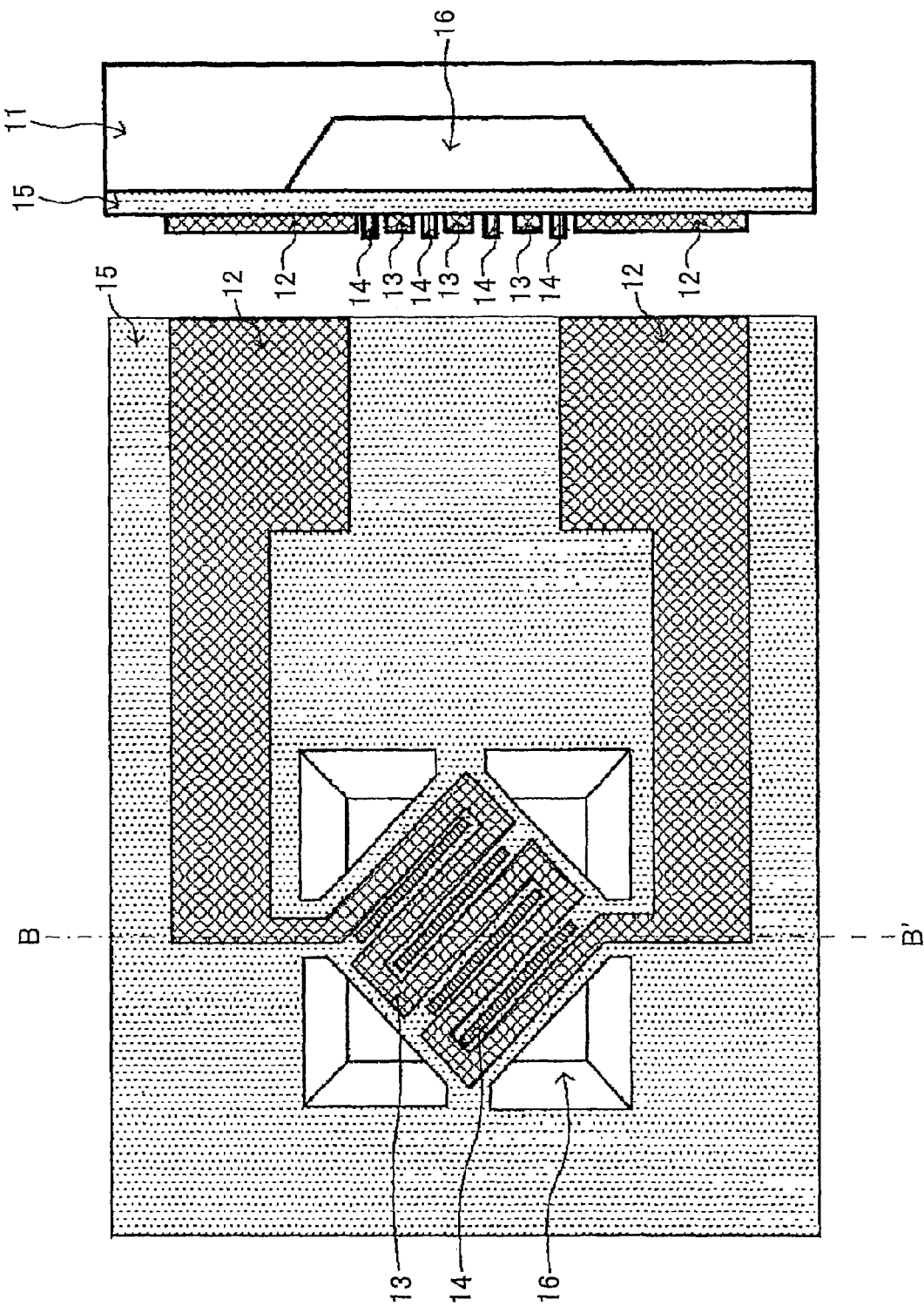

FIGS. 18A and 18B are diagrams illustrating another parallel structure of an electric element according to an embodiment. FIG. 18A is a plan diagram and FIG. 18B is a B-B' sectional diagram of the electric element according to the embodiment. In FIGS. 18A and 18B, reference numerals identical to those illustrated in FIGS. 17A and 17B indicate the same components of the electric element according to the embodiment illustrated in FIGS. 17A and 17B. In the electric element according to the embodiment illustrated in FIGS. 18A and 18B, the electric insulator layer 15 partially includes opening regions corresponding to a region where the hollow 16 is formed in the substrate 11 such that air present in the hollow 16 may be in communication with ambient air via the opening regions formed in the electric insulator layer 15. Further, the heat-generating portion 13 having a meandering structure is arranged on the electric insulator layer 15 such that portions obtained by dividing the phase change material 14 are arranged between meandering portions of the meandering structure of the heat-generating portion 13 such that the portions of the phase change material are arranged in parallel with the meandering portions of the meandering structure of the heat-generating portion 13. Since the heat-generating portion 13 has the meandering structure, the heat-generating portion 13 and the phase change material 14 may be locally arranged in high density. Accordingly, the temperature distribution may become uniform and hence, highly accurate calibration may be efficiently achieved.

FIGS. 19A and 19B are diagrams illustrating another parallel structure of an electric element according to an embodiment. FIG. 19A is a plan diagram and FIG. 19B is a B-B' sectional diagram of the electric element according to the embodiment. In FIGS. 19A and 19B, reference numerals identical to those illustrated in FIGS. 18A and 18B indicate the same components of the electric element according to the embodiment illustrated in FIGS. 18A and 18B. The electric element illustrated in FIGS. 19A and 19B differs from the electric element illustrated in FIGS. 18A and 18B in that the electric element illustrated in FIGS. 19A and 19B further includes an electric insulator layer 18 on a surface of the meandering structure of the heat-generating portion 13 and the phase change material 14 is layered over the electric insulator layer 18. Since the heat-generating portion 13 has the meandering structure on which the electric insulator layer 18 and the phase change material 14 are further layered, the heat-generating portion 13 and the phase change materials 14 may be locally arranged in high density. Accordingly, the temperature distribution may become uniform and hence, highly accurate calibration may be efficiently achieved.

Figure 20:
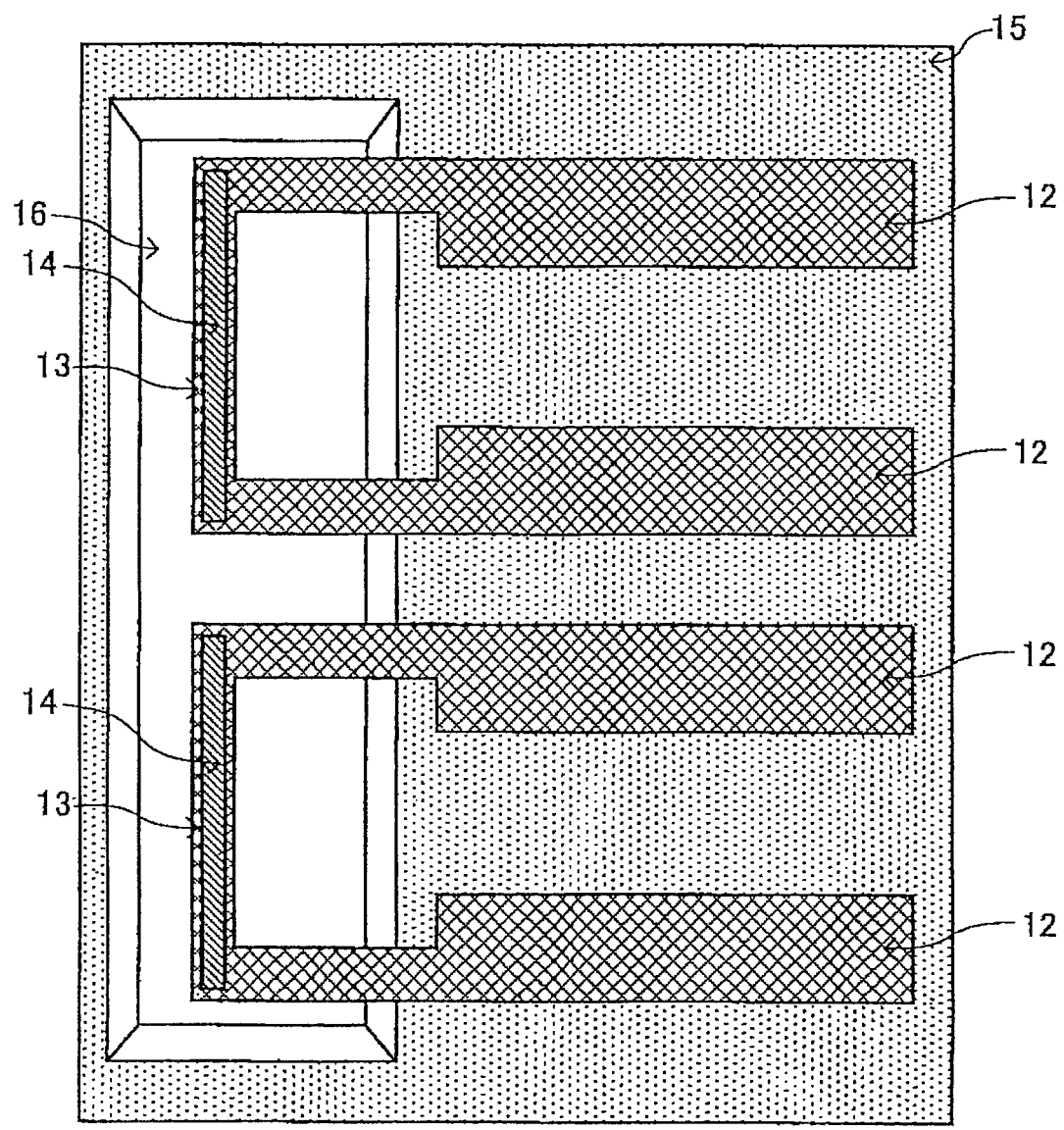
FIG. 20 is a plan diagram illustrating another layered structure of an electric element according to an embodiment.

FIG. 20 is a diagram illustrating another layered structure of an electric element according to an embodiment. In FIG. 20, reference numerals identical to those illustrated in FIGS. 8A and 8B indicate the same components of the electric element according to the embodiment illustrated in FIGS. 8A and 8B. The electric element illustrated in FIG. 20 differs from the electric element illustrated in FIGS. 8A and 8B in that the electric element illustrated in FIG. 20 includes two or more layered units composed of the heat-generating portion 13 and the phase change material 14. With this configuration, after a warranty period of the electric element implemented by calibration of a first layered unit has expired, a warranty period of the electric element may be implemented by calibration of a second layered unit. Thus, a longer warranty period may be secured for the electric element. Further, the electric element includes a bridge circuit as a temperature compensation detector in order to reduce a temperature fluctuation effect during the calibrations.

FIGS. 21A and 21B are diagrams illustrating another layered structure of an electric element according to an embodiment. FIG. 21A is a plan diagram and FIG. 21B is an A-A' sectional diagram of the electric element according to the embodiment. In FIGS. 21A and 21B, reference numerals identical to those illustrated in FIGS. 17A and 17B indicate the same components of the electric element according to the embodiment illustrated in FIGS. 17A and 17B. In the electric element having a structure in which the phase change material 14 formed of a metallic material and susceptible to oxidation is exposed from a surface of the electric element, the phase change material 14 may be oxidized by an ambient atmosphere and changed into a metallic oxide. Thus, a phase transition temperature of the phase change material 14 may be changed due to the metallic oxidation of the phase change material 14. Further, if the phase change material 14 is liquefied, the temperature distribution may be changed due to flow deformation of the liquefied phase change material 14. In this case, if the calibration is repeatedly conducted, reproducibility may not be obtained in calibration. Thus, in the electric element illustrated in FIGS. 21A and 21B, the electric insulator layer 18 is formed as a passivation film over the phase change material 14 in order to prevent the phase change material 14 from chemically reacting with the ambient atmosphere. Note that the electric insulator layer 18 may preferably be formed of a heat-resistant material such as $SiO_2$, $Si_3N_4$ or $Al_2O_3$. Further, if highly accurate calibration is desired utilizing a defining fixed point of the international temperature scale, a freezing point (melting point) of the phase change material 14 needs to be detected under the standard atmospheric pressure of 10.1325 Pa. In this case, since a constant pressure is maintained inside the heat-resistant electric insulator layer 18 due to the rigidity of the heat-resistant electric insulator layer 18, accuracy of the calibration may be increased without being affected by the atmospheric pressure change.

FIGS. 22A and 22B are diagrams illustrating another layered structure of an electric element according to an embodiment. In FIGS. 22A and 22B, reference numerals identical to those illustrated in FIGS. 21A and 21B indicate the same components of the electric element according to the embodiment illustrated in FIGS. 21A and 21B. FIG. 22A is a plan diagram and FIG. 22B is an A-A' sectional diagram of the electric element according to the embodiment. The electric element illustrated in FIGS. 22A and 22B differs from the electric element illustrated in FIGS. 21A and 21B in that the electric element illustrated in FIGS. 22A and 22B further include a hollow 16 in a region of the substrate 11 excluding a region where the heat-generating portion 13 and the phase change material 14 are formed. The hollow 16 is formed by etching the region of the substrate 11 utilizing the electric insulator layer 15 as a mask. Thus, highly accurate calibration may be achieved by rapidly controlling the temperatures of the heat-generating portion 13 and the phase change material 14 of the electric element.

Figure 23A:
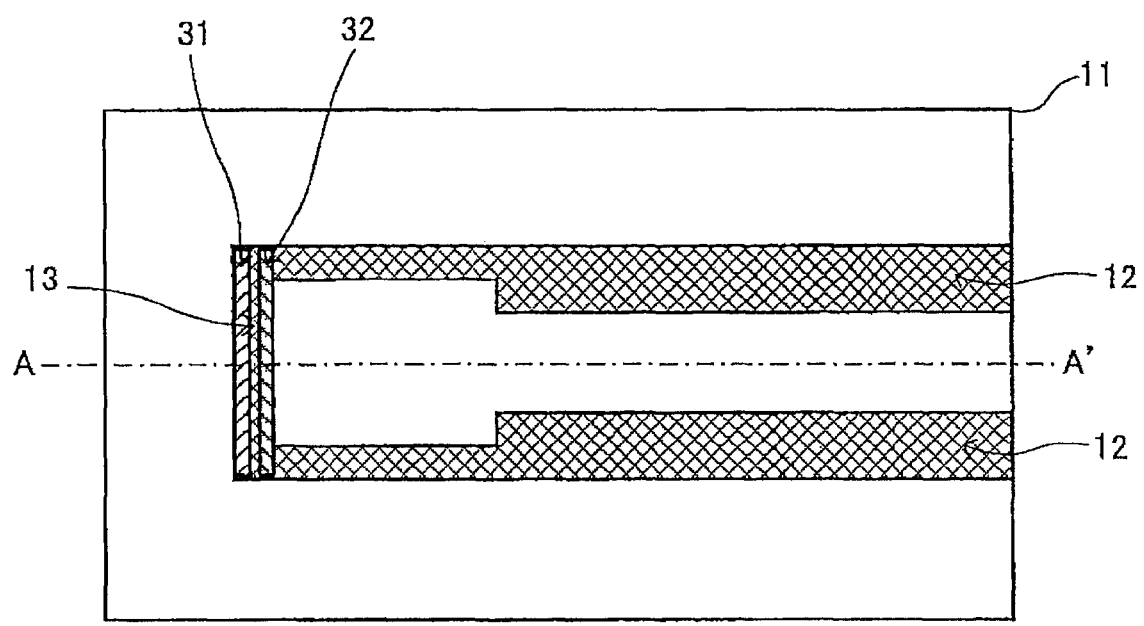
FIGS. 23A and 23B are diagrams illustrating another layered structure of an electric element according to an embodiment.
Figure 23B:

Next, a description is given of a structure of an electric element according to an embodiment including two phase change materials having different phase transition temperatures. FIGS. 23A and 23B are diagrams illustrating another layered structure of an electric element according to an embodiment. FIG. 23A is a plan diagram and FIG. 23B is an A-A' sectional diagram of the electric element according to the embodiment. In FIGS. 23A and 23B, reference numerals identical to those illustrated in FIGS. 8A and 8B indicate the same components of the electric element according to the embodiment illustrated in FIGS. 8A and 8B. The electric element according to the embodiment illustrated in FIGS. 23A and 23B may be formed by arranging a pair of leads 12 formed of a conductive material such as Si, Pt, NiCr, SiC and C and configured to supply power to the electric element on the substrate 11 formed of an electric insulator material such as glass or ceramics, arranging a heat-generating portion 13 at an end of the pair of the leads 12, and layering phase change materials 31 and 32 having different phase transition temperatures on the heat-generating portion 13 via a space between the phase change materials 31 and 32. In the electric element having such a layered structure illustrated in FIGS. 23A and 23B, the heat-generating portion 13 and the phase change materials 31 and 32 are closely attached such that the conductivity of heat may be uniform, and the heat capacity may be small. Accordingly, the calibration of the electric element may be rapid, and highly accurate temperature detection may be achieved. Note that if the phase change materials 31 and 32 are formed of a conductive material, the electric insulator layer 18 (not illustrated in FIGS. 23A and 23B) is formed over the substrate 11 and the phase change materials 31 and 32 are formed in a region of the electric insulator layer 18 corresponding to the heat-generating portion 13. Further, the substrate 11 made of Si may facilitate the integration of peripheral circuits. For example, if the substrate 11 is formed of a Si substrate having a bulk silicon structure, $SiO_2$ may be formed on a surface of the Si substrate 11 by thermally oxidizing the Si substrate 11 or an electric insulator layer formed of a single layer or multiple layers of $SiO_2$, $Si_3N_4$ and $Al_2O_3$ may be formed on the Si substrate 11 by CVD or sputtering, so as not to allow the phase change materials 31 and 32 or the heat-generating portion 13 to be conductive with the substrate 11. Next, a material of the heat-generating portion 13 such as Si, Pt or NiCr is layered on the electric insulator layer by CVD or sputtering and a pattern of the heat-generating portion 13 is formed by photoetching. Further, the phase change materials 31 and 32 are formed by CVD or sputtering, and patterns of the phase change materials 31 and 32 are formed by photolithography. Note that since a CMOS element structure includes the Si substrate 11, the electric insulator layer or Si formed on the electric insulator layer, peripheral circuits may be integrated in the same chip. Moreover, if the Si substrate having SOI (Si-on-insulator) structure is utilized, a box layer is utilized as the electric insulator layer and the SOI layer is patterned by photoetching to form the heat-generating portion 13. Next, after the electric insulator layer is formed on the surface of the substrate 11, the phase change materials 31 and 32 are formed by CVD, sputtering or a sol-gel process and patterns of the phase change materials 31 and 32 are formed by photolithography. Note that since the box layer or SOI layer is utilized as a CMOS element structure, peripheral circuits may be integrated in the same chip.

Figure 24A:
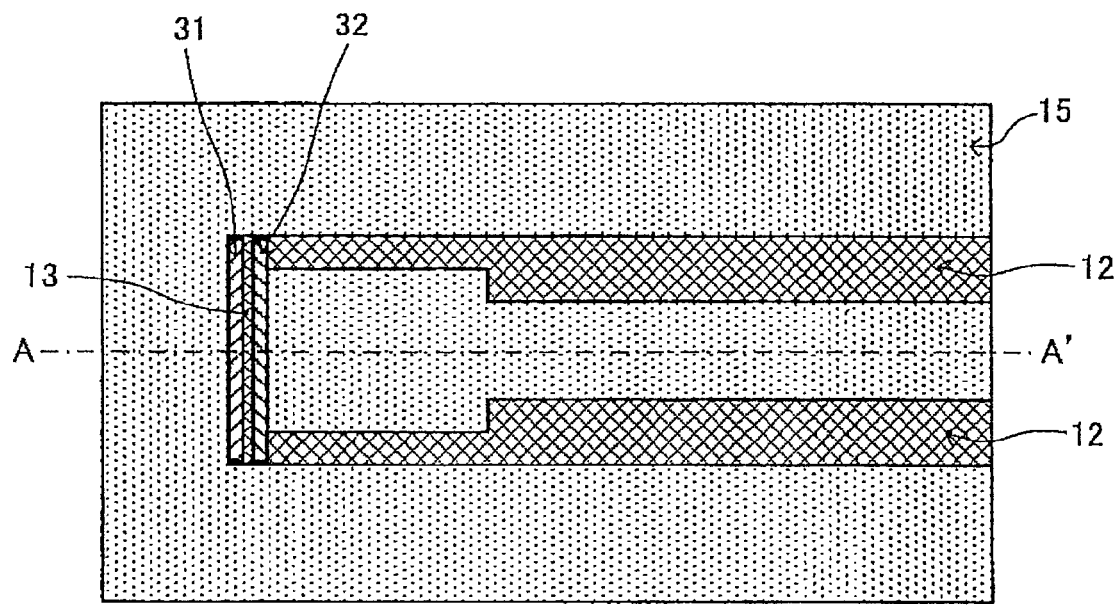
FIGS. 24A and 24B are diagrams illustrating another layered structure of an electric element according to an embodiment.
Figure 24B:
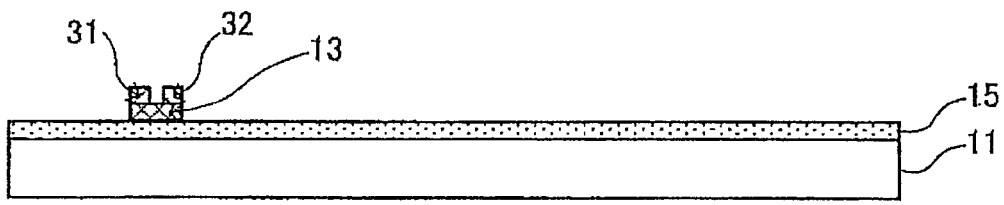

FIGS. 24A and 24B are diagrams illustrating another layered structure of an electric element according to an embodiment. In FIGS. 24A and 24B, reference numerals identical to those illustrated in FIGS. 9A and 9B indicate the same components of the electric element according to the embodiment illustrated in FIGS. 9A and 9B. FIG. 24A is a plan diagram and FIG. 24B is an A-A' sectional diagram of the electric element according to the embodiment. The substrate 11 illustrated in FIG. 24B is formed of a conductive material such as Al, Ni and Si. Since the substrate 11 formed of the conductive material has a risk of interfering with the leads 12 or the heat-generating portion 13, an electric insulator layer 15 is formed on a surface of the substrate 11 such that the leads 12 or the heat-generating portion 13 are formed on the substrate 11 via the electric insulator layer 15 in the electric element illustrated in FIGS. 24A and 24B. Note that if a phase transition temperature of the electric insulator layer 15 is lower than the respective phase transition temperatures of the phase change materials 31 and 32, the electric insulator layer 15 may exhibit phase transition. Accordingly, it is preferable that the electric insulator layer 15 be formed of a material having a phase transition temperature higher than those of the phase change materials 31 and 32. For example, the electric insulator layer 15 may preferably be formed of a heat-resistant material formed of $SiO_2$, $Si_3N_4$ or $Al_2O_3$. A method for manufacturing the electric element includes layering the electric insulator layer 15 on the substrate 11, layering a thin film of a conductive electric resistance material by CVD or sputtering over the electric insulator layer 15, and patterning the conductive electric resistance material as the leads 12 and the heat-generating portion 13 by photoetching that is a semiconductor microfabrication technology. Then, if the phase change materials 31 and 32 are formed of non-conductive materials that will not electrically affect the heat-generating portion 13, the phase change materials 31 and 32 are further layered (formed) on the heat-generating portion 13.

Figures 25A, 25B:
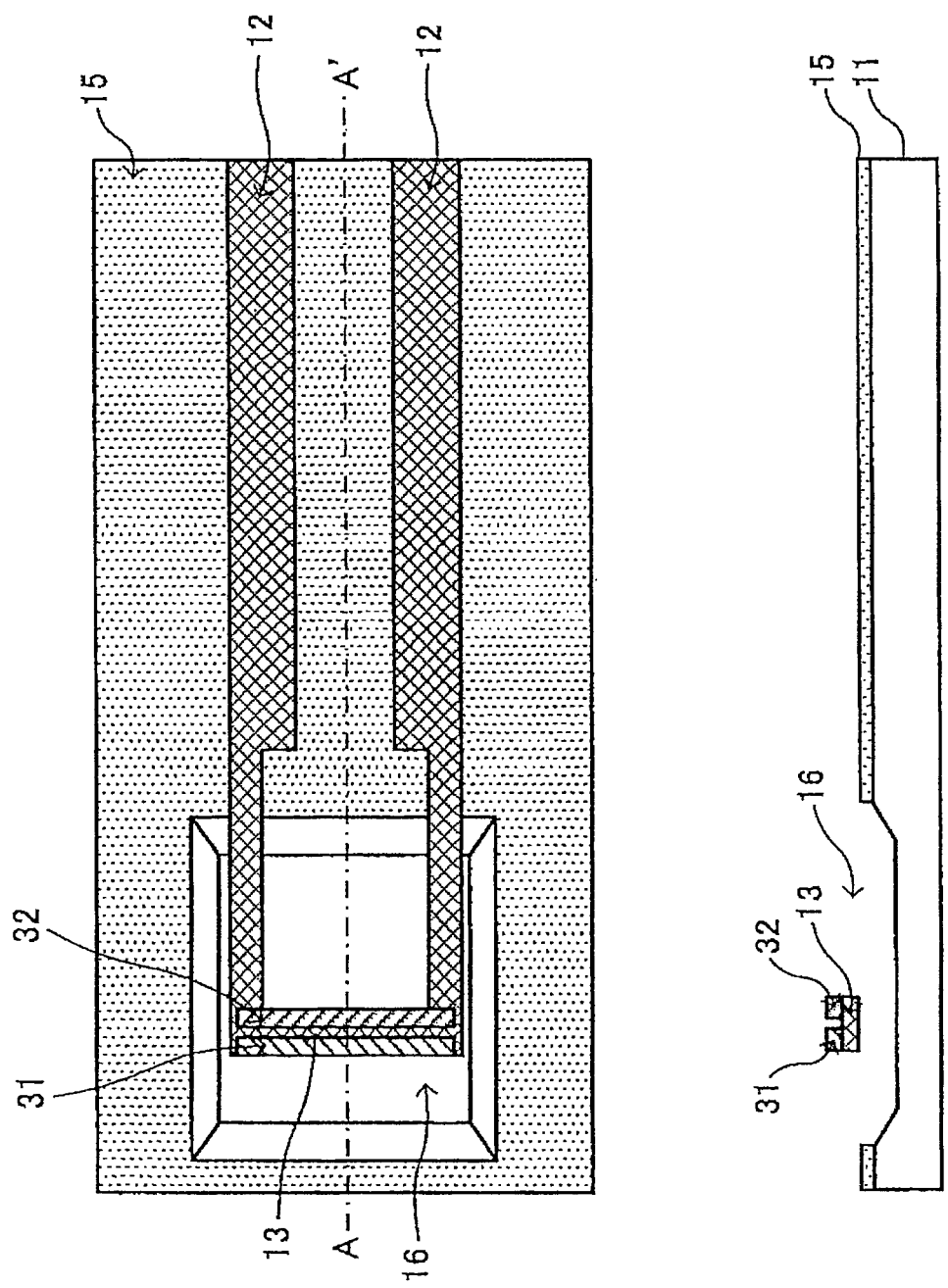
FIGS. 25A and 25B are diagrams illustrating another layered structure of an electric element according to an embodiment.

FIGS. 25A and 25B are diagrams illustrating another layered structure of an electric element according to an embodiment. In FIGS. 25A and 25B, reference numerals identical to those illustrated in FIGS. 24A and 24B indicate the same components of the electric element according to the embodiment illustrated in FIGS. 24A and 24B. FIG. 25A is a plan diagram and FIG. 25B is an A-A' sectional diagram of the electric element according to the embodiment. The electric element illustrated in FIGS. 25A and 25B differs from the electric element illustrated in FIGS. 24A and 24B in that the electric element illustrated in FIGS. 25A and 25B further includes a hollow 16 in a region of the substrate 11 excluding a region where the heat-generating portion 13 and the phase change materials 31 and 32 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since small amounts of the phase change materials 31 and 32 are closely arranged on the heat-generating portion 13, the temperatures of the phase change materials 31 and 32 may become similar to that of the heat-generating portion 13 and hence, the temperature distribution may become uniform. Accordingly, the temperatures of the phase change materials 31 and 32 and the heat-generating portion 13 may be rapidly controlled, which facilitates rapid completion of highly accurate temperature calibration of the electric element. A method for manufacturing the electric element in a case where the substrate 11 is formed of the conductive material includes layering the electric insulator layer 15 on the substrate 11, layering a thin film of a conductive electric resistance material by depositing or sputtering over the electric insulator layer 15, and patterning the conductive electric resistance material as the leads 12 and the heat-generating portion 13 by photoetching that is a semiconductor microfabrication technology. The method for manufacturing the electric element further includes patterning the phase change materials 31 and 32 on the heat-generating portion 13 via the electric insulator layer 15, if the phase change materials 31 and 32 are formed of the conductive material. In a case where the electric element has a structure having the hollow 16 in the substrate 11, the method for manufacturing the electric element further includes removing a region of the substrate 11 that faces a peripheral region of the heat-generating portion 13 and the phase change materials 31 and 32 by etching. The formation of the hollow 16 in the substrate 11 may reduce an adverse effect of the substrate 11 having a large heat capacity on the heat-generating portion 13 and the phase change materials 31 and 32, and may also reduce the heat capacities of the heat-generating portion 13 and the phase change materials 31 and 32. Accordingly, the temperature of the electric element may be rapidly adjusted to a predetermined temperature.

Figure 26A:
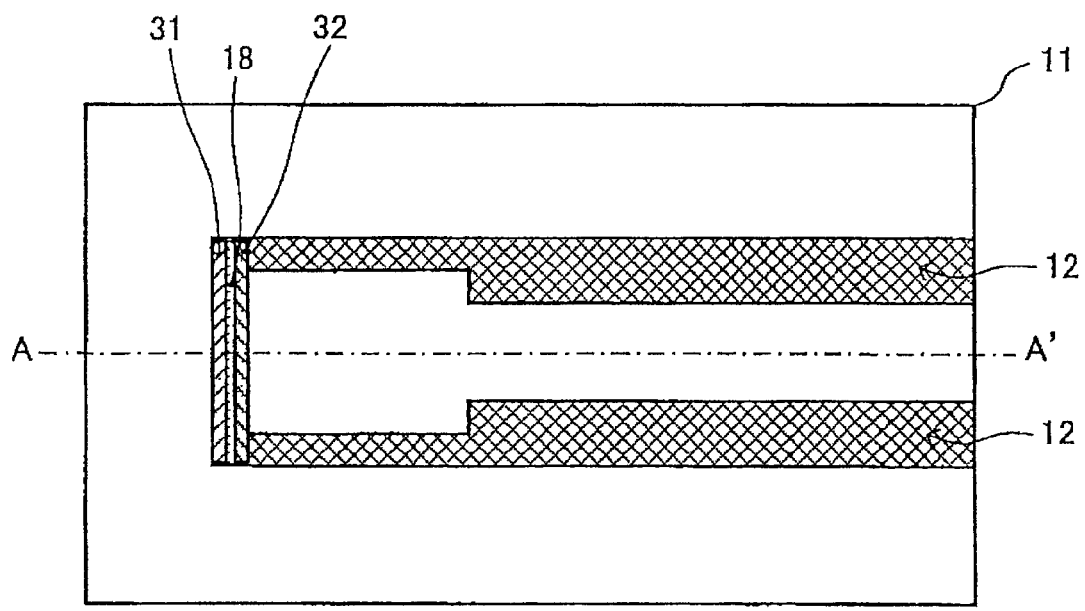
FIGS. 26A and 26B are diagrams illustrating another layered structure of an electric element according to an embodiment.
Figure 26B:
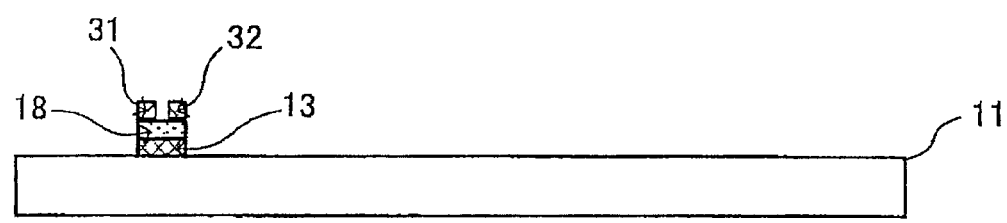
Figure 27:
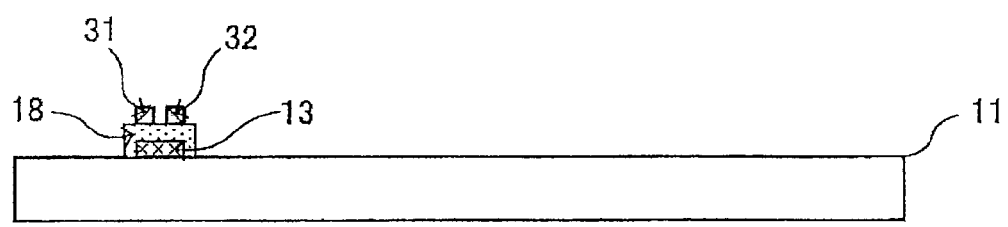
FIG. 27 is a sectional diagram illustrating another layered structure of an electric element according to an embodiment.

FIGS. 26A and 26B are diagrams illustrating another layered structure of an electric element according to an embodiment. In FIGS. 26A and 26B, reference numerals identical to those illustrated in FIGS. 25A and 25B indicate the same components of the electric element according to the embodiment illustrated in FIGS. 25A and 25B. FIG. 26A is a plan diagram and FIG. 26B is an A-A' sectional diagram of the electric element according to the embodiment. The electric element illustrated in FIGS. 26A and 26B differs from the electric element illustrated in FIGS. 25A and 25B in that the phase change materials 31 and 32 of the electric element illustrated in FIGS. 26A and 26B are formed of conductive materials and the phase change materials 31 and 32 are layered on the heat-generating portion 13 via the electric insulator layer 18 for being electrically insulated from the heat-generating portion 13. Note that if the heat-generating portion 13 is formed of a material a surface of which is oxidized by ambient atmosphere or is corroded when heated, an entire surface of the heat-generating portion 13 may be coated with the electric insulator layer 18 formed of a heat-resistant oxide and nitride as a passivation film in order to increase durability of the heat-generating portion 13 as illustrated in FIG. 27.

Figure 28A:
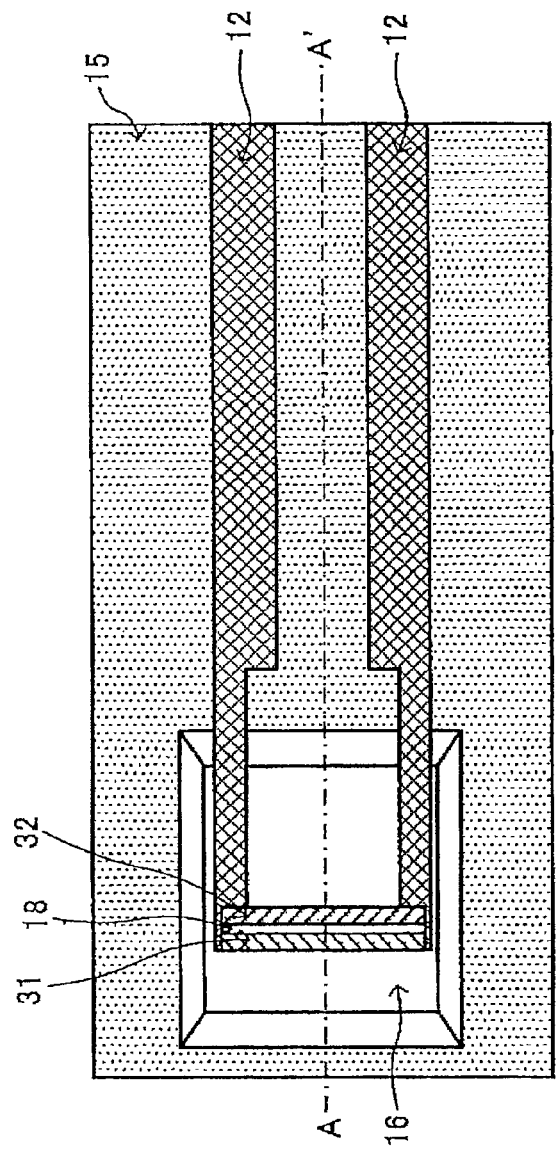
FIGS. 28A and 28B are diagrams illustrating another layered structure of an electric element according to an embodiment.
Figure 28B:
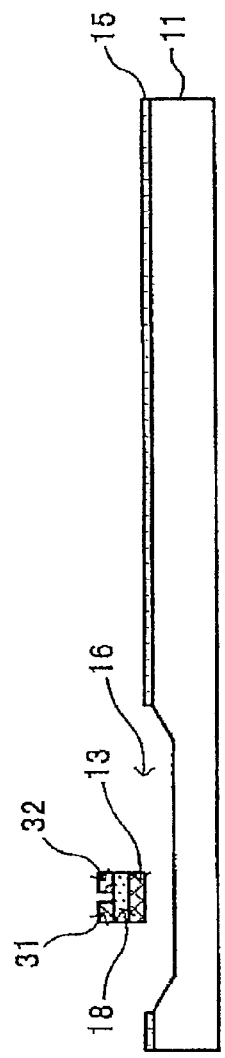
Figure 29:
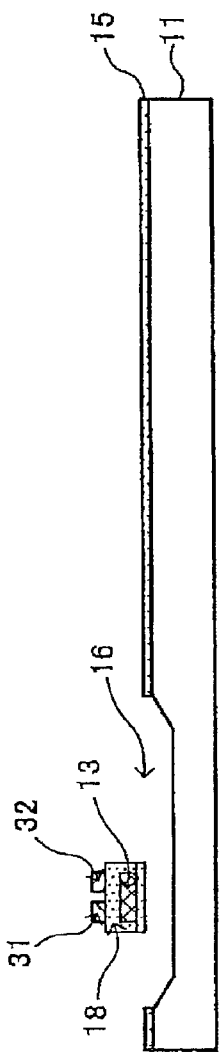
FIG. 29 is a sectional diagram illustrating another layered structure of an electric element according to an embodiment.
Figure 30A:
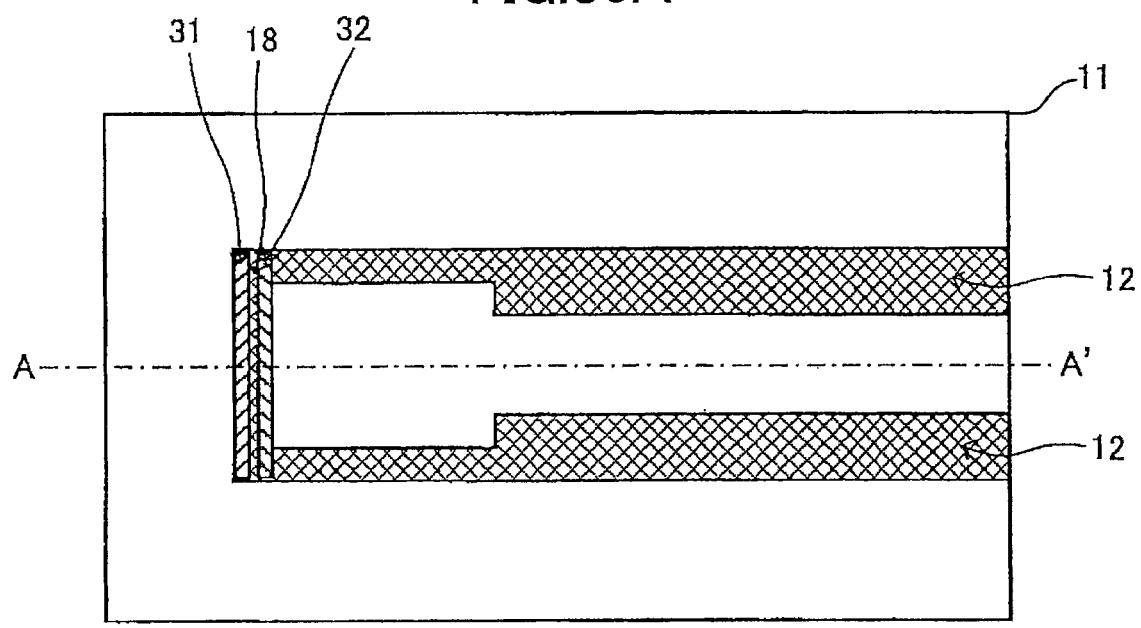
FIGS. 30A and 30B are diagrams illustrating another layered structure of an electric element according to an embodiment.
Figure 30B:
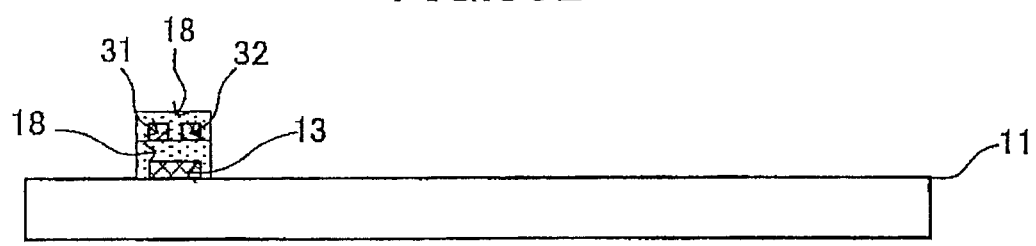

FIGS. 28A and 28B are diagrams illustrating another layered structure of an electric element according to an embodiment. In FIGS. 28A and 28B, reference numerals identical to those illustrated in FIGS. 26A and 26B indicate the same components of the electric element according to the embodiment illustrated in FIGS. 26A and 26B. FIG. 28A is a plan diagram and FIG. 28B is an A-A' sectional diagram of the electric element according to the embodiment. The electric element illustrated in FIGS. 28A and 28B differs from the electric element illustrated in FIGS. 26A and 26B in that the electric element illustrated in FIGS. 28A and 28B further includes a hollow 16 in a region of the substrate 11 excluding a region where the heat-generating portion 13 and the phase change materials 31 and 32 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since small amounts of the phase change materials 31 and 32 are closely arranged on the heat-generating portion 13, the temperatures of the phase change materials 31 and 32 may become similar to that of the heat-generating portion 13 and hence, the temperature distribution may become uniform. Accordingly, the temperatures of the phase change materials 31 and 32 and the heat-generating portion 13 may be rapidly controlled, which facilitates rapid completion of highly accurate temperature calibration of the electric element. Note that if the heat-generating portion 13 is formed of a material a surface of which is oxidized by ambient atmosphere or is corroded when heated, an entire surface of the heat-generating portion 13 may be coated with the electric insulator layer 18 formed of a heat-resistant oxide and nitride as a passivation film in order to increase durability of the heat-generating portion 13 as illustrated in FIG. 29. FIGS. 30A and 30B are diagrams illustrating another layered structure of an electric element according to an embodiment. In FIGS. 30A and 30B, reference numerals identical to those illustrated in FIGS. 26A and 26B indicate the same components of the electric element according to the embodiment illustrated in FIGS. 26A and 26B. FIG. 30A is a plan diagram and FIG. 30B is an A-A' sectional diagram of the electric element according to the embodiment. Note that the electric insulator layer(s) 18 illustrated in FIG. 30B is omitted from FIG. 30A. As illustrated in FIG. 30B, an entire surface of the heat-generating portion 13 and entire surfaces of the phase change materials 31 and 32 are coated with the electric insulator layer 18 serving as a passivation film.

Figures 31A, 31B:
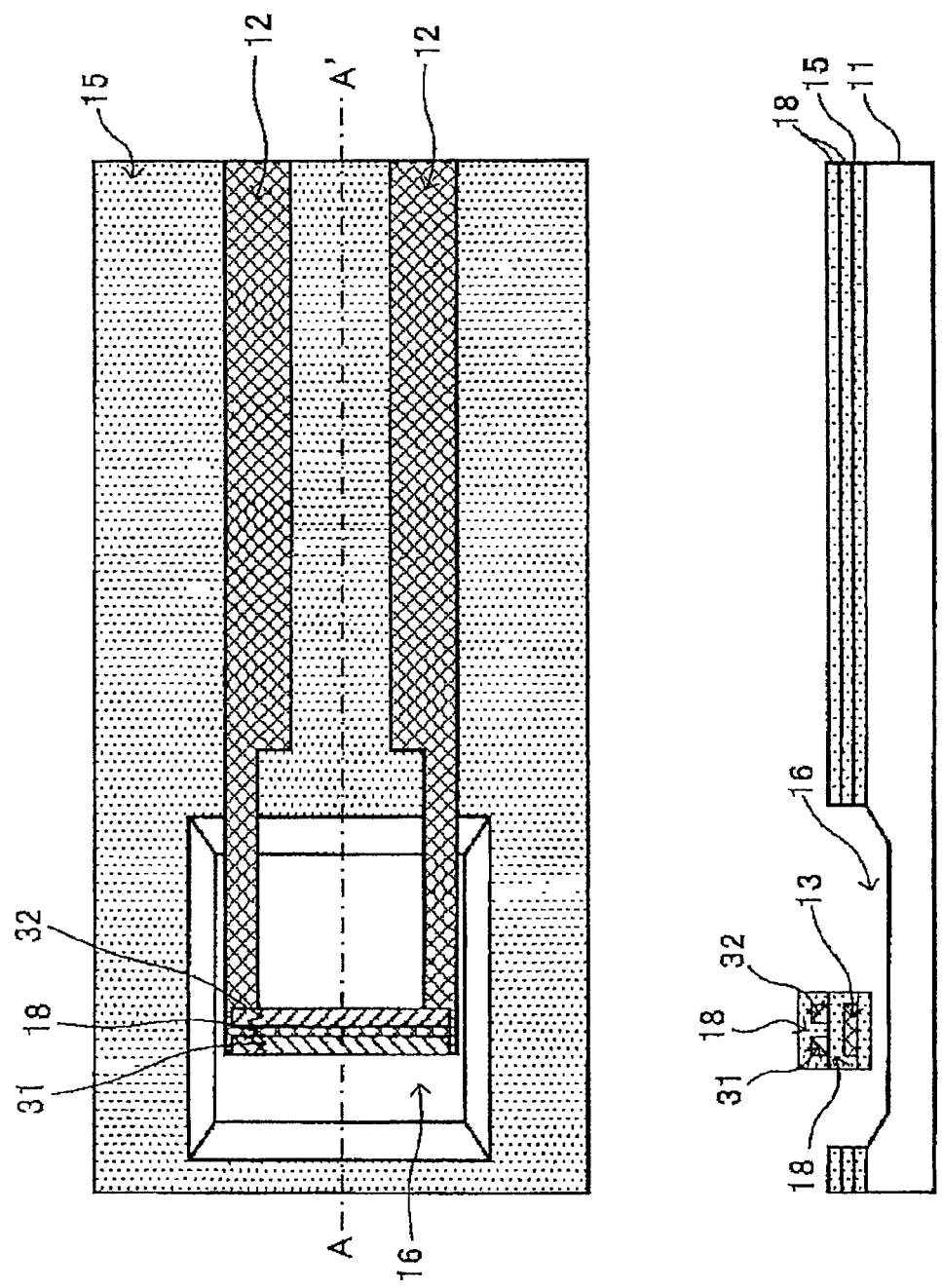
FIGS. 31A and 31B are diagrams illustrating another layered structure of an electric element according to an embodiment.

FIGS. 31A and 31B are diagrams illustrating another layered structure of an electric element according to an embodiment. In FIGS. 31A and 31B, reference numerals identical to those illustrated in FIGS. 30A and 30B indicate the same components of the electric element according to the embodiment illustrated in FIGS. 30A and 30B. FIG. 31A is a plan diagram and FIG. 31B is an A-A' sectional diagram of the electric element according to the embodiment. Note that the electric insulator layer(s) 18 illustrated in FIG. 31B is omitted from FIG. 31A. The electric element illustrated in FIGS. 31A and 31B differs from the electric element illustrated in FIGS. 30A and 30B in that the electric element illustrated in FIGS. 31A and 31B further includes a hollow 16 in a region of the substrate 11 excluding a region where the heat-generating portion 13 and the phase change materials 31 and 32 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since small amounts of the phase change materials 31 and 32 are closely arranged on the heat-generating portion 13, the temperatures of the phase change materials 31 and 32 may become similar to that of the heat-generating portion 13 and hence, the temperature distribution may become uniform. Accordingly, the temperatures of the phase change materials 31 and 32 and the heat-generating portion 13 may be rapidly controlled, which facilitates rapid completion of highly accurate temperature calibration of the electric element.

FIGS. 32A and 32B are diagrams illustrating another layered structure of an electric element according to an embodiment. In FIGS. 32A and 32B, reference numerals identical to those illustrated in FIGS. 30A and 30B indicate the same components of the electric element according to the embodiment illustrated in FIGS. 30A and 30B. FIG. 32A is a plan diagram and FIG. 32B is a B-B' sectional diagram of the electric element according to the embodiment. Note that the electric insulator layers 18 illustrated in FIG. 32B are omitted from FIG. 32A. The electric element illustrated in FIGS. 32A and 32B differs from the electric element illustrated in FIGS. 30A and 30B in that the electric element illustrated in FIGS. 32A and 32B further includes two pairs of the detecting leads 17 connected to the respective phase change materials 31 and 32. The detecting leads 17 are made of Al or Au, or formed of the same material as that of the heat-generating portion 13. Note that Al or Au may be formed in the same process of forming a wiring material for peripheral circuits. The phase change materials 31 and 32 are formed of conductive materials and are layered on the heat-generating portion 13 via the electric insulator layer 18 for being electrically insulated from the heat-generating portion 13. Accordingly, the detecting leads 17 may be capable of individually detecting statuses of the phase change materials 31 and 32 that are electrically separated from the heat-generating portion 13. With this configuration, respective phase transition temperatures of the phase change materials 31 and 32 may be accurately detected. Further, although the phase change materials 31 and 32 are formed of conductive materials, the power to be supplied to the heat-generating portion 13 may be simply controlled without affecting the electric properties of the heat-generating portion 13. Further, even if the detecting leads 17 made of Al or Au and the peripheral circuits are integrated on the substrate 11, the detecting leads 17 made of Al or Au are formed of the same material as that of wiring patterns of the peripheral circuits. Thus, the manufacturing process may not be complicated.

FIGS. 33A and 33B are diagrams illustrating another layered structure of an electric element according to an embodiment. In FIGS. 33A and 33B, reference numerals identical to those illustrated in FIGS. 32A and 32B indicate the same components of the electric element according to the embodiment illustrated in FIGS. 32A and 32B. FIG. 33A is a plan diagram and FIG. 33B is a B-B' sectional diagram of the electric element according to the embodiment. Note that the electric insulator layer 18 illustrated in FIG. 33B is omitted from FIG. 33A. The electric element illustrated in FIGS. 33A and 33B differs from the electric element illustrated in FIGS. 32A and 32B in that the electric element illustrated in FIGS. 33A and 33B further includes a hollow 16 in a region of the substrate 11 excluding a region where the heat-generating portion 13 and the phase change materials 31 and 32 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since small amounts of the phase change materials 31 and 32 are closely arranged on the heat-generating portion 13, the temperatures of the phase change materials 31 and 32 may become similar to that of the heat-generating portion 13 and hence, the temperature distribution may become uniform. Accordingly, the temperatures of the phase change materials 31 and 32 and the heat-generating portion 13 may be rapidly controlled, which facilitates rapid completion of highly accurate temperature calibration of the electric element.

FIGS. 34A and 34B are diagrams illustrating another layered structure of an electric element according to an embodiment. In FIGS. 34A and 33B, reference numerals identical to those illustrated in FIGS. 32A and 32B indicate the same components of the electric element according to the embodiment illustrated in FIGS. 32A and 32B. FIG. 34A is a plan diagram and FIG. 34B is a B-B' sectional diagram of the electric element according to the embodiment. Note that the electric insulator layer 18 illustrated in FIG. 34B is omitted from FIG. 34A. The electric element illustrated in FIGS. 34A and 34B differs from the electric element illustrated in FIGS. 32A and 32B in that the two pairs of detecting leads 17 are formed of the same conductive materials as those of the phase change materials 31 and 32 and the two pairs of detecting leads 17 are connected to the respective phase change materials 31 and 32. The respective pairs of the detecting leads 17 may be made of In, Sn or Zn and Al or Au. Further, even if the detecting leads 17 made of In, Sn or Zn and Al or Au and the peripheral circuits are integrated on the substrate 11, the detecting leads 17 made of Al or Au are formed of the same material as that of wiring patterns of the peripheral circuits. Thus, the manufacturing process may not be complicated.

Figures 35A, 35B:
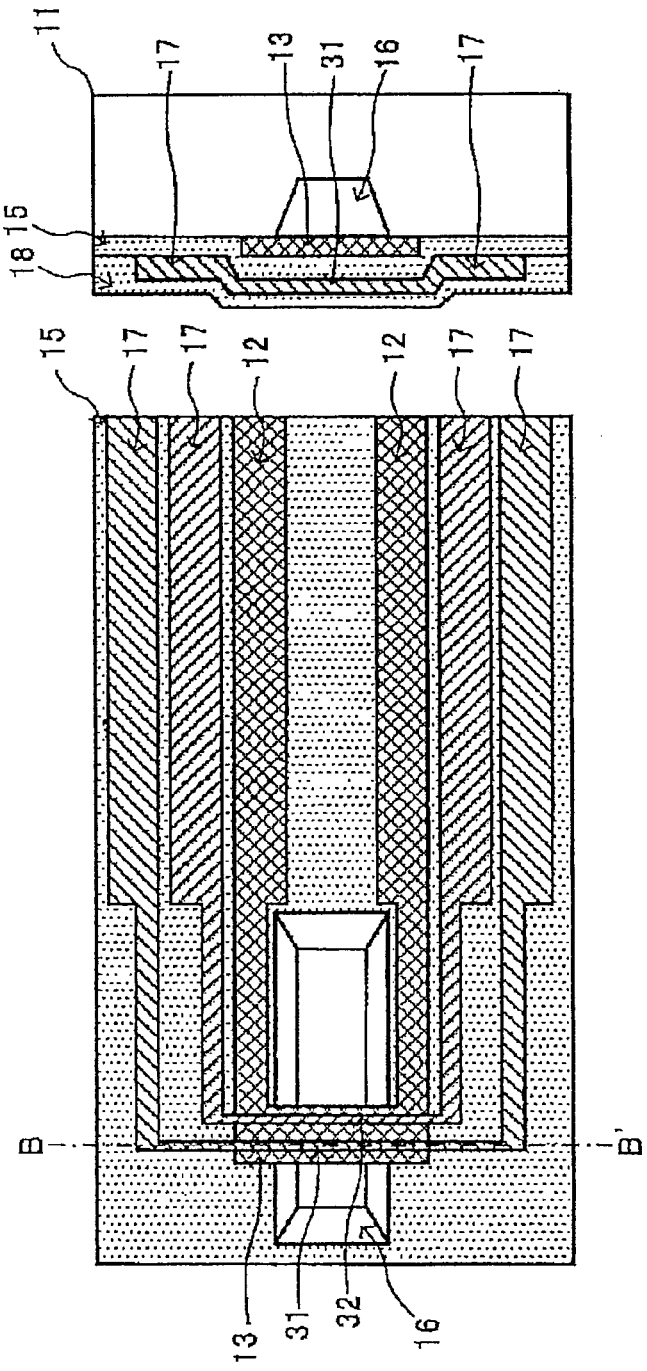
FIGS. 35A and 35B are diagrams illustrating another layered structure of an electric element according to an embodiment.

FIGS. 35A and 35B are diagrams illustrating another layered structure of an electric element according to an embodiment. In FIGS. 35A and 35B, reference numerals identical to those illustrated in FIGS. 34A and 34B indicate the same components of the electric element according to the embodiment illustrated in FIGS. 34A and 34B. FIG. 35A is a plan diagram and FIG. 35B is a B-B' sectional diagram of the electric element according to the embodiment. Note that the electric insulator layer 18 illustrated in FIG. 35B is omitted from FIG. 35A. The electric element illustrated in FIGS. 35A and 35B differs from the electric element illustrated in FIGS. 34A and 34B in that the electric element illustrated in FIGS. 35A and 35B further includes a hollow 16 in a region of the substrate 11 excluding a region where the heat-generating portion 13 and the phase change materials 31 and 32 are formed, the two pairs of detecting leads 17 are formed of the same conductive materials as those of the phase change materials 31 and 32 in a similar manner as the electric element illustrated in FIGS. 13A and 13B or FIGS. 16A and 16B, and the two pairs of detecting leads 17 are connected to the respective phase change materials 31 and 32. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since small amounts of the phase change materials 31 and 32 are closely arranged on the heat-generating portion 13, the temperatures of the phase change materials 31 and 32 may become similar to that of the heat-generating portion 13 and hence, the temperature distribution may become uniform. Accordingly, the temperatures of the phase change materials 31 and 32 and the heat-generating portion 13 may be rapidly controlled, which facilitates rapid completion of highly accurate temperature calibration of the electric element.

Figure 36A:
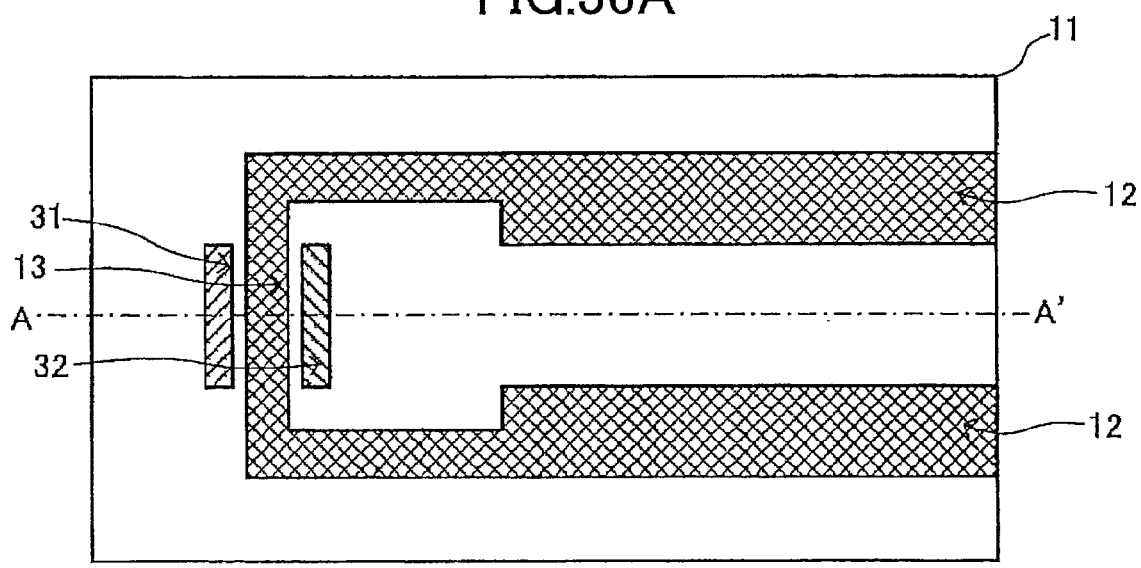
FIGS. 36A and 36B are diagrams illustrating another parallel structure of an electric element according to an embodiment.
Figure 36B:
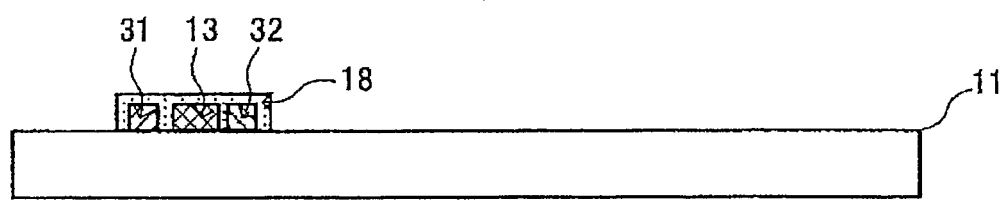

FIGS. 36A and 36B are diagrams illustrating another parallel structure of an electric element according to an embodiment. FIG. 36A is a plan diagram and FIG. 36B is an A-A' sectional diagram of the electric element according to the embodiment. In FIGS. 36A and 36B, reference numerals identical to those illustrated in FIGS. 23A and 23B indicate the same components of the electric element according to the embodiment illustrated in FIGS. 23A and 23B. Note that the electric insulator layer 18 illustrated in FIG. 36B is omitted from FIG. 36A. In the electric element having a parallel arrangement structure illustrated in FIGS. 36A and 36B includes the phase change materials 31 and 32 arranged in parallel with the heat-generating portion 13. In the electric element having illustrated in FIGS. 36A and 36B, the heat-generating portion 13 and the phase change materials 31 and 32 are closely attached such that the conductivity of heat may be uniform, and the heat capacity may be small. Accordingly, the calibration of the electric element may be rapid, and highly accurate temperature detection may be achieved. If patterns of the leads 12 and the heat-generating portion 13 are formed by photoetching that is a semiconductor microfabrication technology, the layered structure having an uneven level may adversely affect dimensions processing accuracy. Thus, the heat-generating portion 13 is arranged in parallel with the phase change materials 31 and 32 on the same plane such that the uneven level of the patterns may be reduced and variability in dimensions accuracy may also be reduced. Further, since respective spaces are provided between the heat-generating portion 13 and the phase change materials 31 and 32, the heat-generating portion 13 is electrically insulated from the phase change materials 31 and 32. Accordingly, even if the phase change materials 31 and 32 are formed of a conductive materials, the phase change materials 31 and 32 formed of the conductive material will not affect the heat-generating portion 13.

Figure 37A:
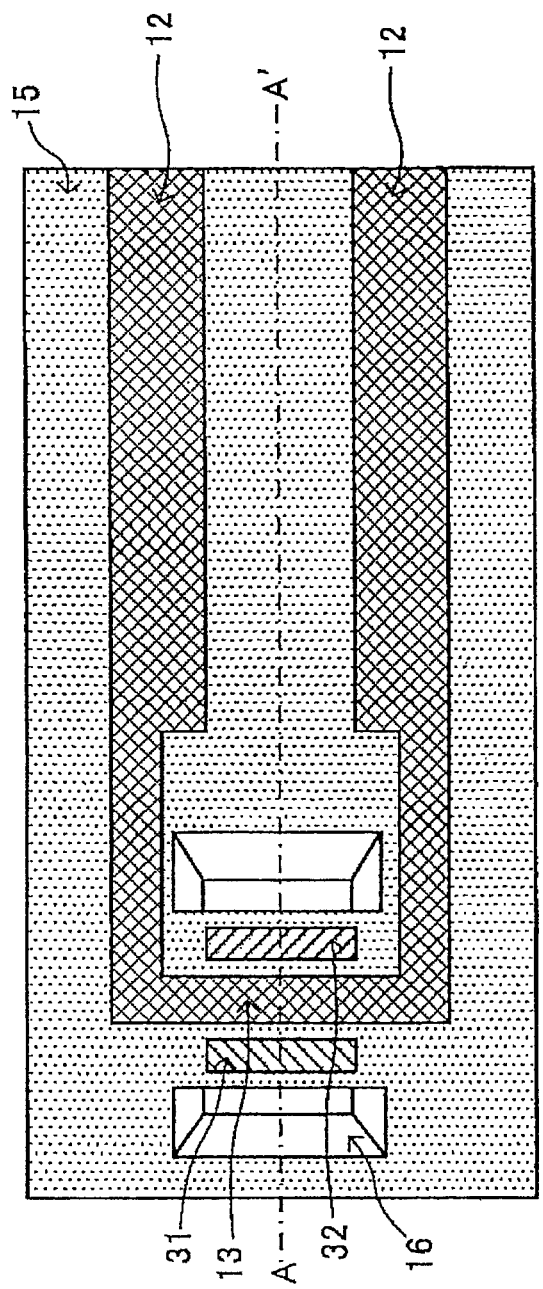
FIGS. 37A and 37B are diagrams illustrating another parallel structure of an electric element according to an embodiment.
Figure 37B:

FIGS. 37A and 37B are diagrams illustrating another parallel structure of an electric element according to an embodiment. In FIGS. 37A and 37B, reference numerals identical to those illustrated in FIGS. 36A and 36B indicate the same components of the electric element according to the embodiment illustrated in FIGS. 36A and 36B. FIG. 37A is a plan diagram and FIG. 37B is an A-A' sectional diagram of the electric element according to the embodiment. Note that the electric insulator layer 18 illustrated in FIG. 37B is omitted from FIG. 37A. The electric element illustrated in FIGS. 37A and 37B differs from the electric element illustrated in FIGS. 30A and 30B in that the electric element illustrated in FIGS. 36A and 36B further includes a hollow 16 in a region of the substrate 11 excluding a region where the heat-generating portion 13 and the phase change materials 31 and 32 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since small amounts of the phase change materials 31 and 32 are closely arranged on the heat-generating portion 13, the temperatures of the phase change materials 31 and 32 may become similar to that of the heat-generating portion 13 and hence, the temperature distribution may become uniform. Accordingly, the temperatures of the phase change materials 31 and 32 and the heat-generating portion 13 may be rapidly controlled, which facilitates rapid completion of highly accurate temperature calibration of the electric element.

Figure 39A:
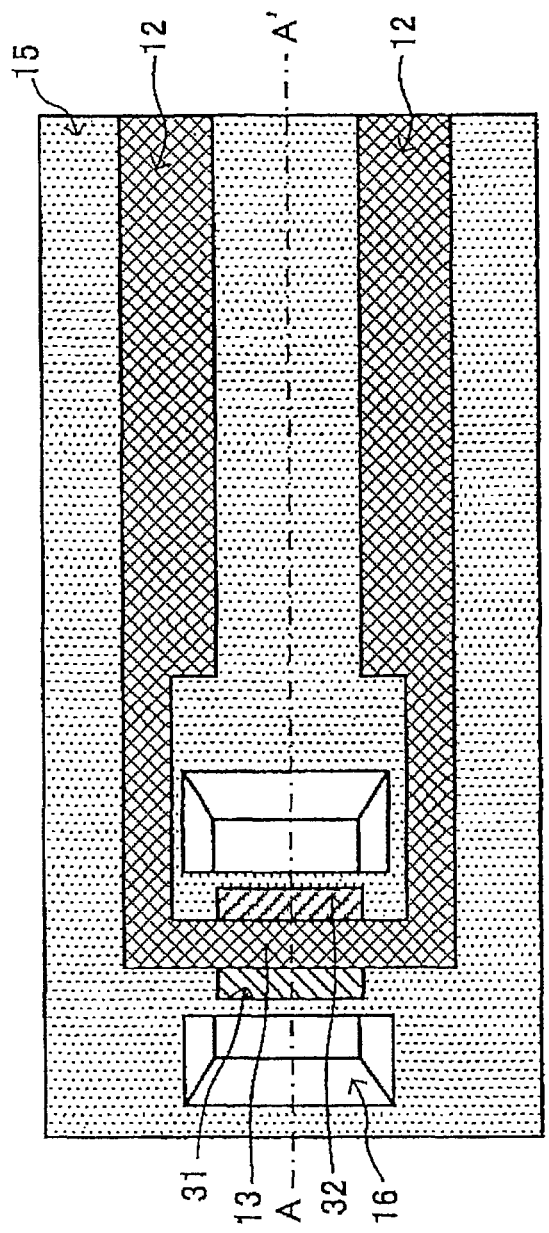
FIGS. 39A and 39B are diagrams illustrating another parallel structure of an electric element according to an embodiment.
Figure 39B:
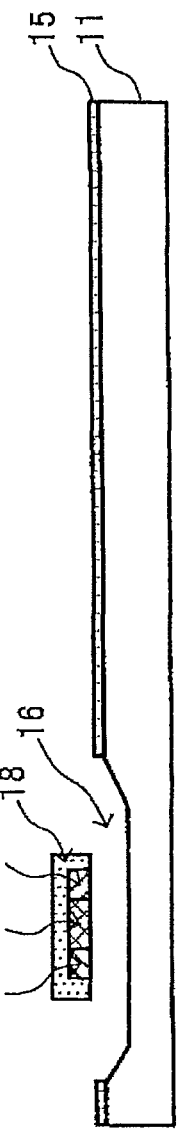

FIGS. 38A and 38B are diagrams illustrating a parallel structure of an electric element according to an embodiment. FIG. 38A is a plan diagram and FIG. 38B is an A-A' sectional diagram of the electric element according to the embodiment. In FIGS. 38A and 38B, reference numerals identical to those illustrated in FIGS. 36A and 36B indicate the same components of the electric element according to the embodiment illustrated in FIGS. 36A and 36B. Note that the electric insulator layer 18 illustrated in FIG. 38B is omitted from FIG. 38A. In the electric element having a parallel arrangement structure illustrated in FIGS. 38A and 38B includes the phase change materials 31 and 32 formed of electric insulator materials that are attached to the heat-generating portion 13 and are arranged in parallel with the heat-generating portion 13. With this configuration, the heat-generating portion 13 and the phase change materials 31 and 32 may acquire high heat conductivities, and heat capacities of the electric element including that of the heat-generating portion 13 may become small. Further, predetermined temperatures may be rapidly detected to shorten the temperature detecting time, and the temperature distribution may become uniform. Accordingly, highly accurate calibration may be achieved, FIGS. 39A and 39B are diagrams illustrating another parallel structure of an electric element according to an embodiment. In FIGS. 39A and 39B, reference numerals identical to those illustrated in FIGS. 38A and 38B indicate the same components of the electric element according to the embodiment illustrated in FIGS. 38A and 38B. FIG. 39A is a plan diagram and FIG. 39B is an A-A' sectional diagram of the electric element according to the embodiment. The electric element illustrated in FIGS. 39A and 39B differs from the electric element illustrated in FIGS. 38A and 38B in that the electric element illustrated in FIGS. 39A and 39B further includes a hollow 16 in a region of the substrate 11 excluding a region where the heat-generating portion 13 and the phase change materials 31 and 32 are formed. The hollow 16 is formed by etching the region of the substrate 11 utilizing the electric insulator layer 15 as a mask. The electric element having the above structure may provide high heat insulation and lower the heat capacity for the heat-generating portion 13 due to a space (i.e., hollow 16) having a low heat capacity provided between the heat-generating portion 13 and the substrate 11. Further, since small amounts of the phase change materials 31 and 32 are closely arranged on the heat-generating portion 13, the temperatures of the phase change materials 31 and 32 may become similar to that of the heat-generating portion 13 and hence, the temperature distribution may become uniform. Accordingly, the temperatures of the phase change materials 31 and 32 and the heat-generating portion 13 may be rapidly controlled, which facilitates rapid completion of highly accurate temperature calibration of the electric element.

Figure 40:
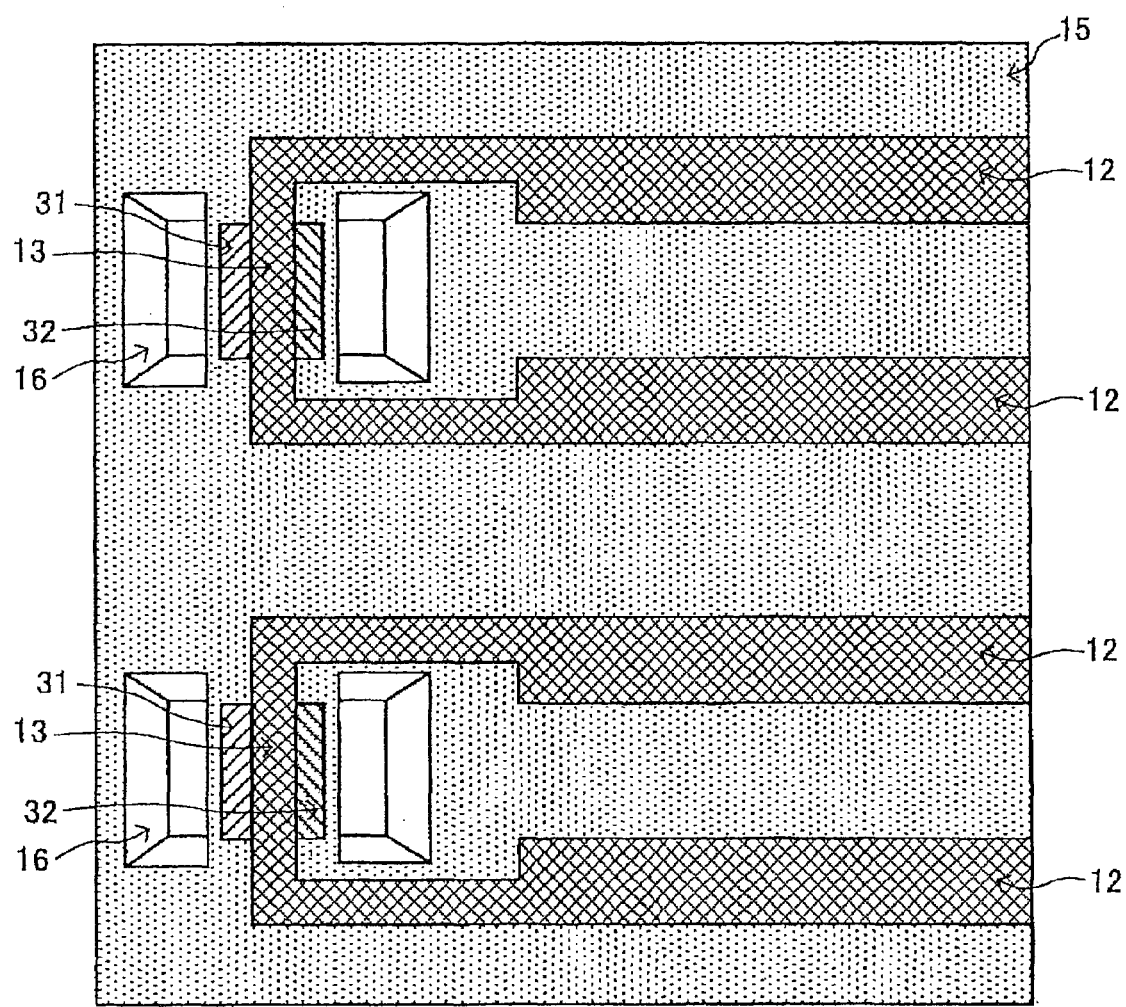
FIG. 40 is a plan diagram illustrating another parallel structure of an electric element according to an embodiment.

FIG. 40 is a diagram illustrating another layered structure of an electric element according to an embodiment. The electric element illustrated in FIG. 40 differs from the electric element illustrated in FIGS. 39A and 39B in that the electric element illustrated in FIG. 40 includes two or more parallel arrangement units composed of the heat-generating portion 13 and the phase change materials 31 and 32 formed on the substrate 11, and a hollow 16 in a region where the heat-generating portion 13 and the phase change materials 31 and 32. With this configuration, after a warranty period of the electric element implemented by calibration of a first parallel arrangement unit is expired, a warranty period of the electric element may be implemented by calibration of a second parallel arrangement unit. Thus, a longer warranty period of the electric element may be achieved. Further, the electric element further includes a bridge circuit as a temperature compensation detector in order to reduce a temperature fluctuation effect during calibration.

FIGS. 41A and 41B are diagrams illustrating another layered structure of an electric element according to an embodiment. FIG. 41A is a plan diagram and FIG. 41B is a B-B' sectional diagram of the electric element according to the embodiment. In FIGS. 41A and 41B, reference numerals identical to those illustrated in FIGS. 17A and 17B indicate the same components of the electric element according to the embodiment illustrated in FIGS. 17A and 17B. Note that the electric insulator layer 18 illustrated in FIG. 41B is omitted from FIG. 41A. In the electric element according to the embodiment illustrated in FIGS. 41A and 41B, the electric insulator layer 15 partially includes opening regions corresponding to a region where the hollow 16 is formed in the substrate 11 such that air present in the hollow 16 may be in communication with ambient air via the opening regions formed in the electric insulator layer 15. Further, the heat-generating portion 13 having a meandering structure is layered on the electric insulator layer 15, the phase change materials 31 and 32 are layered in a meandering manner on the meandering structure of the heat-generating portion 13 via the electric insulator layer 18, and the electric insulator layer 18 is further formed over the layered phase change materials 31 and 32 as an outermost (uppermost) layer of the electric element having an integrated structure. Since the heat-generating portion 13 and the phase change materials 31 and 32 have the meandering structure, the heat-generating portion 13 and the phase change materials 31 and 32 may be locally arranged in high density. Accordingly, the temperature distribution may become uniform and hence, highly accurate calibration may be efficiently achieved.

FIGS. 42A and 42B are diagrams illustrating another layered structure of an electric element according to an embodiment. FIG. 42A is a plan diagram and FIG. 42B is a B-B' sectional diagram of the electric element according to the embodiment. In FIGS. 42A and 42B, reference numerals identical to those illustrated in FIGS. 41A and 41B indicate the same components of the electric element according to the embodiment illustrated in FIGS. 41A and 41B. In the electric element according to the embodiment illustrated in FIGS. 42A and 42B, the electric insulator layer 15 partially include opening regions corresponding to a region where the hollow 16 is formed in the substrate 11 such that air present in the hollow 16 may be in communication with ambient air via the opening regions formed in the electric insulator layer 15. Further, the heat-generating portion 13 having a meandering structure is arranged on the electric insulator layer 15 having the hollow 16. The phase change material 31 is then formed on the heat-generating portion 13 via the electric insulator layer 18, the phase change material 32 is formed on the phase change material 31 via the electric insulator layer 18, and the electric insulator layer 18 is further formed as an outermost (uppermost) layer of the electric element. Since the heat-generating portion 13 has the meandering structure, the heat-generating portion 13 and the phase change materials 31 and 32 may be locally arranged in high density. Accordingly, the temperature distribution may become uniform and hence, highly accurate calibration may be efficiently achieved.

FIGS. 43A and 43B are diagrams illustrating another parallel structure of an electric element according to an embodiment. FIG. 43A is a plan diagram and FIG. 43B is a B-B' sectional diagram of the electric element according to the embodiment. In FIGS. 43A and 43B, reference numerals identical to those illustrated in FIGS. 42A and 42B indicate the same components of the electric element according to the embodiment illustrated in FIGS. 42A and 42B. Note that the electric insulator layer 18 illustrated in FIG. 43B is omitted from FIG. 43A. In the electric element according to the embodiment illustrated in FIGS. 43A and 43B, the electric insulator layer 15 includes partially opening regions corresponding to a region where the hollow 16 is formed in the substrate 11 such that air present in the hollow 16 may be in communication with ambient air of the electric element via the opening regions formed in the electric insulator layer 15. Further, the heat-generating portion 13 having a meandering structure is arranged on the electric insulator layer 15, the phase change materials 31 and 32 are alternately arranged between meandering portions of the meandering structure of the heat-generating portion 13 such that the phase change materials 31 and 32 are arranged in parallel with the meandering portions of the meandering structure of the heat-generating portion 13, and the electric insulator layer 18 is formed as an outermost layer of the electric element having a integrated structure. Since the heat-generating portion 13 has the meandering structure, and the phase change materials 31 and 32 are alternately arranged between the meandering portions of the heat-generating portion 13 such that the phase change materials 31 and 32 are arranged in parallel with the meandering portions of the heat-generating portion 13, the heat-generating portion 13 and the phase change materials 31 and 32 may be locally arranged in high density. Accordingly, the temperature distribution may become uniform and hence, highly accurate calibration may be efficiently achieved.

Figures 44A, 44B, 44C:
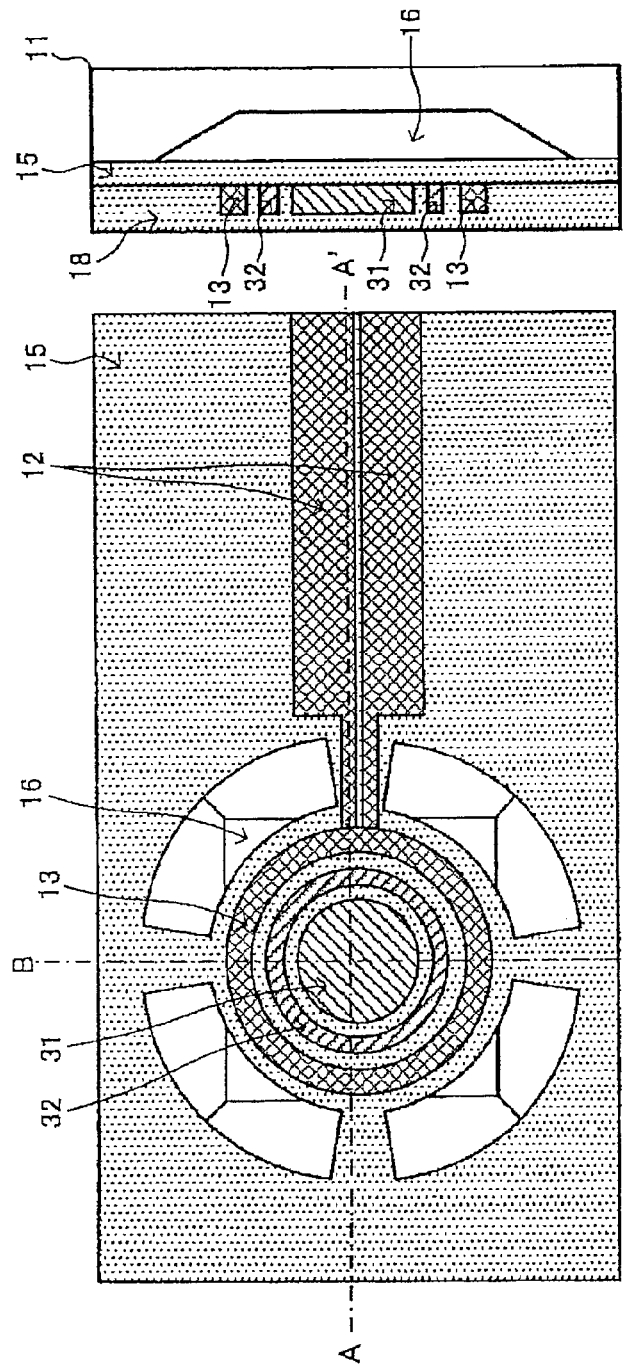
FIGS. 44A to 44C are diagrams illustrating another parallel structure of an electric element according to an embodiment.

FIGS. 44A to 44C are diagrams illustrating another parallel structure of an electric element according to an embodiment. FIG. 44A is a plan diagram, FIG. 44B is an A-A' sectional diagram and FIG. 44C is a B-B' sectional diagram of the electric element according to the embodiment. In FIGS. 44A to 44C, reference numerals identical to those illustrated in FIGS. 43A and 43B indicate the same components of the electric element according to the embodiment illustrated in FIGS. 43A and 43B. Note that the electric insulator layer 18 illustrated in FIGS. 44B and 44C is omitted from FIG. 44A. In the electric element according to the embodiment illustrated in FIGS. 44A to 44C, a circular electric insulator layer 15 partially includes opening regions corresponding to a region where the hollow 16 is formed in the substrate 11 such that air present in the hollow 16 may be in communication with ambient air via the opening regions formed in the circular electric insulator layer 15. Further, a concentric ring-shaped heat-generating portion 13 is arranged in a concentric fashion on the circular electric insulator layer 15, the phase change materials 31 and 32 are arranged concentrically with the heat-generating portion 13 such that the phase change materials 31 and 32 are arranged in parallel with the concentric heat-generating portion 13, and the electric insulator layer 18 is formed as an outermost layer of the electric element having a integrated structure. Since the concentric ring-shaped heat-generating portion 13, and the phase change materials 31 and 32 concentrically arranged in parallel with the ring-shaped heat-generating portion 13, the heat-generating portion 13 and the phase change materials 31 and 32 may be locally arranged in high density. Accordingly, the temperature distribution may become uniform and hence, highly accurate calibration may be efficiently achieved.

FIGS. 45A to 45C are diagrams illustrating another parallel structure of an electric element according to an embodiment. FIG. 45A is a plan diagram, FIG. 45B is an A-A' sectional diagram and FIG. 45C is a B-B' sectional diagram of the electric element according to the embodiment. In FIGS. 45A to 45C, reference numerals identical to those illustrated in FIGS. 44A to 44C indicate the same components of the electric element according to the embodiment illustrated in FIGS. 44A to 44C. Note that the electric insulator layer 18 illustrated in FIGS. 45B and 45C is omitted from FIG. 45A. In the electric element according to the embodiment illustrated in FIGS. 45A to 45C, a circular electric insulator layer 15 partially includes opening regions corresponding to a region where the hollow 16 is formed in the substrate 11 such that air present in the hollow 16 may be in communication with ambient air via the opening regions formed in the circular electric insulator layer 15. Further, a concentric ring-shaped heat-generating portion 13 is arranged in a concentric fashion on the circular electric insulator layer 15, flat sector phase change materials 31 and 32 are alternately arranged in parallel with one another within an internal circle of the concentric ring-shaped heat-generating portion 13, and the electric insulator layer 18 is formed as an outermost (uppermost) layer of the electric element having a integrated structure. Since the sector phase change materials 31 and 32 alternately arranged within the internal circular of the concentric ring-shaped heat-generating portion 13, the concentric ring-shaped heat-generating portion 13 has a uniform distance from the sector phase change materials 31 and 32. Accordingly, the responsiveness may become uniform owing to the uniform distance between the sector phase change materials 31 and 32 and the concentric ring-shaped heat-generating portion 13, the temperature distribution may become uniform and hence, highly accurate calibration may be efficiently achieved.

FIGS. 46A and 46B are diagrams illustrating another parallel structure of an electric element according to an embodiment. FIG. 46A is a plan diagram and FIG. 46B is a B-B' sectional diagram of the electric element according to the embodiment. In FIGS. 46A and 46B, reference numerals identical to those illustrated in FIGS. 45A to 45C indicate the same components of the electric element according to the embodiment illustrated in FIGS. 45A to 45C. The electric element illustrated in FIGS. 46A and 46B differs from the electric element illustrated in FIGS. 45A to 45C in that the electric element illustrated in FIGS. 46A and 46B includes a through-type hollow 16 formed in the substrate 11.

Next, a structure of the electric element capable of detecting phase transition temperatures illustrated in FIGS. 46A and 46B is described. FIGS. 47A and 47B are diagrams illustrating another layered structure of an electric element according to an embodiment. Note that the electric insulator layer 18 illustrated in FIG. 47B is omitted from FIG. 47A. The electric element illustrated in FIGS. 47A and 47B includes a layered structure in which the resistance value of the heat-generating portion 13 is detected by a four-terminal detecting system corresponding to a region where the phase change materials 31 and 32 are arranged such that temperatures of the phase change materials 31 and 32 are separately detected. Specifically, the heat-generating portion 13 bridged over the hollow 16 formed in the substrate 11, and the phase change material 31 and the phase change material 32 are layered on the heat-generating portion 13 via the electric insulator layer 18. In this structure, power is supplied from the power supply leads 12-1 to the heat-generating portion 13 such that the heat-generating portion 13 generates Joule heat, which increases temperatures of the phase change materials 31 and 32 to reach the respective phase transition temperatures. Since ends of the heat-generating portion 13 include temperatures lower than that of a center of the heat-generating portion 13, accurate phase transition temperatures may not be detected if characteristics of low temperature regions of the heat-generating portion 13 are included in detecting factors. Accordingly, detecting leads 12-2 are arranged one at each end of the heat-generating portion 13 corresponding to ends of the phase change materials 31 and 32 formed on the heat-generating portion 13. With this configuration, since the temperatures (the electric resistance value of the heat-generating portion 13) are detected in limited regions of the heat-generating portion 13 corresponding to the phase change materials 31 and 32 formed on the heat-generating portion 13, the temperature fluctuation effect while calibration may be reduced and accurate phase transition temperatures may be detected. Note that the electric element illustrated in FIGS. 48A and 48B includes a parallel structure with a four-terminal type detecting system in which the heat-generating portion 13 is sandwiched between the phase change material 31 and the phase change material 32, and the heat-generating portion 13, the phase change material 31 and the phase change material 32 are arranged in parallel with one another on the electric insulator layer 15 that is bridged over the hollow 16 in the substrate 11.

FIGS. 49A and 49B are diagrams illustrating another parallel structure of an electric element according to an embodiment. Note that the electric insulator layer 18 illustrated in FIG. 49B is omitted from FIG. 49A. In the electric element illustrated in FIGS. 49A and 49B, the heat-generating portion 13 is not utilized as the temperature-detecting portion (served by the heat-generating portion 13 in the above-described embodiments), but utilized as a heater for causing the phase change materials 31 and 32 to undergo phase transition. Accordingly, the electric element illustrated in FIGS. 49A and 49B is further provided with a temperature-detecting portion 19 for detecting phase transition temperatures of the phase change materials 31 and 32. With this configuration, the heat-generating portion 13 is arranged separately from the temperature-detecting portion 19, and hence, the temperature-detecting portion 19 may be capable of separately detecting temperature detecting signals alone. Accordingly, the electric element having the above structure may exhibit high detection accuracy. In the electric element having the above structure illustrated in FIGS. 49A and 49B, the phase change materials 31 and 32 are supplied with a heating current Ih via the power supply leads 12-1 connected to the heat-generating portion 13 such that the phase change materials 31 and 32 exhibit phase-transitions at respective known temperatures. The temperature-detecting portion 19 is formed of an electric resistance material having a predetermined temperature coefficient. The temperature-detecting portion 19 is arranged adjacent to the heat-generating portion 13 and the phase change materials 31 and 32 formed on the electric insulator layer 18 that is bridged over the hollow 16 formed in the substrate 11. With this configuration, the phase change materials 31 and 32 are supplied with a temperature detecting current Ir via the detecting leads 12-2 connected to temperature-detecting portion 19 to output a voltage Vd, which is subject to temperature calibration based on the known transition temperatures of the phase change materials 31 and 32.

Figure 50A:
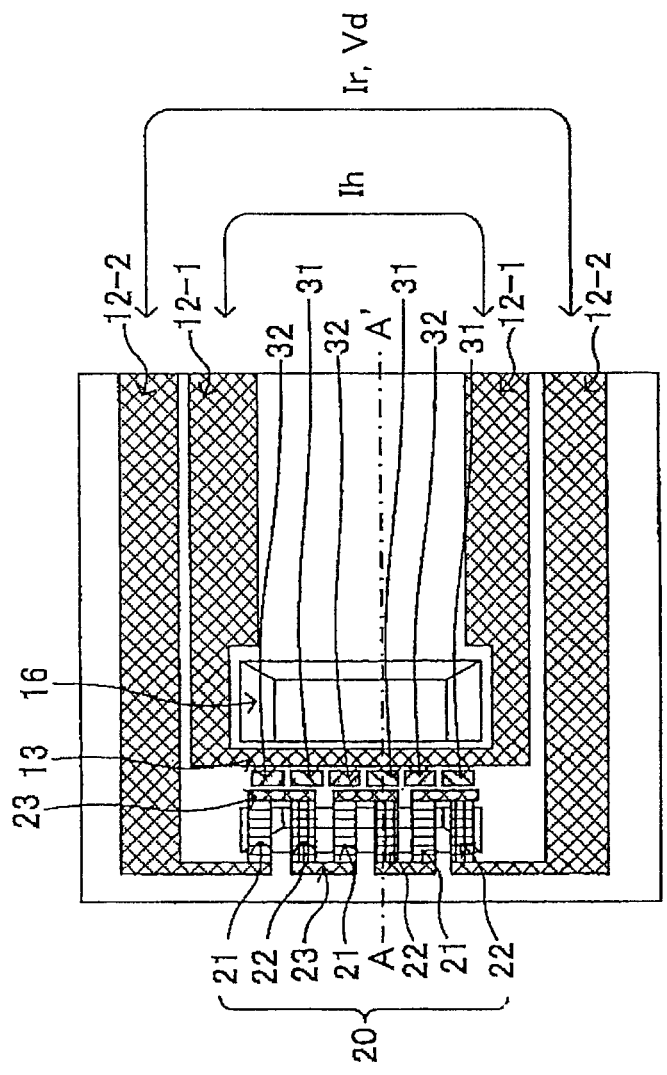
FIGS. 50A and 50B are diagrams illustrating another parallel structure of an electric element according to an embodiment.
Figure 50B:
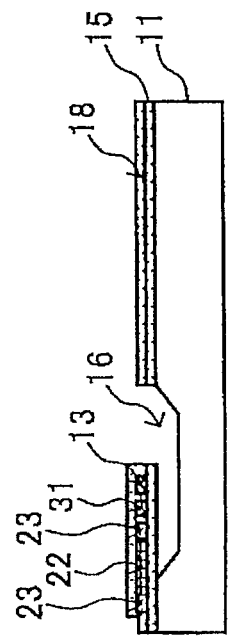

FIGS. 50A and 50B are diagrams illustrating another parallel structure of an electric element according to an embodiment. In the electric element illustrated in FIGS. 50A and 50B, the heat-generating portion 13 is not utilized as the temperature detector portion (served by the heat-generating portion 13 in the above-described embodiments), but utilized as a heater for causing the phase change materials 31 and 32 to undergo phase transition. Accordingly, the electric element illustrated in FIGS. 50A and 50B further includes a temperature detector portion 20 for detecting phase transition temperatures of the phase change materials 31 and 32. In the electric element having the above structure, the phase change materials 31 and 32 are supplied with a heating current Ih via the power supply leads 12-1 connected to the heat-generating portion 13 such that the phase change materials 31 and 32 exhibit phase-transitions at respective known temperatures. The temperature-detecting portion 20 is formed of a thermopile (thermocouples) utilizing the Seebeck effect. The temperature-detecting portion 20 is arranged adjacent to the heat-generating portion 13 and the phase change materials 31 and 32 formed on the electric insulator layer 15 that is bridged over the hollow 16 formed in the substrate 11. The temperature-detecting portion 20 bridged over the hollow 16 in the substrate 11 may be formed of a pair of different types of metallic materials or an N-type semiconductor 21 and a P-type semiconductor 22 connected via an electrode 23. The temperature-detecting portion 20 outputs thermoelectromotive force Vd via the detecting leads 12-2 serially connected to the temperature-detecting portion 20 and the output thermoelectromotive force Vd is subject to temperature calibration based on the respective known phase transition temperatures of the phase change materials 31 and 32. If the substrate 11 is formed of a Si substrate having a bulk silicon structure, a thermocouple pattern having a P-type region and an N-type region and a connecting electrode are formed by photoetching on the Si layer formed on the electric insulator layer by CVD. If, on the other hand, the substrate 11 is formed of a Si substrate having an SOI structure, a thermocouple pattern having a P-type region and an N-type region and a connecting electrode are formed by photoetching on an SOI layer formed on the electric insulator layer by CVD.

FIGS. 51A to 51D are diagrams illustrating another layered structure of an electric element according to an embodiment. FIG. 51A is a plan diagram and FIG. 51B is an A-A' sectional diagram of the electric element according to the embodiment. FIG. 51C is a plan diagram and FIG. 51D is a B-B' sectional diagram of the electric element according to the embodiment. If the phase change materials configured to undergo phase transition at respective known phase transition temperatures are connected with each other, heat conductive with the phase change materials diffuses them. As a result, the phase change materials may be changed into a new alloy or a new compound, which may change the respective phase transition temperatures of the phase change materials. Accordingly, the phase change materials having different phase transition temperatures need to be formed separately from each other. However, if an alloy made by mixing two or more types of metal together includes a known phase transition temperature, the different phase change materials may be allowed to be brought into contact with each other to form a new alloy or a new compound. For example, if a first phase change material formed of In and a second phase change material formed of Sn are allowed to form an In—Sn alloy, a melting point (or freezing point (i.e., a phase transition temperature) of the In—Sn alloy is obtained by referring to a phase diagram of a binary alloy based on a mixing ratio of In and Sn. The alloy may be formed in advance and the obtained alloy may be integrated on the electric insulator layer as a single phase change material. Alternatively, the phase change material 32 may be layered on the phase change material 31 as illustrated in FIGS. 51A and 51B instead. That is, as illustrated in FIGS. 51A and 51B, the electric element having the In—Sn alloy with a predetermined mixing ratio may be formed by layering the heat-generating portion 13 on the substrate 11, forming the electric insulator layer 18 around the heat-generating portion 13 as a passivation film, arranging the phase change materials 31 and 32 in parallel with each other on the electric insulator layer 18, and arranging a layered product formed of the phase change materials 31 and 32 separately from each of the phase change materials 31 and 32 arranged in parallel with each other. In addition, the electric insulator layer 18 utilized as a passivation film may be further arranged as an outermost (uppermost) layer of the electric element. With this configuration, when the temperature calibration is conducted, the layered product formed of the phase change materials 31 and 32 is heated up to one of the melting points of the phase change materials 31 and 32 that is higher than the other one to melt both the phase change materials 31 and 32. As a result, a phase change material 33 that is an alloy of the phase change materials 31 and 32 is formed as illustrated in FIGS. 51C and 51D. Note that since the mixing ratio of In and Sn is determined based on a layered thickness ratio of In and Sn, a phase transition temperature of the binary alloy (i.e., the phase change material 33 in this case) may be determined by referring to a phase diagram of the binary alloy. Accordingly, even if the electric element includes two or more different types of phase change materials, appropriate phase transition temperatures of the two or more phase change materials may be obtained.

FIGS. 52A to 52D are diagrams illustrating another layered structure of an electric element according to an embodiment. FIG. 52A is a plan diagram and FIG. 52B is an A-A' sectional diagram of the electric element according to the embodiment. FIG. 52C is a plan diagram and FIG. 52D is a B-B' sectional diagram of the electric element according to the embodiment. As illustrated in FIGS. 52A and 52B, the phase change materials 31 are alternately and adjacently attached to the phase change materials to form an adjacently arranged product of the phase change materials 31 and 32. With this configuration, when or before the temperature calibration is conducted, the adjacently arranged product formed of the phase change materials 31 and 32 is heated up to one of the melting points of the phase change materials 31 and 32 that is higher than the other one to melt both the phase change materials 31 and 32. As a result, a phase change material 33 that is an alloy of the phase change materials 31 and 32 is formed as illustrated in FIGS. 52C and 52D. Note that since a mixing ratio of In and Sn is determined based on a ratio of an arranged area of In and Sn, a phase transition temperature of a binary alloy (i.e., the phase change material 33 in this case) may be determined by referring to a phase diagram of the binary alloy. Accordingly, even if the electric element includes two or more different types of phase change materials, an appropriate phase transition temperature of the two or more phase change materials may be obtained.

Figure 63A:
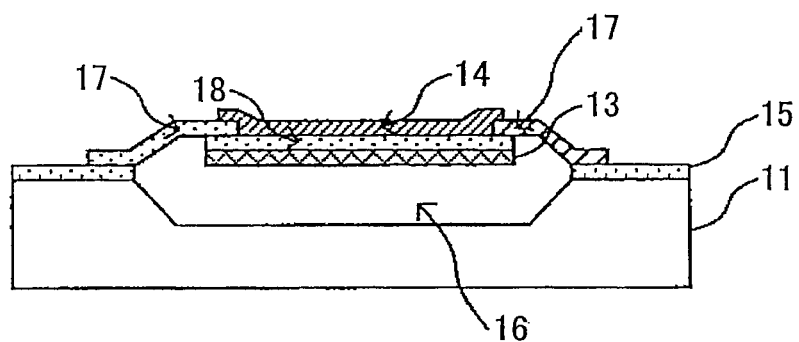
FIGS. 63A and 63B are sectional diagrams illustrating a structure of an electric element according to an embodiment.
Figure 63B:
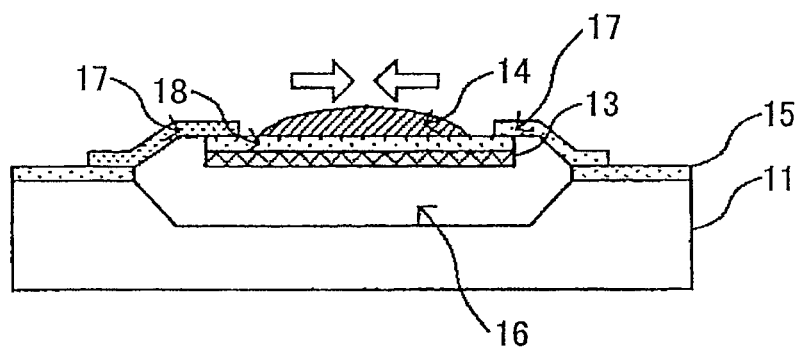

Next, a structure of the electric element according to an embodiment is described. In this embodiment, viscosity change of a phase change material is detected based on one phase change material. FIGS. 63A and 63B are cross-sectional diagrams illustrating a structure of an electric element according to an embodiment. FIGS. 63A and 63B illustrate deformation of a phase change material due to viscosity change of a phase change portion of the phase change material when the phase change material phase transitions from solid to liquid. The conductivity may be detected by the deformation of the conductive phase change material due to its viscosity change, a change in heat capacity of the phase change material due to its displacement, a change in an electric resistance value of the conductive phase change material due to its deformation, or a change in a natural frequency of the phase change material due to its viscosity change or its displacement. Whether the phase change material has the known temperature is determined in this manner. In this example, a description is given of a technique for detecting the conductivity obtained as a result of the deformation of the phase change material due to its viscosity. FIGS. 63A and 63B are cross-sectional diagrams illustrating a structure of an electric element according to an embodiment. FIGS. 63A and 63B illustrate a technique in which the conductivity is obtained as a result of the deformation of the phase change material due to its viscosity. As illustrated in FIG. 63A, the electric insulator layer 15 is layered on the substrate 11 and the heat-generating portion 13 is then layered on the electric insulator layer 15. Further, the electric insulator layer 18 is formed on the heat-generating portion 13 and the detecting leads 17 are formed on the electric insulator layer 18. The phase change material 14 bridges between the detecting leads 17 via the electric insulator layer 18 such that the phase change material 14 is continuously arranged over the electric insulator layer 18 between the detecting leads 17. In this configuration, when the solid phase change material 14 heated by the heat-generating portion 13 reaches a known phase transition temperature, the solid phase change material 14 liquefies to increase its surface tension. As a result, the liquefied phase change material 14 aggregates toward the center of the phase change material 14 as illustrated in FIG. 63B. As a result, the phase change material 14 becomes separated from the two detecting leads 17 such that an electric connection between the two leads 17 is disconnected (turned OFF). Thus, the phase transition of the phase change material is detected by detecting the conductivity of the phase change material. Note that Sn may be a preferable material for the phase change material that includes high surface tension and low adhesiveness to a layer arranged lower than the phase change material. Thus, a temperature obtained when the electric connection between the detecting leads is disconnected (turned OFF) corresponds to a known phase transition temperature of the phase change material.

Figure 64A:
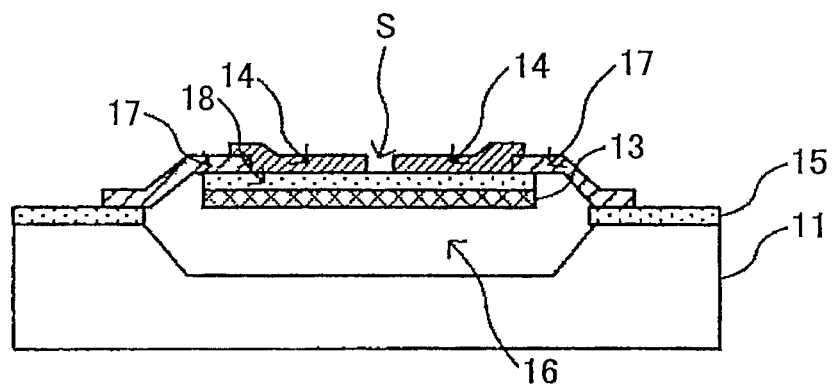
FIGS. 64A and 64B are sectional diagrams illustrating another structure of an electric element according to an embodiment.
Figure 64B:
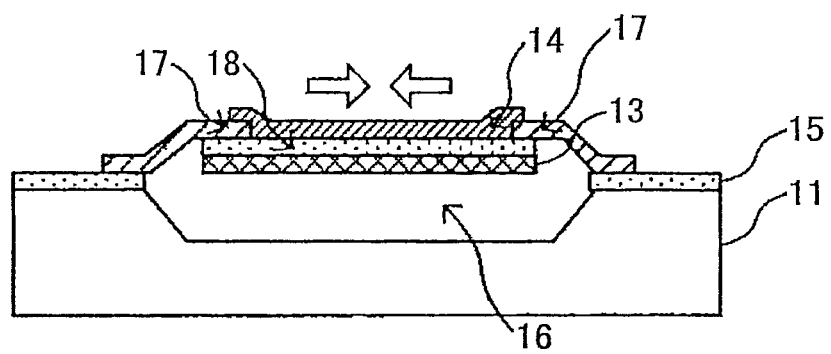

FIGS. 64A and 64B are cross-sectional diagrams illustrating another structure of an electric element according to an embodiment. In FIGS. 64A and 64B, reference numerals identical to those illustrated in FIGS. 63A and 63B indicate the same components of the electric element according to the embodiment illustrated in FIGS. 63A and 63B. FIGS. 64A and 64B illustrate deformation of a phase change portion of the phase change material when the phase change material phase transitions from solid to liquid. As illustrated in FIG. 64A, the phase change material 14 bridges between the detecting leads 17 such that the phase change material 14 is intermittently arranged over the electric insulator layer 18 between the detecting leads 17. In this configuration, when the solid phase change material 14 heated by the heat-generating portion 13 reaches a known phase transition temperature, the intermittently arranged phase change material 14 liquefies and flows in directions indicated by arrows in FIG. 64B such that the intermittently arranged portions of the phase change material 14 are mutually connected. As a result, an electric connection between the two detecting leads 17 is connected (turned ON). Note that In may be a preferable material for the phase change material that includes high surface tension and high wettability to a layer arranged lower than the phase change material. Thus, a temperature obtained when the electric connection between the detecting leads is connected (turned ON) corresponds to a known phase transition temperature of the phase change material.

Figure 65A:
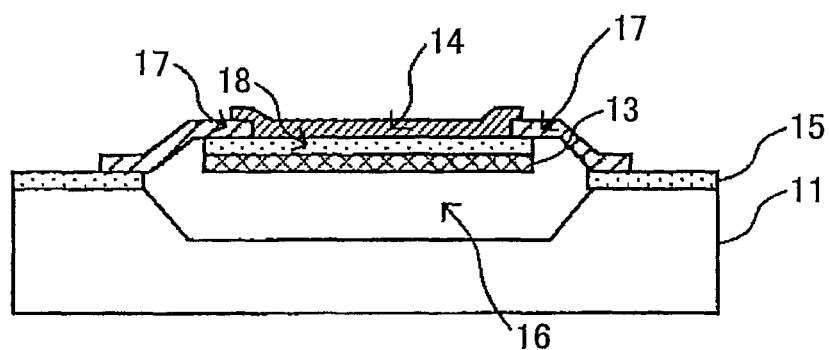
FIGS. 65A and 65B are sectional diagrams illustrating another structure of an electric element according to an embodiment.
Figure 65B:
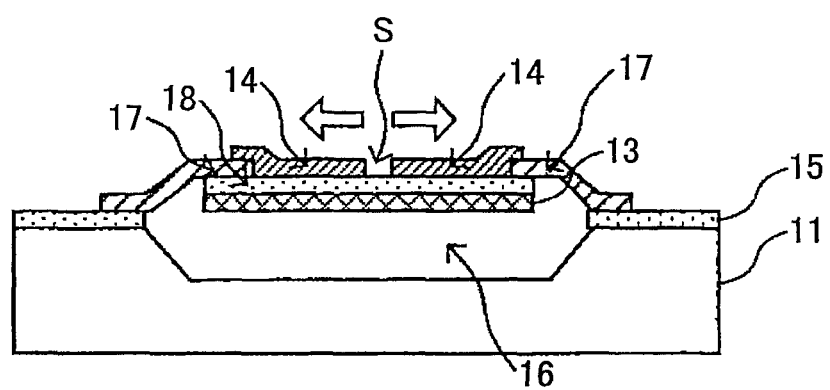

FIGS. 65A and 65B are cross-sectional diagrams illustrating another structure of an electric element according to an embodiment. In FIGS. 65A and 65B, reference numerals identical to those illustrated in FIGS. 64A and 64B indicate the same components of the electric element according to the embodiment illustrated in FIGS. 64A and 64B. FIGS. 65A and 65B also illustrate deformation of a phase change portion of the phase change material when the phase change material phase transitions from solid to liquid. As illustrated in FIG. 65A, the phase change material 14 bridges between the detecting leads 17 such that the phase change material 14 is continuously arranged over the electric insulator layer 18 between the detecting leads 17. In this configuration, when the solid phase change material 14 heated by the heat-generating portion 13 reaches a known phase transition temperature, the continuously arranged phase change material 14 liquefies and flows in directions indicated by arrows in FIG. 65B such that the continuously arranged phase change material 14 aggregates toward the two detecting leads 17, and the continuously arranged phase change material 14 is divided into two separate portions of the phase change material 14. As a result, an electric connection between the two detecting leads 17 is disconnected (turned OFF). Thus, a temperature obtained when the electric connection between the detecting leads is disconnected corresponds to a known phase transition temperature of the phase change material. Note that an overall structure of the electric element according to the embodiment is similar to those illustrated in the above embodiments (e.g., see FIGS. 8A and 8B), and thus is not described again.

Figure 53:
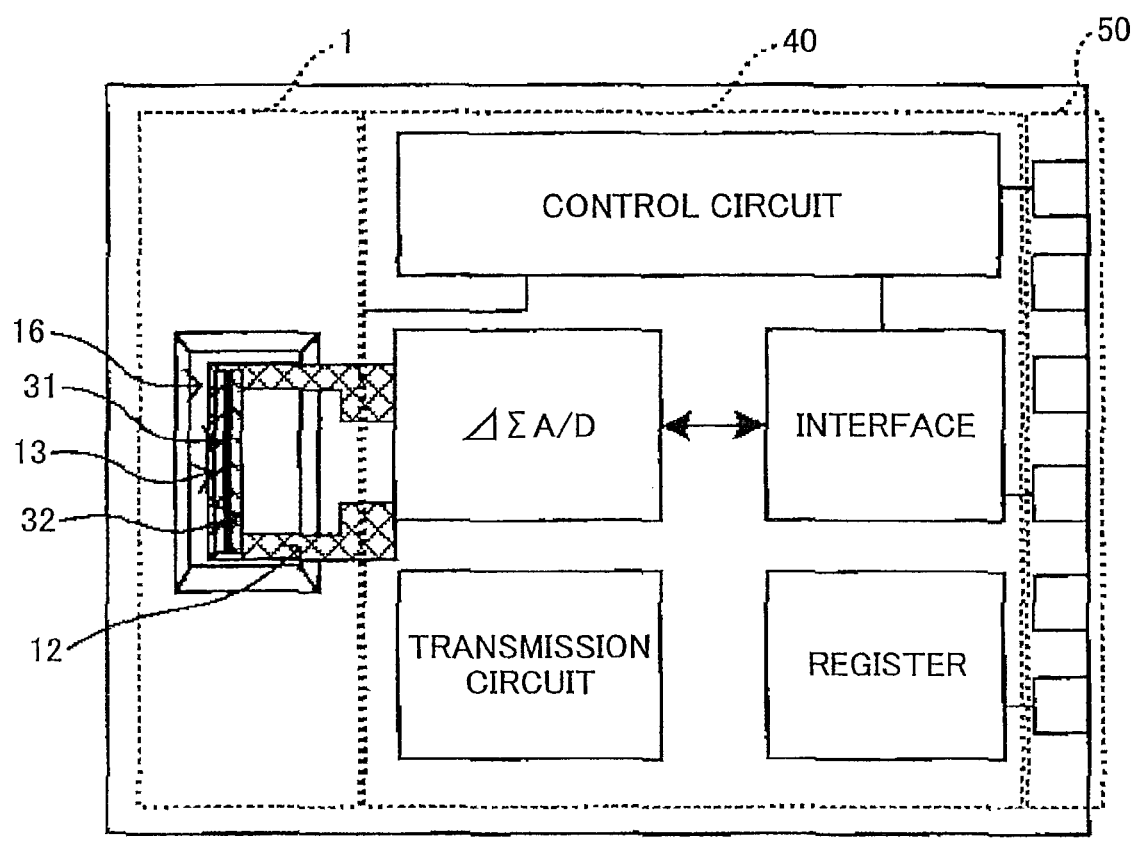
FIG. 53 is a schematic plan diagram illustrating a configuration of an integrated element having an electric element according to an embodiment.

FIG. 53 is a schematic plan diagram illustrating a configuration of an integrated element having an electric element according to an embodiment. As illustrated in FIG. 53, the integrated element includes an electric element 1 according to the embodiment, an electronic circuit 40 configured to supply power to the electric element 1 or detect power to the electric element 1, and an input-output terminal group 50 configured to input signals to or output signals from a higher-level device. That is, the integrated element illustrated in FIG. 53 formed of the electric element 1, the electronic circuit 40 and input-output terminal group 50 integrates a temperature calibration function and a temperature detection function. The electronic circuit 40 includes an interface, a control circuit, a register, a delta sigma type A-D converter ($\Delta\Sigma$ A/D), and a transmission circuit. The input-output terminal group 50 includes various terminals of address, GND, clock input, data input-output, and power. The electric element according to the embodiment illustrated is formed by arranging a pair of leads 12 formed of a conductive material such as Si, Pt, NiCr, SiC and C and configured to supply power on a substrate formed of a terminal electric insulator material such as glass or ceramics, arranging a heat-generating portion 13 at an end of the pair of the leads 12, and layering phase change materials 31 and 32 having different phase transition temperatures on the heat-generating portion 13 separately from each other. Note that if the phase change materials 31 and 32 are formed of conductive materials, the electric insulator layer (not illustrated) is formed over the substrate, and the phase change materials 31 and 32 are formed on the heat-generating portion 13 via the electric insulator layer. Further, the substrate made of Si may facilitate the integration of peripheral circuits. For example, if the substrate is formed of a Si substrate having a bulk silicon structure, $SiO_2$ may be formed on a surface of the Si substrate by thermally oxidizing the Si substrate, or an electric insulator layer formed of a single layer or a multiple layer of $SiO_2$, $Si_3N_4$ and $Al_2O_3$ may be formed on the Si substrate by CVD or sputtering, so as not to allow materials of the phase change materials 31 and 32 or the heat-generating portion 13 to be conductive with the substrate. Next, a material of the heat-generating portion 13 such as Si, Pt or NiCr is layered on the electric insulator layer by CVD or sputtering and a pattern of the heat-generating portion 13 is formed by photoetching. Further, the phase change materials 31 and 32 are formed by CVD or sputtering and patterns of the phase change materials 31 and 32 are formed by photolithography. Note that peripheral circuits may be integrated in the same chip as a CMOS element structure. Moreover, if the Si substrate having SOI (Si-on-insulator) structure is utilized, a box layer is utilized as the electric insulator layer and the SOI layer is patterned by photoetching to form the heat-generating portion 13. Next, after the electric insulator layer is formed on the surface of the substrate, the phase change materials 31 and 32 are formed by CVD, sputtering or a sol-gel process and patterns of the phase change materials 31 and 32 are formed by photolithography. Note that since the box layer or SOI layer is utilized as a CMOS element structure, peripheral circuits may be integrated in the same chip.

Figure 54:
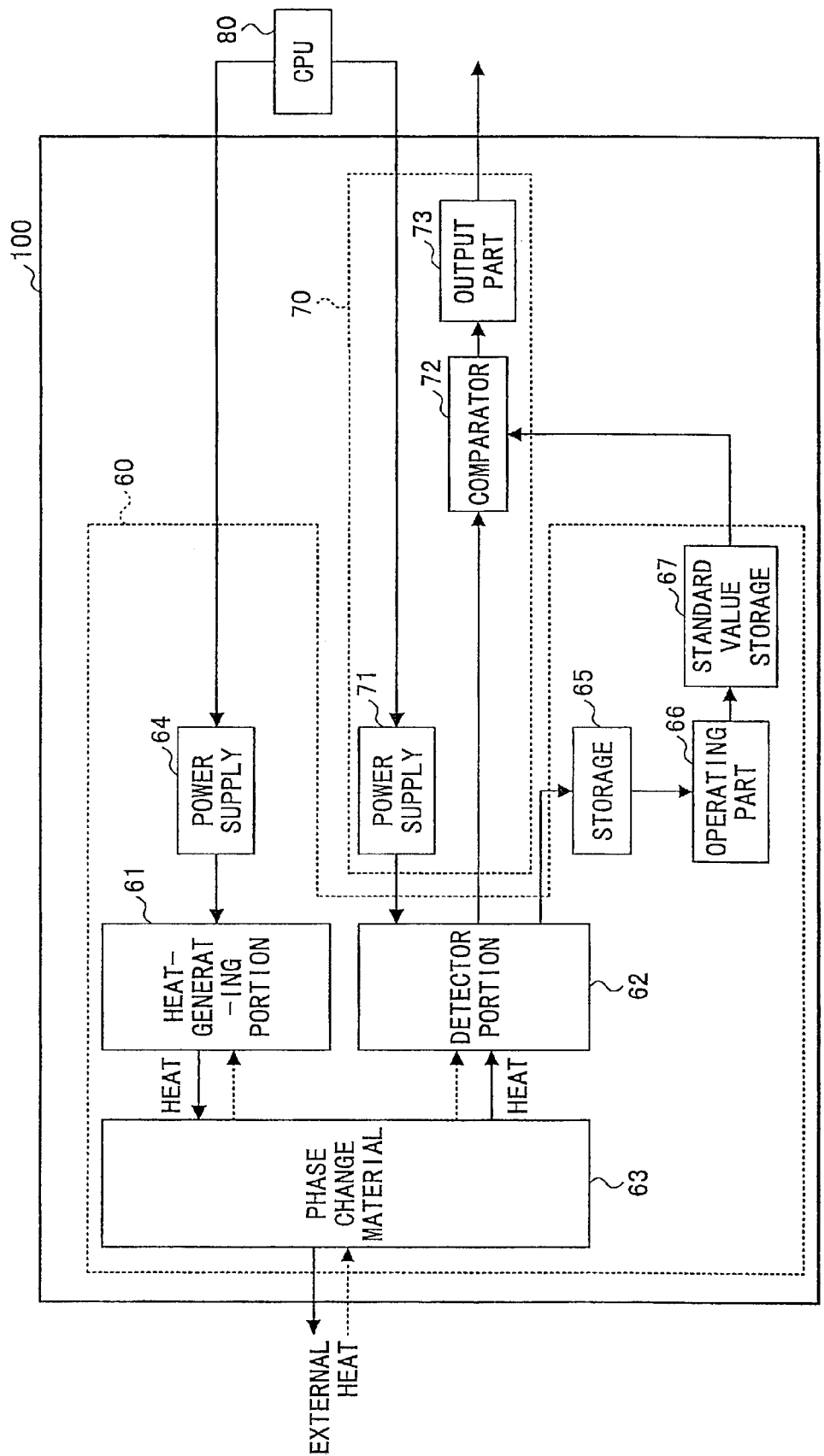
FIG. 54 is a block diagram illustrating a configuration of an integrated element having an electric element according to an embodiment.

FIG. 54 is a block diagram illustrating a configuration of an integrated element having an electric element according to an embodiment. As illustrated in FIG. 54, an integrated element 100 includes a temperature calibration part 60 and a measuring part 70. The temperature calibration part 60 includes a heat-generating portion 61, a detector portion 62, a phase change material 63, a power supply 64, a storage 65, an operating part 66 and a standard value storage 67. The measuring part 70 includes a power supply 71, a comparator 72 and output part 73. Further, as illustrated in FIG. 54, an externally provided CPU 80 is configured to control the power supply 64 and power supply 71. Note that in this example, the heat-generating portion 61 and the detector portion 62 are separately provided; however, the heat-generating portion 61 and the detector portion 62 may be provided in one unit serving as both the heat-generating portion 61 and the detector portion 62. Further, when the CPU 80 generates signals to execute calibration and the generated signals are supplied to the power supply 64 of the heat-generating portion 61, the heat-generating portion 61 generates heat. Simultaneously, the detector portion 62 detects a resistance value of the heat-generating portion 61, and the storage 65 stores the detected resistance value of the heat-generating portion 61 and a time at which the detector portion 62 has detected the resistance value of the heat-generating portion 61. Note that the operating part 66 formulates a function based on the detected time and the resistance value of the heat-generating portion 61. Thus, if a value that is a predetermined value or more deviated from the value of a function table is continuously obtained, the resistance value of the heat-generating portion 61 may be detected as a phase transition temperature of the phase change material 63. Next, when the CPU 80 generates signals to execute the measurement and the generated signals are supplied to the power supply 71 of the detector portion 62, the resistance value of the detector portion 62 is detected and a temperature measurement value is detected based on a relationship between the known temperature and the resistance value of the detector portion 62 as a standard value.

Figure 55:
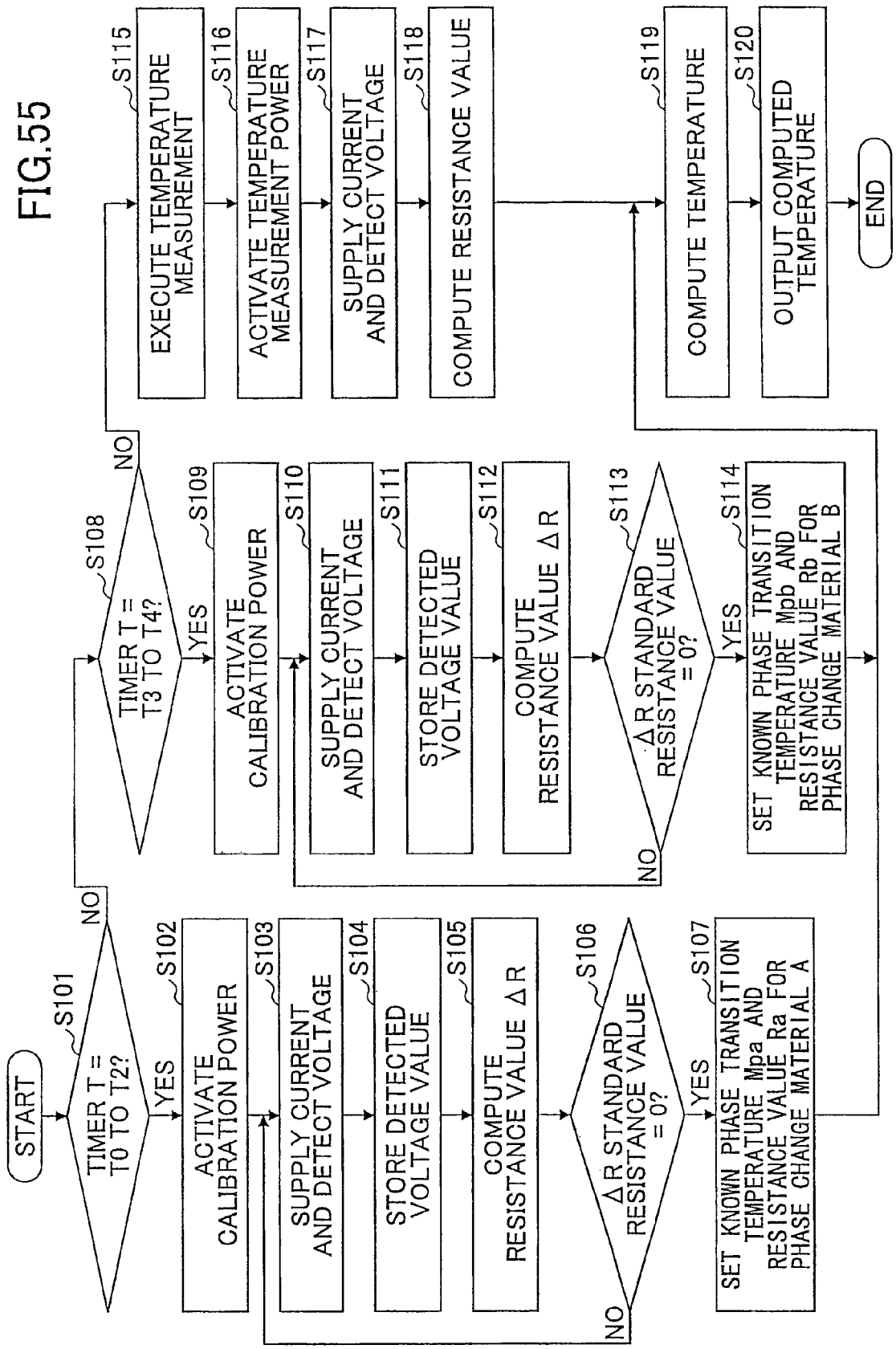
FIG. 55 is a flowchart illustrating a calibration operation conducted by an electric element according to an embodiment.

FIG. 55 is a flowchart illustrating a calibration operation conducted by an electric element according to an embodiment. In FIG. 55, when a time (timer) T is T0 to T2 ("YES" in step S101), calibration power is activated (step S102). Subsequently, a current is supplied to the heat-generating portion and the voltage corresponding to the supplied current is detected (step S103). The voltage detected in step S103 is then stored (step S104). Thereafter, an inflection point ΔR of the detected voltage R is computed (step S105). The calibration is continued until the standard value of the inflection point ΔR is 0 (repeat step S103 to S105 if "NO" in step S106), and a known phase transition temperature Mpa and a resistance value Ra are set for a phase change material A when the standard value of the inflection point ΔR is 0 (step S107 if "YES" in step S106). Next, when a time (timer) T is not T0 to T2 ("NO" in step S101), but when a time (timer) T is T3 to T4 ("YES" in step S108), a calibration power supply is activated (step S109). Subsequently, a current is supplied to the heat-generating portion and the voltage corresponding to the supplied current is detected (step S110). The voltage detected in step S103 is then stored (step S111). Thereafter, an inflection point ΔR of the detected voltage R is computed (step S112). The calibration is continued until the standard value of the inflection point ΔR is 0 (repeat step S110 to S112 if "NO" in step S113), and a known phase transition temperature Mpb and a resistance value Rb are set for a phase change material B when the standard value of the inflection point ΔR is 0 (step S114 if "YES" in step S113). When a time (timer) T is T4 or a time subsequent to T4 ("NO" in step S108), temperature measurement is executed (step S115). Subsequently, temperature measurement power is activated (step S116), and a current is supplied to the heat-generating portion and the voltage corresponding to the supplied current is detected (step S117). A resistance value in step S117 is then computed (step S118). A temperature is computed based on the resistance value obtained by the calibration (step S119) and the computed temperature is then output (step S120).

Thus, the change in the electric resistance value from time T1 to T2 (see FIG. 1) is stored as data, which are operated as a function of a resistance value and time. The function and the data obtained after time T1 are compared. If there are data that do not match the function at time T2, the phase change material exhibits phase transition, and the temperature of the phase change material at time T2 is determined as a known phase transition temperature Mp. Specifically, if an electric element includes a structure having a small heat capacity including a substrate with a hollow, a heat-generating portion and the phase change material, significant characteristics may be obtained when time T2=0.1 to 10 ms. For example, in a meandering configuration of a later-described element having a heat-generating portion and a phase change material illustrated in FIGS. 18A and 18B, if a region in which the heat-generating portion 13 and the phase change material are formed has a thickness of 2 μm and a size of 100 μm square, and the phase change material is made of Sn and has a phase transition temperature of 231.928° C., a standard temperature is obtained in 1 ms. If the size of the region where the heat-generating portion 13 and the phase change material are arranged is further reduced, the standard temperature may be more quickly obtained. Thus, as illustrated in FIG. 1, the electric resistance value R2 of the heat-generating portion corresponds to the known temperature Mp, extremely feeble electric current is supplied to the heat-generating portion so as not to cause the heat-generating portion to generate Joule heat, and the electric resistance value of the heat-generating portion is detected as an environmental temperature of the element by utilizing the known temperature coefficient of resistance TCR of the heat-generating portion. Note that if the electric element includes a configuration that generates two or more different phase transition temperatures, an unknown temperature coefficient of resistance TCR may be determined without utilizing the known temperature coefficient of resistance TCR of the heat-generating portion.

Note that since the heat-generating portion 13 includes a thickness less than that of the leads 12 or includes a width less than that of the leads 12, the heat-generating portion 13 has a greater electric resistance value than that of the leads 12. Accordingly, the heat-generating portion 13 may be capable of being supplied with a current to generate Joule heat. When the heat-generating portion 13 is supplied with a current from rear ends of the leads 12, the heat-generating portion 13 generates Joule heat to increase its temperature. Further, a small amount of the phase change material 14 is closely arranged to the heat-generating portion 13 such that the temperature of the phase change material 14 may be approximately the same temperature as the heat-generating portion 13. The heat-generating portion 13 also serves as a temperature detector portion. A specific resistance value of the electric resistance material of the heat-generating portion 13 and an electric resistance value corresponding to the temperature coefficient of resistance correspond to the temperature of the heat-generating portion 13. Further, the leads 12 detect phase transitions of the phase change materials 31 and 32 formed on the heat-generating portion 13. Accordingly, the heat transferred from the phase change materials 31 and 32 affecting the heat-generating portion 13 may be acquired as electric properties of the heat-generating portion 13.

Thus, the calibration technique described above includes heating the two or more phase change materials having the different phase transition temperatures by the heat-generating portion, detecting respective phase transitions of the phase change materials, such that the respective temperatures at which the phase change materials exhibit phase transitions are detected, and adjusting the temperature detecting portion to a known temperature based on the detected temperatures of the phase change materials. A phase change material exhibits phase transition within a narrow temperature range with high accuracy and high reproducibility. Further, the phase change material has properties of changing its temperature, electric resistance value, mass, heat capacity, natural frequency, dielectric constant, transmittance or reflectance before and after the phase transitions, and is capable of detecting these changes. Further, in order to calibrate the electric element with high accuracy, it is preferable that the phase change material include a phase transition temperature similar to the temperature of a material for which the electric element is used. Further, it is preferable that the phase change material be formed of metal, an oxide or an organic material having a narrow phase transition range.

Note that before the resistance value of the heat-generating portion is detected as "$\Delta R=0$" at a phase transition temperature of the phase change material, an erroneous resistance value of the heat-generating portion may be detected as "$\Delta R=0$" due to a drastic external temperature drop. However, in the electric element according to the embodiments, since the heat-generating portion or the phase change material includes extremely small heat capacity, the phase change material rapidly phase transitions without being affected by the external temperature change. Accordingly, the erroneous resistance value of the heat-generating portion may scarcely be detected. In addition, if the heat capacity of the phase change material is configured to include a large proportion in a heat-generating region, the phase transition of the phase change material may be easily detected. Accordingly, the electric element may scarcely be affected by the external temperature change. Specifically, it is preferable that the phase change material have the heat capacity equal to or greater than the heat capacity of the heat-generating portion in the heat-generating region of the electric element. Further, in the electric element according to the embodiments, two or more calibrations may be conducted for increasing its accuracy. That is, the electric element according to the embodiments may include a bridge circuit configured to compare two or more detector portions, in which one of the detector portions is utilized for detecting a change in a resistance value corresponding to the external temperature change. Accordingly, an adverse effect due to the external temperature change may be compensated for. The electric element according to the embodiments may utilize two or more effective calibration points of the two or more phase change materials. Further, the electric element according to the embodiments may include a resistance material having a known temperature coefficient of resistance (TCR) to determine whether the detected erroneous value is consistent with the temperature dependency of the electric element by referring to the temperature dependency of the resistance value of the resistance material. Accordingly, the detected erroneous value may be rejected and thus, further accuracy may be obtained.

Note that in order to detect a temperature with high accuracy, it is preferable that the phase change material include a phase transition temperature closest to a temperature detecting range of a standard material specified in the international temperature scale (ITS-90). For example, if an IC temperature sensor utilized in a general electronic apparatus has a temperature detecting range of −40 to +125° C., In (Mpa=156.5985° C.) may be preferably utilized for the phase change material A and Sn (Mpb=231.928° C.) may be preferably utilized for the phase change material B. In addition, Pt may be preferably utilized for the heat-generating portion and the temperature detector portion. Pt includes a small secondary or above temperature coefficient of resistance and a linear characteristic that will not affect the accuracy of the target temperature detecting value in a temperature detecting range of −40 to +232° C. The electric element according to the embodiments includes two calibration points of Mpa and Mpb. However, the electric element according to the embodiments may include three or more calibration points. If the heat-generating portion is formed of a material such as Pt or Si that is stable at a high temperature, the electric element according to the embodiments may further include Zn (419.527° C.) or Al (660.323° C.) to further increase its accuracy.

Figure 56A:
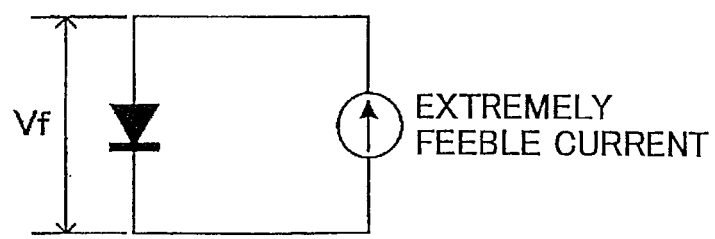
FIGS. 56A and 56B are diagrams illustrating a relationship between a diode forward voltage and a temperature change.
Figure 56B:
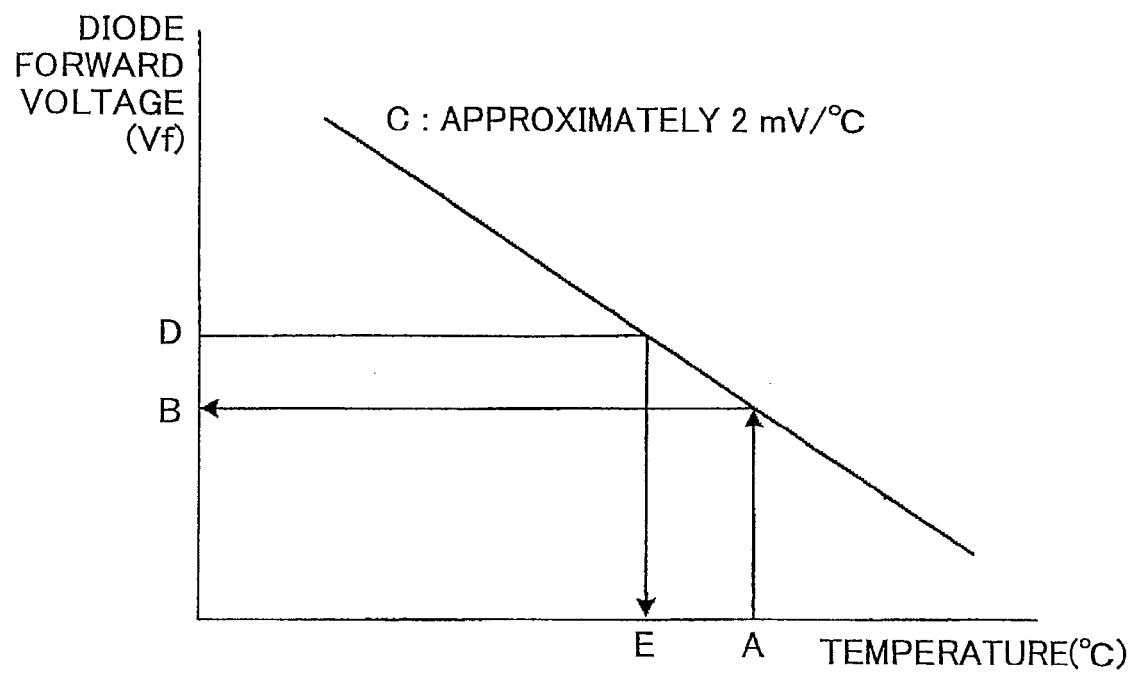

Further, a CPU or a power semiconductor may utilize properties of a diode forward voltage when a temperature for preventing thermal destruction of an element is measured, or an amount of heat transferred to the element is measured by the element. As illustrated in FIG. 56A, since a forward voltage Vf in the small electric current region of a diode to its temperature linearly decreases at a rate of approximately 2 mV/° C., the temperature of the chip may be detected immediately after a large amount of current has flowed in the chip. For example, the temperature (° C.) and temperature dependency (mV) corresponding to the forward voltage Vf at 100 mA are measured beforehand, and inversely, the obtained mV of forward voltage Vf is converted into the temperature. As illustrated in FIG. 56B, the forward voltage Vf (see "B" in FIG. 56B) obtained when the chip is heated at a predetermined temperature (see "A" in FIG. 56B) is measured, the diode forward voltage corresponding to the temperature (° C.) is adjusted based on the diode forward voltage Vf in a small current region and temperature dependency of approximately 2 mV/° C. (see "C" in FIG. 56B) of the diode forward voltage Vf. Accordingly, the temperature ("E" in FIG. 56B) is obtained by measuring the diode forward voltage Vf (see "D" in FIG. 56B). This method is similar to that utilized for a bipolar transistor, a MOSFET, or an operational amplifier formed of the combination of bipolar transistor and the MOSFET. A base emitter of the bipolar transistor may be utilized as a temperature sensor instead of the diode-based temperature sensor. Further, the diode formed by short-circuiting a collector and a base may be utilized as a temperature sensor, or a built-in diode of the MOSFET may be utilized as a temperature sensor.

Further, a temperature sensor utilizing a band gap of the bipolar transistor includes output properties provided based on temperature properties of the voltage V (BE) between the base and the emitter of the transistor. Since C represents a structure of an electronic diffusion coefficient and a base width, the temperature T is computed based on the following equation.

$$T = qV_{BE}/(k \ln(I_C - I_{CB0})/C)$$

Figure 57:
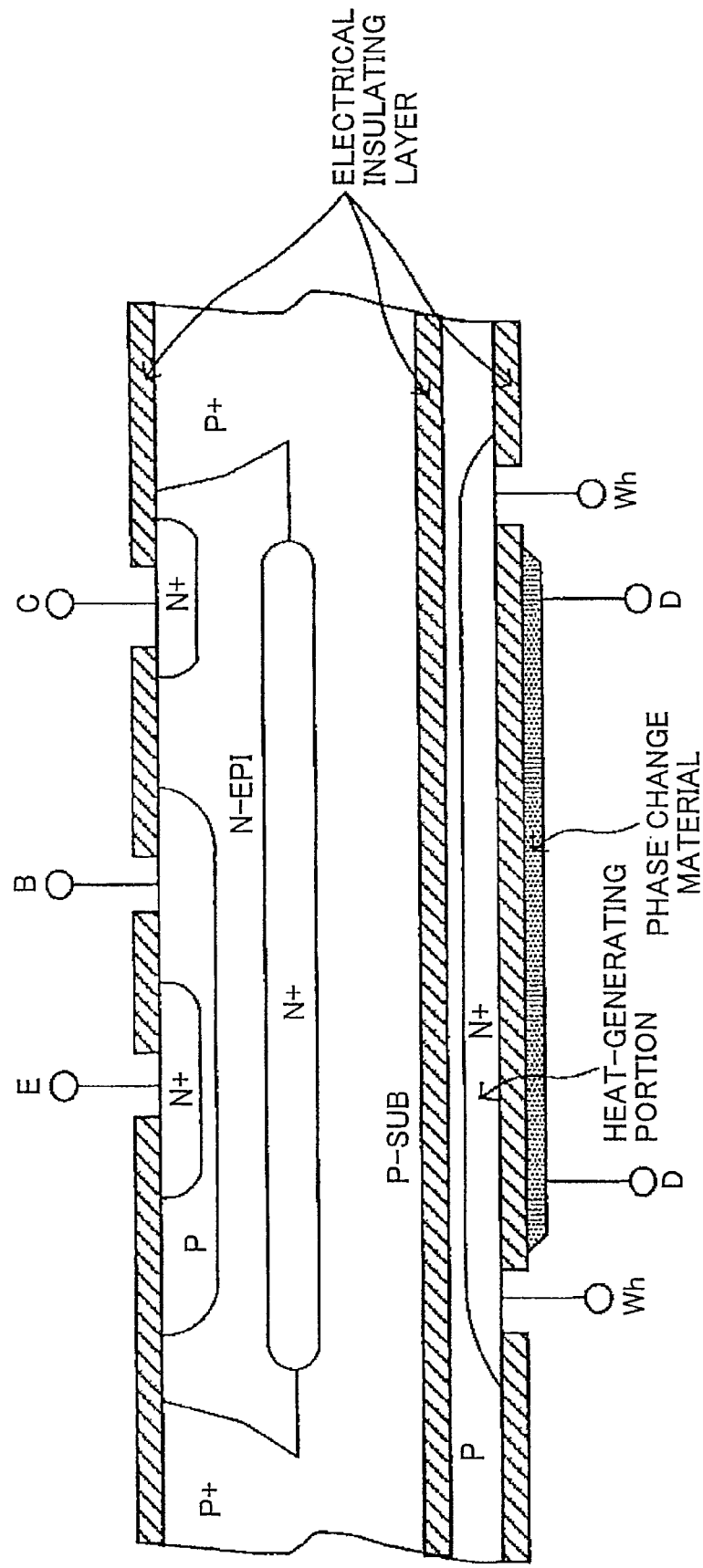
FIG. 57 is a cross-sectional diagram illustrating a partial structure of an integrated circuit (IC) bipolar transistor.

This indicates that the temperature may be computed by measuring the collector current IC. FIG. 57 is a cross-sectional diagram illustrating a partial structure of an IC bipolar transistor. The IC bipolar transistor may be calibrated with high accuracy by uniformly adjusting the temperature of the C structure region to the known temperature of the phase transition temperature. Accordingly, a phase change material is arranged adjacent to at least the C structure region of the IC bipolar transistor. Further, a heat-generating portion is arranged on an Si layer of the SOI substrate and the phase change material is layered on the heat-generating portion. Power is supplied to the terminals Wh to cause the N+ region utilized as the heat-generating portion to generate heat, and the phase transition of the phase change material is detected between the terminals D. Thus, since mass-produced electric elements are provided with an integrated element including the temperature standard and the calibration function, the facility for temperature calibration or a temperature calibration process may be entirely omitted. Accordingly, the electric elements may be produced at low cost in any semiconductor manufacturing plant.

Figure 58:
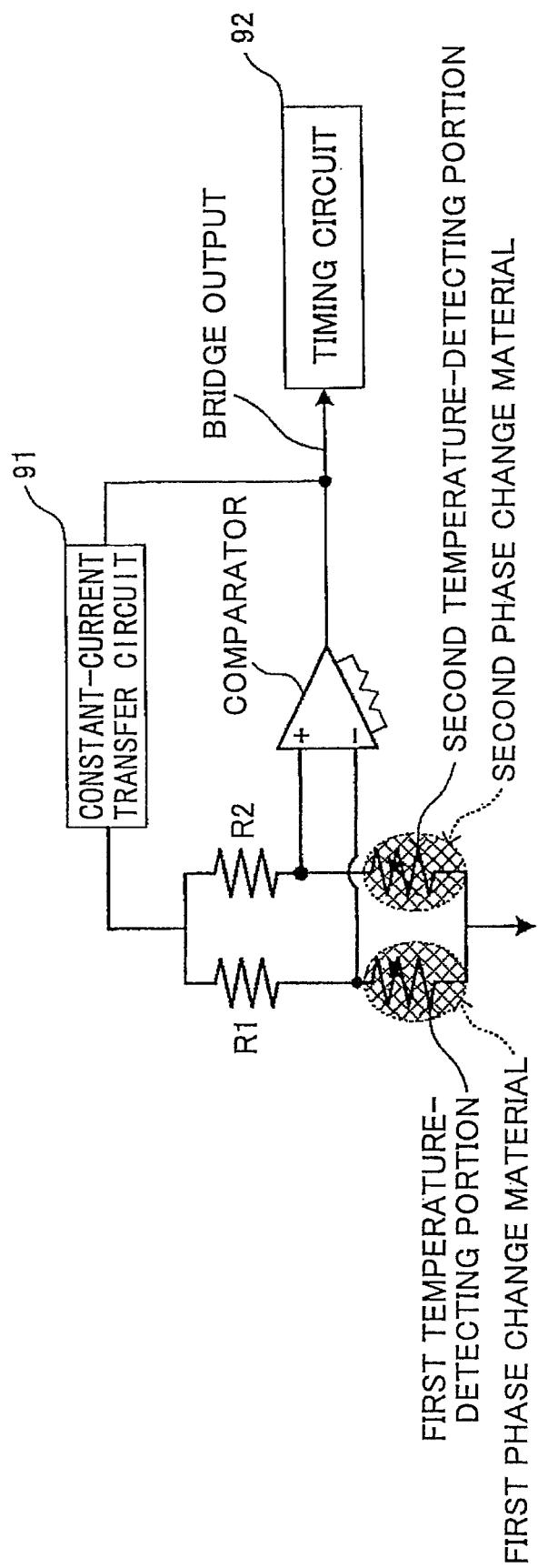
FIG. 58 is a circuit diagram illustrating a first temperature detecting portion and a second temperature detecting portion of a temperature compensation circuit.

FIG. 58 is a circuit diagram illustrating a first temperature detecting portion and a second temperature detecting portion of a temperature compensation circuit. The temperature compensation circuit illustrated in FIG. 58 is a bridge circuit for carrying out temperature compensation for external temperature change in the second temperature detecting portion. With this configuration, the second temperature detecting portion may not be affected by the external temperature change when the temperature calibration is conducted on the first temperature detecting portion. It is preferable that the first and the second temperature detecting portions have approximately the same heat capacities, because the first and the second temperature detecting portions need to have approximately the same responsiveness to the temperature change. Consequently, the first and the second temperature detecting portions are formed of approximately the same materials and have approximately the same sizes. Note that since it is necessary to detect phase transition of a first phase change material in the first temperature detecting portion alone while the temperature calibration is conducted on the first temperature detecting portion, it is necessary not to allow a second phase change material to undergo phase transition in the second temperature detecting portion while the temperature calibration is conducted on the first temperature detecting portion. Accordingly, the second phase change material in the second temperature detecting portion may include a phase transition temperature higher than a phase transition temperature of the first phase change material in the first phase transition temperature. However, it is preferable that the first and second temperature detecting portions include approximately the same heat capacities, the first and the second phase change materials may include mass, specific heat, and heat conductivity that are not significantly different from each other. However, it is preferable that the first phase change material be formed of In and the second phase change material be formed of Sn, Al or Au that includes the phase transition temperature higher than the phase transition temperature of In. If the second phase change material is formed of Al and Au that are the same material as a wiring material of the integrated circuit on which the first and the second phase change materials are integrated, the second phase change material may be formed in the same process as the wiring material. Alternatively, if the second phase change material is formed of Pt that is the same material as the heat-generating portion, the second phase change material may be formed in the same manufacturing process as the heat-generating portion. In this case, the temperature calibration is conducted until the temperature reaches the phase transition temperature of In. Alternatively, the first and second temperature detecting portions may be uniformly combined, and the different temperature calibrations may be conducted correspondingly. In this case, if the two different phase change materials that form the first phase change material in the first temperature detector portion are In and Sn, respectively, two different phase change materials that form the second phase change material in the second temperature detecting portion may be selected from Al, Au and Pt that include phase transition temperatures higher than those of In and Sn. If the second phase change material is formed of Al and Au that are the same material as a wiring material of the integrated circuit on which the first and the second phase change materials are integrated, the second phase change material may be formed in the same process as the wiring material. Alternatively, if the second phase change material is formed of Pt that is the same material as the heat-generating portion, the second phase change material may be formed in the same manufacturing process as the heat-generating portion. Accordingly, the two temperature calibrations are conducted until the temperature reaches the phase transition temperature of Sn.

Figure 59:
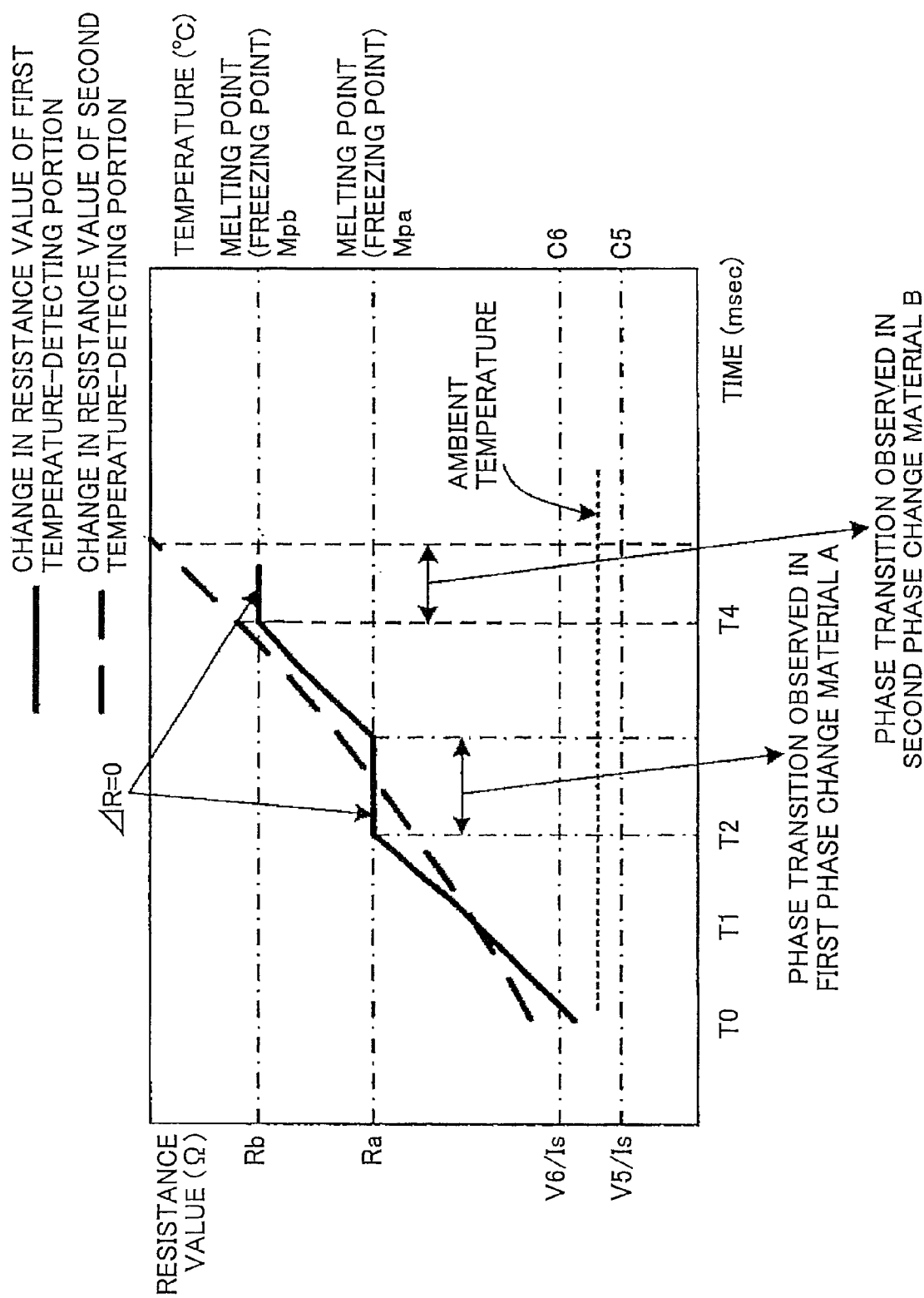
FIG. 59 is a characteristic diagram illustrating a change in a resistance value of the first temperature detecting portion and a change in a resistance value of the second temperature detecting portion when an ambient temperature is unchanged.
Figure 60:
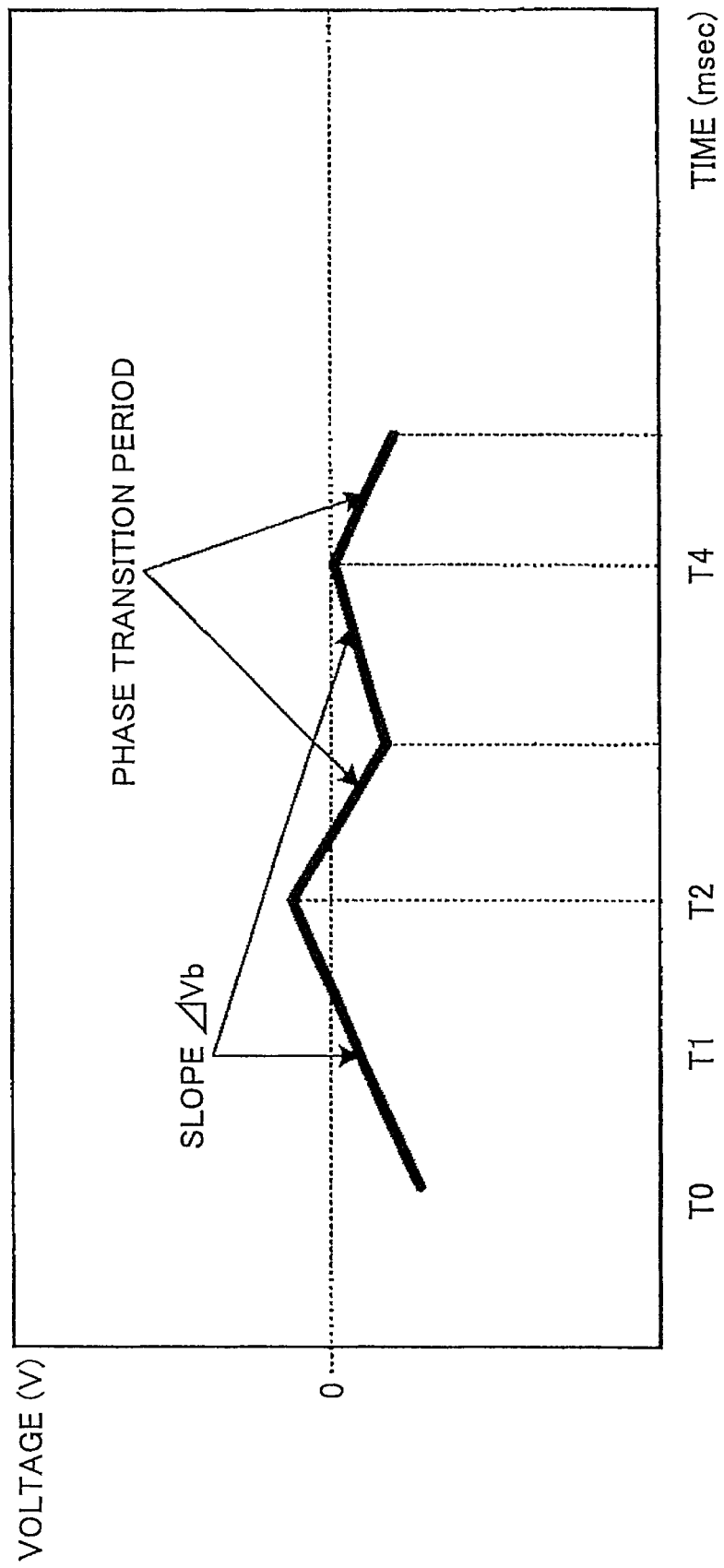
FIG. 60 is a characteristic diagram illustrating output characteristics of a bridge circuit.
Figure 61:
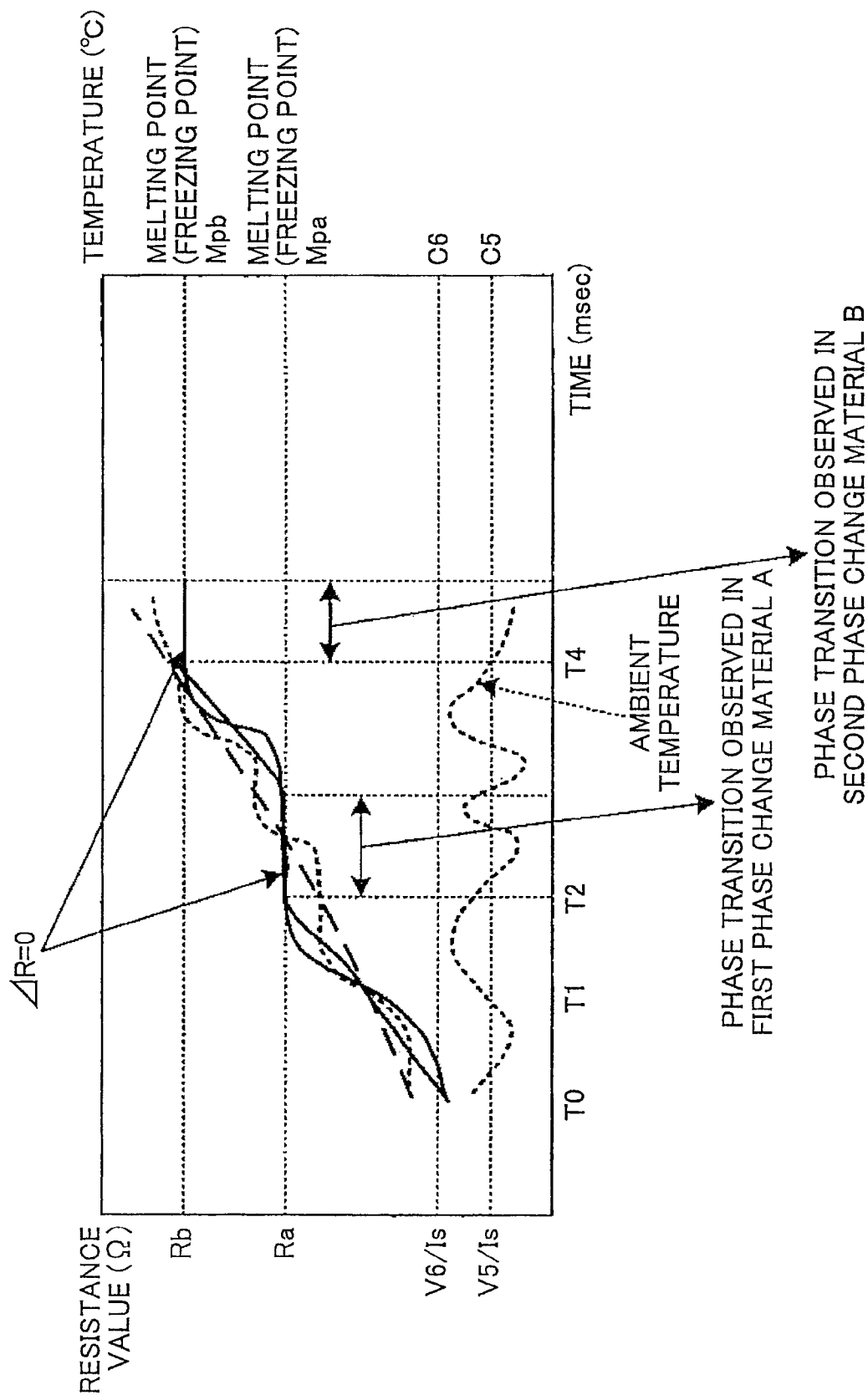
FIG. 61 is a characteristic diagram illustrating a change in a resistance value of the first temperature detecting portion and a change in a resistance value of the second temperature detecting portion.

FIG. 59 is a characteristic diagram illustrating a change in a resistance value of the first temperature detecting portion and a change in a resistance value of the second temperature detecting portion when an ambient temperature is unchanged. Further, FIG. 60 is a characteristic diagram illustrating output characteristics of the bridge circuit. Although the first and the second temperature detecting portions are integrally formed, the specific resistance value and temperature dependency of the first temperature detecting portion may be slightly different from the specific resistance value and temperature dependency of the second temperature detecting portion. Thus, the first and the second temperature detecting portions exhibit different temperature rising slopes. Accordingly, as illustrated in FIG. 60, output characteristics of the bridge circuit include the two different temperature rising slopes having the difference in slope $\Delta Vb$ between the different temperature rising slopes, and a characteristic specific to the change in the resistance value of the first temperature detecting portion that the change in the resistance value of the second temperature detecting portion will not exhibit. Thus, the phase transition may be detected in the bridge circuit. Note that the heat-generating portion or the phase change material includes extremely small heat capacity so that the phase change material rapidly undergoes phase transitions without being affected by the external temperature change. Accordingly, the temperature calibration may be conducted in an extremely short time range of 1 to several tens ms. Therefore, the bridge circuit may not be affected by the external temperature change as illustrated in FIG. 59, where there is almost no change in the ambient temperature; and hence, phase transition temperatures may not be detected in practice. However, FIG. 61 illustrates a case where the bridge circuit is affected by the external temperature change when the temperature calibration is conducted in an extremely short time as illustrated in FIG. 59. FIG. 61 is a characteristic diagram illustrating a change in a resistance value of the first temperature detecting portion and a change in a resistance value of the second temperature detecting portion when an ambient temperature is changed. FIG. 62 is a characteristic diagram illustrating an output characteristic of the bridge circuit. The characteristic of the bridge circuit may be that the voltage (also called "bridge circuit output voltage") output from the bridge circuit constantly exhibits a linear slope $\Delta Vb$ from time T0 to time T2, and from time at which the phase transition of the phase change material A has completed at time T4. If the bridge circuit output voltage is affected by the external temperature change after time T2, and exhibits the linear slope $\Delta Vb$ (see linear thin line in FIG. 62), the amount of change in the resistance value of the second temperature detecting portion may not increase but decrease. With the decrease in the amount of the resistance value of the second temperature detecting portion, the amount of the resistance value of the first temperature detecting portion also decreases, thereby exhibiting no phase transition. Accordingly, the change in the slope $\Delta Vb$ at time T2 indicates that the phase transition has been initiated at time T2. Thus, the phase transition of the phase change material may be detected by detecting the change in the slope $\Delta Vb$. As described above, even if the first and the second temperature detecting portions are affected by the ambient temperature, the bridge circuit output voltage changes only when the phase change material of the first temperature detecting portion exhibits phase transition without being affected by the ambient temperature. Accordingly, the phase transition may be detected in the bridge circuit.

Note that in the bridge circuit described above includes the heat-generating portion to allow the phase change material to undergo phase transition. However, the phase transition may be alternatively detected by controlling an environmental temperature of the electric element and the known phase transition temperature may be determined based on the detected phase transition temperature. With this configuration, a calibration facility for the electric element according to the above embodiments may not have accuracy as high as the accuracy of the related art calibration. The calibration facility for the electric element according to the above embodiments may simply include a calibration facility having air temperature distribution that exhibits low temperature control accuracy. Further, the phase transition of the phase change material in the electric elements may be individually detected such that highly accurate calibration may be conducted on each of the electric elements. Thus, a sufficiently small current value is then applied to the heat-generating portion having a predetermined resistance temperature coefficient so as not to generate Joule heat, and a resistance value of the heat-generating portion is detected. Accordingly, highly accurate calibration may be conducted by utilizing the heat-generating portion of each element as a temperature detector.

As described above, in the electric element according to the above embodiments, the phase change material having the known phase transition temperature phase transitions at the known phase transition temperature as illustrated in FIG. 1. Accordingly, the temperature calibration is conducted by adjusting a detected phase transition temperature at which the phase change material exhibits phase transition to the predetermined phase transition temperature (i.e., known phase transition temperature) of the phase change material. Further, in the electric element according to the above embodiments, the phase transition material 14 and heat-generating portion 13 configured to heat the phase change material 14 are integrally layered on the substrate 11 as illustrated in FIGS. 8A and 8B. With this configuration, heat generation of the heat-generating portion 13 may be easily controlled, and the temperature distribution obtained by heat generated from the heat-generating portion 13 may be easily controlled. As a result, temperature accuracy may be easily secured. Further, since the temperature calibration may not be affected by electric conductivity of the phase change material, a large number of phase change materials may be employed and hence, the wider phase transition temperature range may be selected as the calibration temperature. Further, since phase transition temperatures of the phase change materials are predetermined (known) values, the temperature of the electric element may be determined with high accuracy by accurately detecting phase transition phenomena of the phase change materials. Accordingly, with this configuration, since the calibration of the electric element may be conducted by anyone, anytime, and anywhere and cost required for the calibration process as illustrated in the related art may be eliminated. Further, the longer calibration accuracy may be maintained.

In addition, in the electric element according to the above embodiments, the electric resistance value of the heat-generating portion 13 is detected as a phase transition temperature obtained when the phase change material 14 exhibits the phase transition due to the temperature change. That is, the electric resistance value of heat-generating portion 13 that reaches a predetermined value corresponds to the temperature of the phase change material 14 that reaches the predetermined (known) phase transition temperature, based on the characteristics illustrated in FIGS. 1 and 2. Thus, the temperature calibration of the electric element is carried out by adjusting the electric resistance value to the predetermined value such that the temperature of the phase transition of the phase transition material 14 is adjusted to the predetermined (known) temperature. Accordingly, accurate temperature control may be achieved at low cost without carrying out the complicated control as illustrated in the related art.

Further, in the electric element according to the above embodiments, the output voltage value corresponding to the current supplied to the phase change material 14 is detected, and it is determined that the phase change material 14 exhibits the phase transition due to the temperature change when the electric resistance value computed based on the current value and the output voltage value reaches a predetermined value. That is, the electric resistance value of heat-generating portion 13 computed based on the current value and the output voltage value that reaches a predetermined value corresponds to the temperature of the phase change material 14 that reaches the predetermined (known) phase transition temperature, based on the characteristics illustrated in FIGS. 4 and 5. Thus, the temperature calibration of the electric element is carried out by adjusting the electric resistance value to the predetermined value such that the temperature of the phase transition of the phase transition material 14 is adjusted to the predetermined (known) temperature. Accordingly, accurate temperature control may be achieved at low cost without carrying out the complicated control as illustrated in the related art.

Further, in the electric element according to the above embodiments, at least the phase change material 14 and the heat-generating portion 13 are layered on the substrate 11 as illustrated in FIGS. 8A and 8B, and FIGS. 9A and 9B. Further, in the electric element according to the above embodiments, at least the phase change material 14 and the heat-generating portion 13 are arranged in parallel with each other on the substrate 11 as illustrated in FIGS. 14A and 14B. Accordingly, accurate temperature control may be achieved at low cost without carrying out the complicated control as illustrated in the related art.

In addition, in the electric element according to the above embodiments, the heat-generating portion 13 is arranged in the meandering fashion and the phase change material 14 is divided into two or more portions and the divided portions of the phase change material 14 are arranged in parallel with the meandering portions of the heat-generating portion 13 such that the divided portions of the phase change material 14 are separately arranged between the meandering portions of the heat-generating portion 13, as illustrated in FIGS. 18A and 18B and FIGS. 19A and 19B. With this configuration, the heat-generating portion 13 and the phase change material 14 are locally arranged in high density, and hence, further accurate temperature control may be achieved.

Further, in the electric element according to the above embodiments, if at least one of the phase change material 14, the heat-generating portion 13, and the substrate 11 is formed of a conductive material, the conductive one of the phase change portion, the heat-generating portion, and the substrate is electrically insulated by the electric insulator material.

In addition, in the electric element according to the above embodiments, the detective temperature range of the heat-generating portion 13 may preferably approximately fall within the phase transition temperature range.

Further, in the electric element according to the above embodiments, the detecting leads 17 configured to output detecting signals from the phase change material 14 are connected to the phase change material 14, and the detecting leads 17 are formed of the same material as that of the phase change material 14, or a conductive material illustrated in FIGS. 11A and 11B. With this configuration, the manufacturing process of the electric element may not be complicated.

Moreover, in the electric element according to the above embodiments, the phase transition materials 31 and 32 having the predetermined (known) different phase transition temperatures and the heat-generating portion 13 configured to heat the phase change materials 31 and 32 are integrally layered on the substrate 11 as illustrated in FIGS. 23A and 23B. Alternatively, the phase transition materials 31 and 32 having the predetermined (known) different phase transition temperatures may be arranged adjacent to the heat-generating portion 13. With this configuration, the heat-generating portion 13 may be easily controlled, and the temperature distribution obtained by heat generated from the heat-generating portion 13 may be easily controlled. As a result, temperature accuracy may be easily secured. Further, the temperature accuracy may be further increased by utilizing the phase change materials 31 and 32. Note that at least one of the phase change materials 31 and 32 is conductive, the electric insulator layer is arranged between the phase change materials 31 and 32.

Further, in the electric element according to the above embodiments, the heat-generating portion 13 is arranged in the meandering fashion, and the phase change materials 31 and 32 that are arranged in parallel with each other or layered one on top of the other along the meandering heat-generating portion 13 as illustrated in FIGS. 41A and 41B. Further, in the electric element according to the above embodiments, the heat-generating portion 13 and the phase change materials 31 and 32 are concentrically arranged as illustrated in FIGS. 44A to 44C. Moreover, in the electric element according to the above embodiments, the heat-generating portion 13 is formed in a circular shape and the phase change materials 31 and 32 formed in sectors, the sector phase change materials 31 and 32 are alternately arranged in parallel with one another, and further, the alternately arranged sector phase change materials 31 and 32 are arranged concentric to the circular heat-generating portion 13 within the circle of the heat-generating portion 13 as illustrated in FIGS. 45A to 45C. With this configuration, the heat-generating portion 13 and the phase change materials 31 and 32 are locally arranged in high density, and hence, further accurate temperature control may be achieved.

Further, in the electric element according to the above embodiments, the substrate 11 having a region in which at least the phase change material 14 is formed includes the hollow 16 as illustrated in FIGS. 10A and 10B. With this configuration, highly accurate calibration may be achieved by rapidly controlling the temperatures of the heat-generating portion 13 and the phase change material 14.

In addition, in the electric element according to the above embodiments, the electric insulator layer 18 is arranged at least around the phase change material 14 as illustrated in FIGS. 21A and 21B. With this configuration, the phase change material 14 may be prevented from chemically reacting with the ambient atmosphere and hence, highly accurate and highly reliable calibration may be achieved.

Further, the electric element according to the above embodiments and a circuit element may be integrated to form an integrated circuit. With this configuration, a temperature of the temperature dependent circuit element may be controlled with accuracy. Moreover, since the circuit element includes a self-temperature calibration function, the temperature calibration process may not be necessary. Accordingly, cost of the circuit element itself may be reduced.

Further, the electric element according to the above embodiments may be integrated into the temperature dependent semiconductor or the temperature dependent electronic component. With this configuration, since a facility or a process for conducting the temperature calibration on the mass-produced semiconductors or electronic components may not be required, the semiconductors or electronic components having the electric element according to the above embodiments may be produced in any manufacturing plant. Accordingly, the semiconductors or electronic components having the electric element according to the above embodiments may be produced at low cost.

According to embodiments described above, the electric element may be produced without a cumbersome temperature calibration process. Accordingly, the manufacturing cost of the electric element, the integrated element having the electric element, or an electronic circuit having the integrated element may be reduced.

The advantages illustrated above are merely examples of the most preferred ones provided by the embodiments, and therefore are not limited to those described in the embodiments.

Embodiments of the present invention have been described heretofore for the purpose of illustration. The present invention is not limited to these embodiments, but various variations and alterations may be made without departing from the scope of the present invention. The present invention should not be interpreted as being limited to the embodiments that are described in the specification and illustrated in the drawings.

The present application is based on Japanese Priority Application No. 2010-224813 filed on Oct. 4, 2010 and Japanese Priority Application No. 2010-224822 filed on Oct. 4, 2010, with the Japanese Patent Office, the entire contents of which are hereby incorporated by reference.

The invention claimed is:

1. A temperature dependent electric element, comprising:
a phase change portion that includes a phase change material having a predetermined phase transition temperature;
a detector portion that detects a detect phase transition of the phase change material caused by a temperature change;
a temperature calibration part that conducts temperature calibration by adjusting a temperature at which the phase transition, detected by the detector portion, occurs to be equal to the predetermined phase transition temperature of the phase change material; and
a substrate on which the phase change portion, the detector portion and the temperature calibration part are arranged.

2. The electric element as recited in claim 1, further comprising:
a heat-generating portion that heats the phase change material.

3. The electric element as recited in claim 2, wherein
the detector portion detects an output voltage value corresponding to a current supplied to the phase change material when a temperature of the phase change material heated by the heat-generating portion is equal to the predetermined phase transition temperature, and
the detector portion computes an electric resistance value of the heat-generating portion to be a first electric resistance value based on a current value of the current supplied to the phase change material and the detected output voltage value, and
the temperature calibration part conducts the temperature calibration by adjusting the electric resistance value of the heat-generating portion from the first electric resistance value, computed by the detector portion based on the current value of the current supplied to the phase change material and the detected output voltage value, to a second electric resistance value of the heat-generating portion associated in advance with the predetermined phase transition temperature of the phase change material.

4. The electric element as recited in claim 2, wherein the phase change portion and the heat-generating portion are arranged in layers on the substrate.

5. The electric element as recited in claim 2, wherein the phase change portion and the heat-generating portion are arranged in parallel with each other on the substrate.

6. The electric element as recited in claim 2, wherein
the heat-generating portion includes two or more meandering portions having predetermined intervals therebetween, and
the phase change material includes two or more divided portions that are separately arranged corresponding to the intervals between the meandering portions of the heat-generating portion.

7. The electric element as recited in claim 2, further comprising:
an electric insulator material that insulates the electrically conductive materials, wherein
when at least one of the phase change portion, the heat-generating portion and the substrate is formed of a conductive material, the conductive one of the phase change portion, the heat-generating portion and the substrate is electrically insulated by the electric insulator material.

8. The electric element as recited in claim 2, wherein the detector portion detects an electric resistance value of the heat-generating portion when a temperature of the phase change material, heated by the heat-generating portion, is equal to the predetermined phase transition temperature of the phase change material.

9. The electric element as recited in claim 2, wherein
the detector portion detects an electric resistance value of the heat-generating portion to be a first electric resistance value when a temperature of the phase change material heated by the heat-generating portion is equal to the predetermined phase transition temperature, and
the temperature calibration part conducts the temperature calibration by adjusting the electric resistance value of the heat-generating portion from the first electric resistance value, detected by the detector portion when the temperature of the phase change material is equal to the predetermined phase transition temperature, to a second electric resistance value associated with the predetermined phase transition temperature of the phase change material.

10. The electric element as recited in claim 1, wherein a hollow is formed in a region of the substrate on which the phase change portion is formed.

11. The electric element as recited in claim 1, wherein the phase change material is a material that is defined in the ITS-90 (International Temperature Scale ITS-90).

12. The electric element as recited in claim 1, further comprising:
detecting leads that are connected to the phase change portion and output a detecting signal from the phase change portion, the detecting leads being formed of one of a conductive material and a material with a composition of the phase change material.

13. The electric element as recited in claim 1, wherein the phase change material melts to form an alloy.

14. An electric element comprising:
a plurality of the electric elements as recited in claim 1, wherein
the plurality of electric elements are integrated.

15. An integrated circuit comprising:
the electric element as recited in claim 1; and
a circuit element that is integrated with the electric element.

16. An apparatus comprising an electric element as recited in claim 1.

17. The electric element as recited in claim 1, wherein when the phase change portion includes two or more phase change materials having different predetermined phase transition temperatures, the detector portion detects respective phase transitions of the phase change materials caused by changes in respective temperatures of the phase change materials.

18. The electric element as recited in claim 17, wherein the phase change materials are separately arranged from one another.

19. The electric element as recited in claim 17, wherein the phase change materials are arranged in parallel with one another.

20. The electric element as recited in claim 17, wherein the phase change materials are arranged in layers.

* * * * *